United States Patent
Kawahito

(10) Patent No.: US 9,202,902 B2
(45) Date of Patent: Dec. 1, 2015

(54) SEMICONDUCTOR ELEMENT AND SOLID-STATE IMAGING DEVICE

(71) Applicant: National University Corporation Shizuoka University, Shizouka-shi, Shizuoka (JP)

(72) Inventor: Shoji Kawahito, Shizuoka (JP)

(73) Assignee: National University Corporation Shizuoka University, Shizuoka (JP)

( * ) Notice: Subject to any disclaimer, the term of this patent is extended or adjusted under 35 U.S.C. 154(b) by 0 days.

(21) Appl. No.: 14/419,341

(22) PCT Filed: Aug. 1, 2013

(86) PCT No.: PCT/JP2013/070869
§ 371 (c)(1),
(2) Date: Feb. 3, 2015

(87) PCT Pub. No.: WO2014/021417
PCT Pub. Date: Feb. 6, 2014

(65) Prior Publication Data
US 2015/0187923 A1    Jul. 2, 2015

(30) Foreign Application Priority Data
Aug. 3, 2012  (JP) .................................. 2012-172998

(51) Int. Cl.
*H01L 27/00* (2006.01)
*H01L 29/768* (2006.01)
(Continued)

(52) U.S. Cl.
CPC ........ *H01L 29/76833* (2013.01); *H01L 27/146* (2013.01); *H01L 27/148* (2013.01);
(Continued)

(58) Field of Classification Search
CPC ............ H01L 27/146; H01L 27/14806; H01L 27/14812; H01L 27/14818; H01L 27/14825; H01L 27/14843; H01L 27/1485
See application file for complete search history.

(56) References Cited

U.S. PATENT DOCUMENTS

| 5,856,667 A | 1/1999 | Spirig et al. |
| 5,986,297 A | 11/1999 | Guidash et al. |

(Continued)

FOREIGN PATENT DOCUMENTS

| JP | H11-177076 A | 7/1999 |
| JP | 2005-235893 A | 9/2005 |

(Continued)

OTHER PUBLICATIONS

International Search Report issued on Oct. 15, 2013, in parent application PCT/JP2013/070869.

(Continued)

*Primary Examiner* — Ngan Ngo
(74) *Attorney, Agent, or Firm* — NDQ&M Watchstone LLP

(57) ABSTRACT

A semiconductor element encompasses a charge-transfer path defined in a semiconductor region (34.35), configured to transfer signal charges, (b) a pair of first field-control electrodes (42a, 42b) laminated via an insulating film on the semiconductor region so as to sandwich the charge-transfer path in between, and a pair of second field-control electrodes (43a, 43b) arranged separately from and adjacently to the first field-control electrodes (42a, 42b). By applying field-control voltages differing from each other, to the first and second field-control electrodes (43a, 43b), a depleted potential in the charge-transfer path is changed, and a movement of the signal charges transferring in the semiconductor region is controlled. Because electric field can be made constant over a long distance along the charge-transfer direction, a semiconductor element and a solid-state imaging device, in which problems caused by interface defects and the like are avoided, can be provided.

11 Claims, 25 Drawing Sheets

(51) Int. Cl.
*H01L 27/148* (2006.01)
*H01L 27/146* (2006.01)
*H04N 5/369* (2011.01)
*H04N 5/372* (2011.01)
*H04N 5/374* (2011.01)

(52) U.S. Cl.
CPC ........ *H01L27/1461* (2013.01); *H01L 27/1485* (2013.01); *H01L 27/14612* (2013.01); *H01L 27/14806* (2013.01); *H01L 27/14812* (2013.01); *H01L 27/14818* (2013.01); *H01L 27/14825* (2013.01); *H01L 27/14831* (2013.01); *H01L 27/14843* (2013.01); *H04N 5/369* (2013.01); *H04N 5/372* (2013.01); *H04N 5/374* (2013.01)

(56) References Cited

U.S. PATENT DOCUMENTS

| | | | |
|---|---|---|---|
| 6,091,793 | A | 7/2000 | Kamashita |
| 6,323,942 | B1 | 11/2001 | Bamji |
| 2002/0005827 | A1* | 1/2002 | Kobayashi .................. 345/87 |
| 2004/0130642 | A1* | 7/2004 | Imamura et al. .............. 348/311 |
| 2007/0158770 | A1 | 7/2007 | Kawahito |
| 2009/0114919 | A1 | 5/2009 | Kawahito et al. |
| 2010/0073541 | A1 | 3/2010 | Kawahito |
| 2010/0321552 | A1 | 12/2010 | Matsuda |
| 2012/0069211 | A1 | 3/2012 | Takemura et al. |
| 2012/0205723 | A1 | 8/2012 | Suzuki |

FOREIGN PATENT DOCUMENTS

| | | |
|---|---|---|
| JP | 2010-278295 A | 12/2010 |
| JP | 2011-009274 A | 1/2011 |
| WO | 2007/119626 A1 | 10/2007 |
| WO | 2008/069141 A1 | 6/2008 |
| WO | 2011/065286 A1 | 6/2011 |

OTHER PUBLICATIONS

PCT/IB/373 International Preliminary Report on Patentability dated Feb. 3, 2015.

PCT/IB/338 Notification of Transmittal of Translation of the International Preliminary Report on Patentability dated Feb. 12, 2015.

* cited by examiner

FIG. 2
(a)
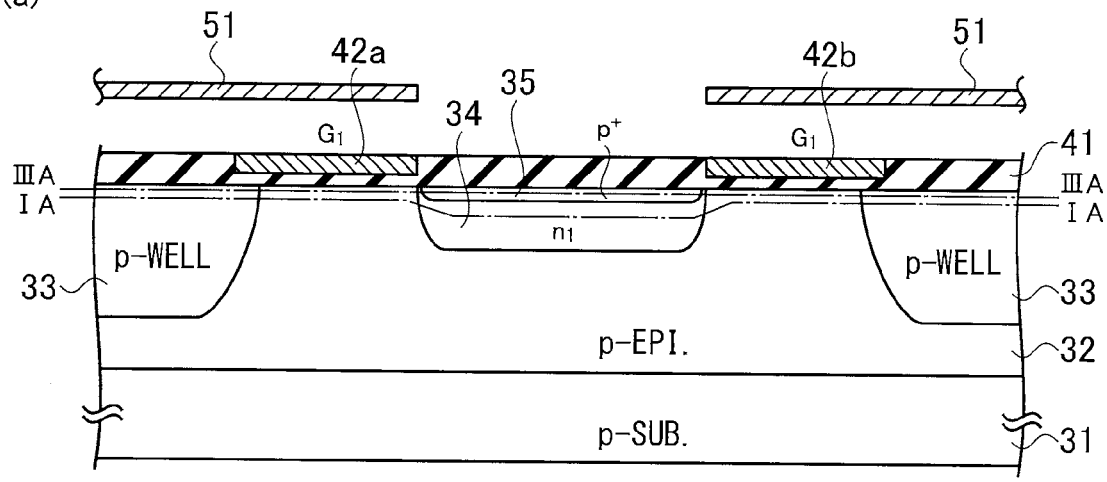
(b)
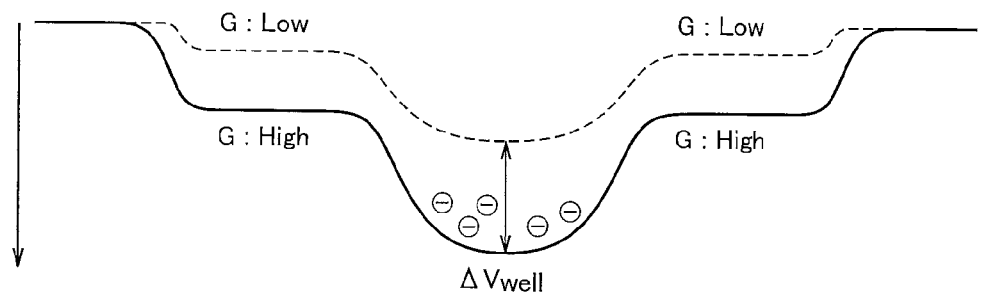
(c)
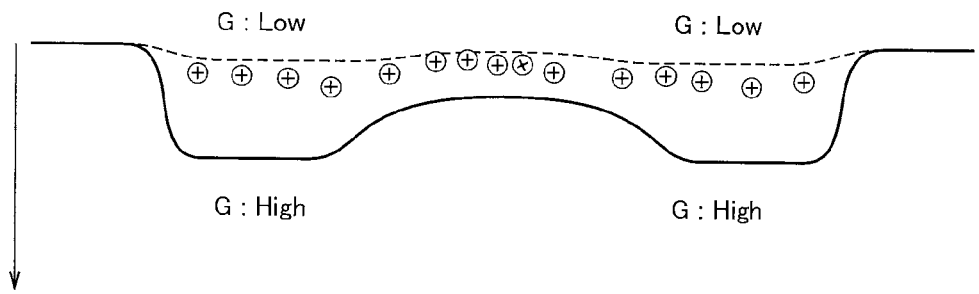

FIG. 11
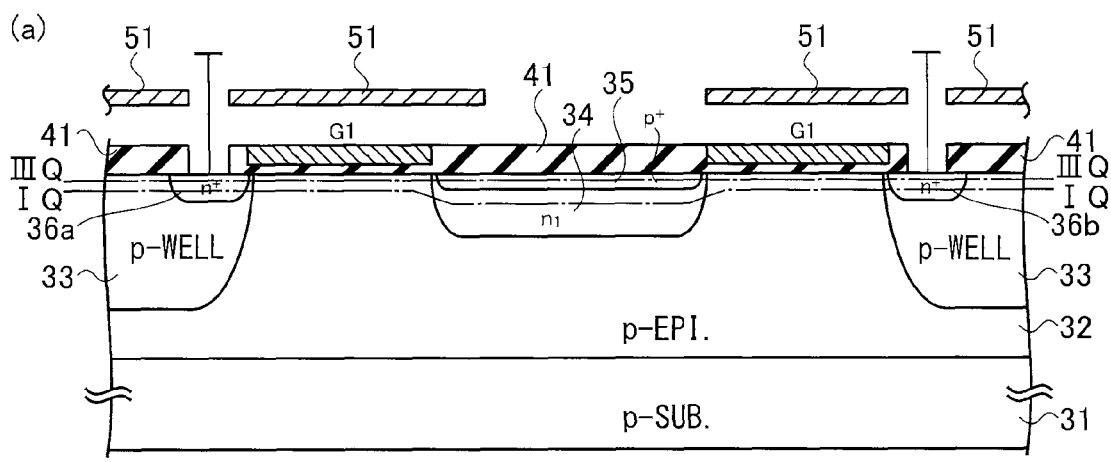
(a)
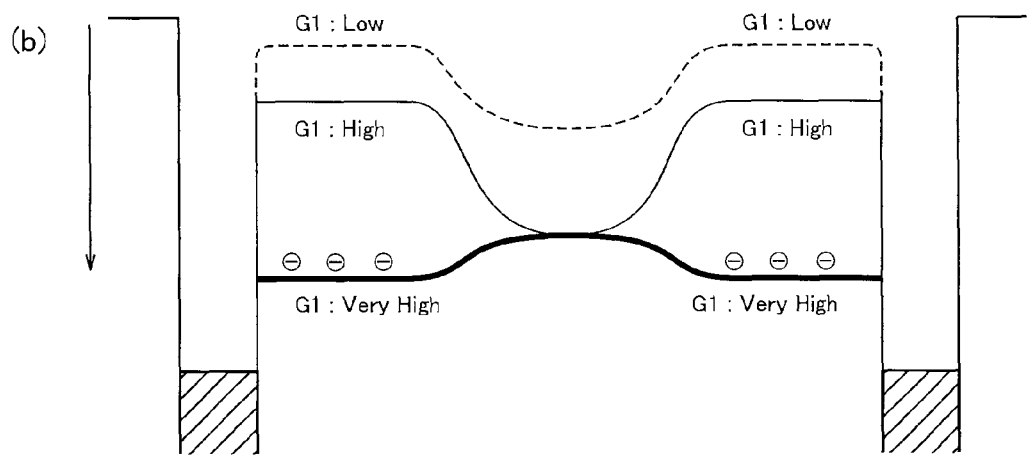
(b)
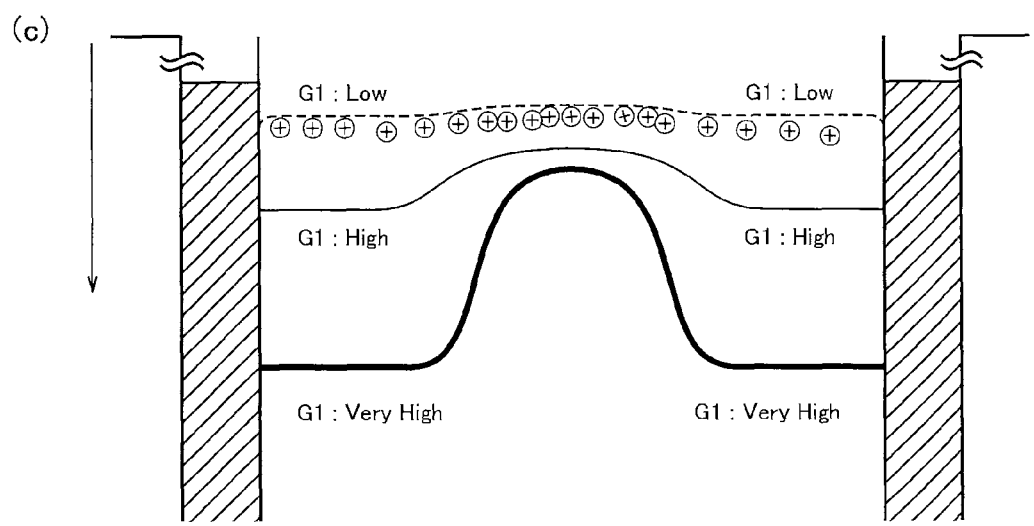
(c)

SEMICONDUCTOR ELEMENT AND SOLID-STATE IMAGING DEVICE

CROSS REFERENCE TO RELATED APPLICATIONS

This is the national stage of International Application No. PCT/JP2013/070869, filed Aug. 1, 2013, which application claims priority to Japanese Patent Application No. JP2012-172998, filed Aug. 3, 2012. All of the above-identified applications are incorporated herein by reference in their entireties.

TECHNICAL FIELD

The present invention pertains to a semiconductor element that has a function for sequentially transferring signal charges implemented by electrons or holes, and a solid-state imaging device in which a plurality of unit columns are arrayed periodically in one-dimensional or two-dimensional topology, the unit column is implemented by a plurality of semiconductor elements or a plurality of structures, each being equivalent to the semiconductor element.

BACKGROUND ART

In association with wide developments of CMOS image sensors, image sensors that have electronic shutter function, which use a feature of CMOS integrated circuits, are being progressed (see Patent Literature (PTL) 1). Also, three-dimensional sensors, which contain range-measurement elements of MOS architecture or charge coupling element (CCD) architecture, are proposed (see PTLs 2 and 3). On the other hand, the CCD image sensors have an advantage of a high speed charge transfer and an advantage that charges can be transferred through multiple stages without any increase in noise, which do not exist in the CMOS image sensors. So, the development of the image sensor that has the merits of both of the CCD image sensor and the CMOS image sensor is expected. Moreover, in image sensors having the electronic shutter function, range-measurement elements, or three-dimensional sensors, a scheme is required, in which potentials just under gate electrodes are controlled in longitudinal direction (vertical direction) by using MOS structures so that signal charges can be transferred (see PTL 4).

On the other hand, in order to scan a reading-target at a high speed, a CCD image sensor having time-delay integration (TDI) function is proposed, in which a plurality of CCDs are arrayed on a line to form CCD-column, and the line configuration of CCD-columns are further deployed in a orthogonal direction to the direction of line (see PTL 5). In the TDI CCD, a picture obtained by first CCD-column is transferred as its original state to the second CCD-column. In the second CCD-column, a picture obtained by the second CCD-column is added to the picture sent from a former CCD-column, and the added picture is stored in the second CCD-column, and the stored picture is further transferred to the third CCD-column. In $n^{th}$ CCD-column, a picture obtained by the $n^{th}$ CCD-column is added to the picture transferred from $(n-1)^{th}$ CCD-column, and then transferred to $(n+1)^{th}$ CCD-column. In a case of a target that is moving at a constant speed along a constant direction, by matching the direction and speed of a movement of the imaging target with the direction and speed of charge transfers in the CCD-columns, respectively, the target can be exposed and imaged repeatedly for a number of times corresponding to the number of vertical stages along the orthogonal direction of the CCD-columns. That is, in the TDI sensor in which x stages CCD-columns are deployed, the obtained pictures are x times stored. Thus, the shutter speed can be made higher, and the image without any blurring can be obtained. Hence, it is possible to expect the realization of the image that is sufficient in brightness and high in sensibility.

However, in the case that the MOS structure is used to control the potential just beneath the gate electrode in the longitudinal direction (vertical direction), because interface defects and interface states are generated at an interface between a gate oxide film and a silicon surface, there was a problem of noises generated in a transfer path. Because of such noise problem ascribable to interface defects, interface states and the like, and problem of generation of dark currents, various schemes of buried channel structures and the like are tried historically to solve those problems in the CCD image sensors and the TDI CCDs in view of earlier historical development phase.

Even in a time of flight (TOF) range sensor in which a flight time of light is used to obtain a range image, the MOS structure is used to control the potential just beneath the gate electrode in the longitudinal direction (vertical direction). For example, a CMOS range-measurement element and a TOF image sensor which uses the CMOS range-measurement element are proposed, the structure of the CMOS range-measurement element encompasses an n-type charge-generation buried region, an n-type charge-transfer buried region and an n-type charge-read-out buried region, which are buried on p-type semiconductor layer, and an insulating film covering upper portions of the charge-generation buried region, the charge-transfer buried region and the charge-read-out buried region, a transfer-gate electrode arranged on the insulating film, formed to transfer the signal charges to the charge-transfer buried region, and a read-out gate electrode arranged on the insulating film, formed to transfer the signal charges to the charge-read-out buried region (see PTL 6). In the charge-generation buried region of the CMOS range-measurement element, when a light-pulse is received, in the semiconductor layer just under the charge-generation buried region, an optical signal is converted into the signal charges, and a distance from a target is consequently measured on the basis of a distribution ratio of the charges stored in the charge-transfer buried region. Even in the CMOS range-measurement element and the TOF image sensor that uses the CMOS range-measurement elements, there is the fears of the problem of the noises caused by interface defects, interface states and the like, just under the transfer-gate electrode, and the problem of the generation of the dark current. Moreover, in a case of using the transfer-gate electrode as described in PTL 6, it is difficult to control a potential inclination over a long distance. Thus, over the long distance along a charge-transfer direction, it was actually unreasonable to make an electric field substantially constant. For this reason, in the semiconductor elements such as the range-measurement elements, which had a long charge-transfer path, troubles were generated in which, since carriers were stopped in the course of the charge-transfer path, it was difficult to achieve the expected performances.

By the way, method for manufacturing the conventional CCD image sensors and method for manufacturing the CMOS image sensors greatly differ from each other. Although there is a report of an image sensor in which both of CCD and CMOS image sensors CCD and CMOS image sensors are mixed, a procedure for manufacturing the mixed structure of CCD and CMOS image sensors becomes long, and the number of photo masks for manufacturing the mixed structure also increases. Thus, there is a problem with regard to a manufacturing cost of the mixed structure.

CITATION LIST

Patent Literature

[PTL 1] JP 1999-177076A
[PTL 2] U.S. Pat. No. 5,856,667B
[PTL 3] U.S. Pat. No. 6,323,942B
[PTL 4] U.S. Pat. No. 5,986,297B
[PTL 5] JP 2010-278295A
[PTL 6] WO No. 2007/119626 A

SUMMARY OF INVENTION

Technical Problem

An object of the present invention is to provide a semiconductor element and a solid-state imaging device in which a plurality of semiconductor elements are arrayed, which can achieve low noise, high resolution and fast response speed performances, addressing to a new approach for overcoming the noise problems caused by interface defects, interface states and the like at interfaces of semiconductor surfaces and the generation of the dark current, by reducing transfer speed, facilitating easy control of a potential profile, keeping the electric field substantially constant over a long distance along a charge-transfer direction, which is necessary for the TOF range sensor and the like, so that signal charges can be transferred at a high speed through a long charge-transfer path, without depending upon any conventional approach for attaining lower noise that is based on the buried channel structure employed by the CCD image sensors or TDI CCDs developed in the earlier phase.

Solution to Problem

In order to achieve the above object, a first aspect of the present invention inheres in a semiconductor element, encompassing (a) a charge-transfer path defined in a semiconductor region, configured to transfer signal charges, (b) a pair of first field-control electrodes laminated via an insulating film on the semiconductor region so as to sandwich the charge-transfer path in between, in a planar pattern, along a direction orthogonal to a transfer direction of the signal charges, and (c) a pair of second field-control electrodes arranged separately from and adjacently to the first field-control electrodes, respectively, along the transfer direction, and laminated via the insulating film on the semiconductor region, so as to sandwich the charge-transfer path in between, in the planar pattern, along the direction orthogonal to the transfer direction. In the semiconductor element pertaining to this first aspect of the present invention, field-control voltages, which differ from each other, are applied to the first and second field-control electrodes, and a depleted potential in the charge-transfer path is changed, thereby controlling a movement of the signal charges transferring in the semiconductor region.

A second aspect of the present invention inheres in a solid-state imaging device, in which a plurality of semiconductor elements pertaining to the first aspect are arrayed on the same semiconductor chip.

A third aspect of the present invention inheres in a solid-state imaging device including a plurality of unit columns being deployed, each of the unit columns encompassing a plurality of unit structures periodically arrayed along a charge-transfer path, the unit structure encompassing (a) the charge-transfer path defined in a semiconductor region, configured to transfer signal charges, (b) a pair of first field-control electrodes laminated via an insulating film on the semiconductor region so as to sandwich the charge-transfer path in between, in a planar pattern, along a direction orthogonal to a transfer direction of the signal charges, and (c) a pair of second field-control electrodes arranged separately from and adjacently to the first field-control electrodes, respectively, along the transfer direction, and laminated via the insulating film on the semiconductor region, so as to sandwich the charge-transfer path in between, in the planar pattern, along the direction orthogonal to the transfer direction. In each of the unit columns in the solid-state imaging device pertaining to the third aspect, for a periodical arrangement of the field-control electrodes, including the first and second field-control electrodes, field-control voltages differing from each other are applied to the field-control electrodes, respectively, and a depleted potential in the charge-transfer path is changed. Then, a movement of the signal charges transferring in the semiconductor region is controlled.

A fourth aspect of the present invention inheres in a solid-state imaging device including a plurality of the unit columns being deployed, each of the unit columns encompassing a plurality of unit structures periodically arrayed along a main charge-transfer path, the unit structure encompassing (a) the main charge-transfer path defined in a semiconductor region, configured to transfer signal charges, (b) a pair of first field-control electrodes laminated via an insulating film on the semiconductor region so as to sandwich the charge-transfer path in between, in a planar pattern, along a direction orthogonal to a main transfer direction of the signal charges along the main charge-transfer path (c) a pair of second field-control electrodes arranged separately from and adjacently to the first field-control electrodes, respectively, along the main transfer direction, and laminated via the insulating film on the semiconductor region, so as to sandwich the main charge-transfer path in between, in the planar pattern, along the direction orthogonal to the main transfer direction.

The solid-state imaging device pertaining to the fourth aspect of the present invention further encompasses a transfer path for charge modulation through which the signal charges are transferred alternately, defined along the direction orthogonal to the main transfer direction, across the main charge-transfer path, in order to carry out a time of flight range measurement, a pair of first modulation electrodes laminated via the insulating film on the semiconductor region so as to sandwich the transfer path for charge modulation in between, in the planar pattern, along the main transfer direction, and a pair of second modulation electrodes arranged separately from the first modulation electrodes, respectively, and laminated via the insulating film on the semiconductor region, so as to sandwich the transfer path for charge modulation, in the planar pattern, along the main transfer direction. In each of the unit columns of the solid-state imaging device pertaining to the fourth aspect of the present invention, for a periodical arrangement of the field-control electrodes including the first and second field-control electrodes, field-control voltages differing from each other are applied to the field-control electrodes, respectively, and a depleted potential of the main charge-transfer path is changed, so that the movement of the signal charges transferred through the main charge-transfer path of each of the unit columns can be controlled. Moreover, in the solid-state imaging device pertaining to the fourth aspect of the present invention, in a course of the movement of the signal charges, charge-modulation voltages differing from each other are applied to the first and second modulation electrodes, and a depleted potential of the transfer path for charge modulation is changed, and the movement of the signal charges are controlled so that the signal charges are alternately transferred through the transfer path for charge modulation, and, after the completion of the alternate transfers through the transfer path for charge modulation, the signal charges are again transferred through the main charge-transfer path of each of the unit columns.

Advantageous Effects of Invention

According to the present invention, the present invention can provide a semiconductor element and a solid-state imaging device in which a plurality of the semiconductor elements are arrayed, by which the potential profile can be easily controlled so that the electric field is substantially constant over the long distance in the charge-transfer direction, and the signal charges can be transferred at high speed through the long charge-transfer path, and it is possible to avoid the problem of the generations of noise and dark current, which are caused by interface defects, interface states and the like at the interface of the semiconductor surfaces and the problem of the slowing down of the transfer speed, and therefore, can achieve low noise, high resolution and fast response speed performances.

BRIEF DESCRIPTION OF DRAWINGS

FIG. 2(a) is a schematic cross-sectional view explaining an adumbrative structure of the semiconductor element pertaining to the first embodiment, taken on line IA-IA (or line IIIA-IIIA) in FIG. 1;

FIG. 2(b) is a view illustrating a potential profile of a lower edge (bottom) of conduction band, taken on level IA-IA of the cross-sectional view in FIG. 2(a), with voltages applied to a first field-control electrode as a parameter;

FIG. 2(c) is a view illustrating a change in a potential profile of an upper edge (top) of valence band, taken on level IIIA-IIIA in a horizontal direction of the cross-sectional view in FIG. 2(a), with the voltages applied to the first field-control electrode as the parameter.

FIG. 11(a) is a schematic cross-sectional view explaining an adumbrative structure of the semiconductor element pertaining to the third embodiment, taken on line IQ-IQ (or line IIIQ-IIIQ) of FIG. 10;

FIG. 11(b) is a view illustrating a potential profile of a lower edge (bottom) of conduction band, taken on level IQ-IQ of the cross-sectional view in FIG. 11(a), with voltages applied to the first field-control electrode as the parameter;

FIG. 11(c) is a view illustrating a change in a potential profile of an upper edge (top) of valence band, taken on level IIIQ-IIIQ in a horizontal direction of the cross-sectional view of FIG. 11(a), with voltages applied to the first field-control electrode as the parameter;

DESCRIPTION OF EMBODIMENTS

Figure 1:
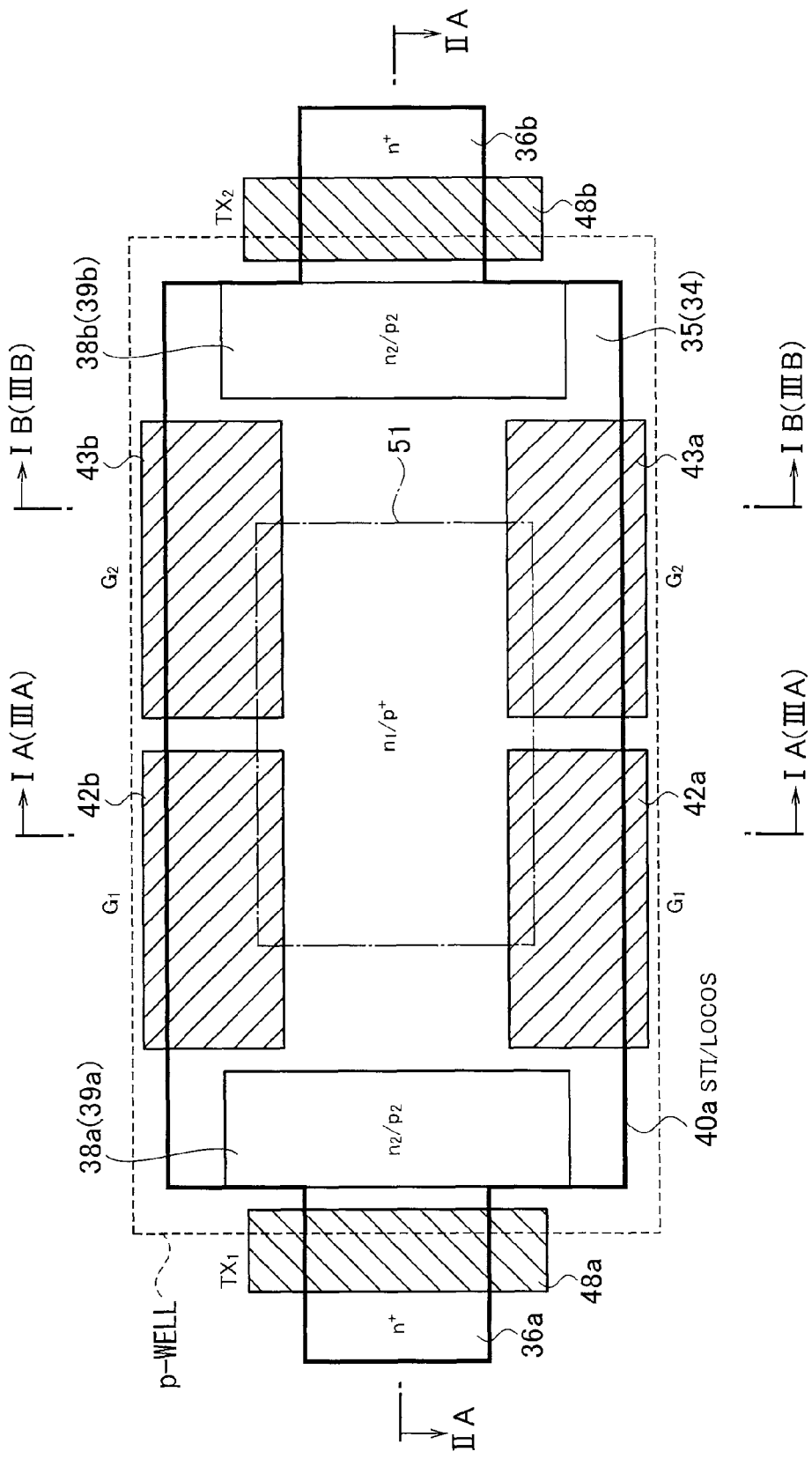
FIG. 1 is a schematic plan view of a semiconductor element pertaining to a first embodiment in the present invention, explaining a gross outline of a layout on a semiconductor chip.

The first to sixth embodiments of the present invention will be described below. In the following description of the drawings, although the same or similar reference numerals are given to the same or similar portions, the drawing is merely schematic. Thus, attention should be paid to a fact that a relation between a thickness and a planar dimension, a ratio between thicknesses of respective layers and the like differ from the actual values. Hence, the specific thicknesses and dimensions should be judged by referring to the following explanations. Also, naturally, a portion in which the mutual dimensional relation and ratio are different is included even between the mutual drawings.

In the explanations of the first to sixth embodiments, which will be described below, although a case in which a first conductivity type is p-type and a second conductivity type is n-type is exemplified, the conduction type may be selected in a reverse relation. That is, the first conductivity type may be n-type, and the second conductivity type may be p-type. In a case that the first conductivity type is p-type and the second conductivity type is n-type, carriers serving as signal charges becomes electrons. However, in a case that the first conductivity type is n-type and the second conductivity type is p-type, naturally, the carriers serving as the signal charges becomes holes. Also, nomenclature of "left direction" and "right direction", or alternatively, "upper direction" and "lower direction" is merely a definition for an explanatory convenience, and such definition shall not be construed to limit the technical scopes of the present invention. Thus, for example, when an orientation of the paper is rotated by 90 degrees, "left direction" to "right direction" and "upper direction" to "lower direction" shall be read mutually exchanged. When the paper is rotated by 180 degrees, naturally, "the left" is changed to "the right", and "the right" is changed to "the left".

First Embodiment

As illustrated in a plan view of FIG. 1, a semiconductor element pertaining to a first embodiment in the present invention encompasses a charge-transfer path, which is defined in a semiconductor region (34 and 35) and through which the signal charges are transferred, a pair of first field-control electrodes 42a and 42b laminated via an insulating film (whose illustration is omitted) on the semiconductor region (34 and 35) so as to sandwich the charge-transfer path in between, in a planar pattern, along a direction orthogonal to a transfer direction of the signal charges, and a pair of second field-control electrodes 43a and 43b, which are arranged separately from and adjacently to the first field-control electrodes 42a and 42b, respectively, along the transfer direction, and laminated via the insulating film (whose illustration is omitted) on the semiconductor region (34 and 35) so as to sandwich the charge-transfer path in between, in the planar pattern, along the direction orthogonal to the transfer direction.

In FIG. 1, a belt-like area encompassing an area being sandwiched between the pair of rectangular first field-control electrodes 42a and 42b and an area defined continuously to the right of the above area and being sandwiched between the pair of rectangular second field-control electrodes 43a and 43b, which extends along the left to right direction as a longer lateral direction (charge-transfer direction), is referred as "the charge-transfer path" in the semiconductor region (34 and 35). Field-control voltages, which differ from each other, are applied to the first field-control electrodes 42a and 42b and the second field-control electrodes 43a and 43b, respectively, and a depleted potential in the charge-transfer path is changed, thereby controlling a movement of the signal charges transferring in the semiconductor region (34 and 35). In order to efficiently change the depleted potential, as illustrated in the cross-sectional view of FIG. 2(a), a thickness of an insulating film 41 of a portion just under each of the first field-control electrodes 42a and 42b is set thinner than that of the other portion, and the insulating film 41 serves as a so-called "gate insulating film". Although the illustration is omitted, a thickness of an insulating film 41 of a portion just under each of the second field-control electrodes 43a and 43b is also set thinner than that of the other portion, and the insulating film 41 similarly serves as the gate insulating film.

A first charge-storage region 38a and a second charge-storage region 38b are formed at both ends in the longer lateral direction (charge-transfer direction) of the charge-transfer path illustrated in the plan view of FIG. 1. In FIG. 1, a first charge-readout region 36a is disposed still further to the left of the first charge-storage region 38a on the left, through a first transfer electrode 48a. On the other hand, in FIG. 1, a second charge-readout region 36b is disposed still further to the right of the second charge-storage region 38b on the right, through a second transfer electrode 48b. Transfer-control signals TX(i) are given to each of the first transfer electrode 48a and the second transfer electrode 48b from a vertical shift register 13 illustrated in FIG. 5. In order to make the first transfer electrode 48a and the second transfer electrode 48b effectively function, as illustrated in the cross-sectional view of FIG. 3, in the insulating film 41, the thickness of the portion just under each of the first transfer electrode 48a and the second transfer electrode 48b is set thinner than the thickness of the other portion, and the insulating film 41 serves as the so-called "gate insulating film".

Figure 3:
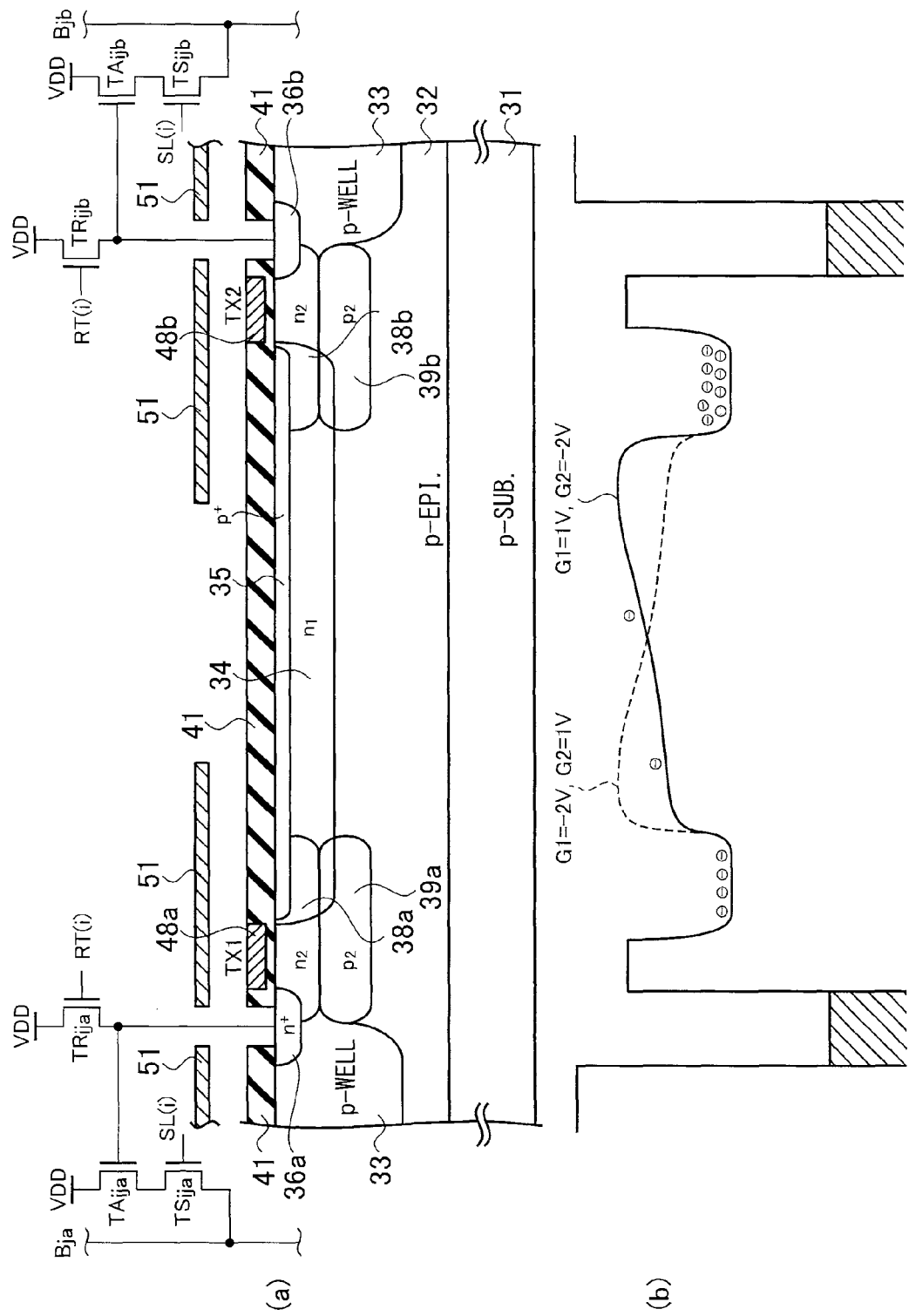
FIG. 3(a) is a schematic cross-sectional view explaining an adumbrative structure of the semiconductor element pertaining to the first embodiment, taken on line IIA-IIA in FIG. 1.
FIG. 3(b) is a view illustrating a potential profile of a lower edge (bottom) of a corresponding conduction band, with the voltages applied to the first and second field-control electrodes as the parameters.

As illustrated in the cross-sectional views of FIG. 2(a) and FIG. 3, the semiconductor region (34 and 35) illustrated in FIG. 1 encompasses an active-area formation layer 32 implemented by a semiconductor layer of first conductivity type (p-type) and a surface buried region 34 of second conductivity type (n-type) formed on a part of an upper portion of the active-area formation layer 32. Then, electrons, which are majority carriers in the surface buried region 34, are transferred as the signal charges through the surface buried region 34. In contact with a surface of the surface buried region 34, serving as the charge-transfer path, because a pinning layer 35 of first conductivity type (p-type) is stacked on the surface buried region 34, the semiconductor region (34 and 35) in the semiconductor element pertaining to the first embodiment is actually, implemented by triple-level layers.

Thus, in the explanation of the first embodiment, since the semiconductor region (34 and 35) is hereafter represented as the semiconductor region (32, 34 and 35), the semiconductor region (32, 34 and 35) in the semiconductor element pertaining to the first embodiment contains the active-area formation layer 32 of first conductivity type (p-type), the surface buried region 34 of second conductivity type (n-type) formed on a part of upper portion of the active-area formation layer 32, and the pinning layer 35 of first conductivity type (p-type) formed in contact with the surface of the surface buried region 34. Although the cross-sectional views of FIG. 2(a) and the FIG. 3 exemplify a structure in which the active-area formation layer 32 is grown on a semiconductor substrate 31 of first conductivity type (p-type) by epitaxial growth and the like, the active-area formation layer 32 may be deposited on the semiconductor substrate 31 of second conductivity type (n-type). In the pinning layer 35, a density of holes, which are carriers of the opposite conductivity type to the signal charges, is changed by the voltages applied to the first field-control electrodes 42a and 42b and to the second field-control electrodes 43a and 43b, together with the change in the depleted potential in the charge-transfer path.

Although the insulating film 41 is not illustrated in the plan view of FIG. 1, as illustrated in the cross-sectional view of FIG. 2(a), the pair of first field-control electrodes 42a and 42b can be understood to be laminated on the semiconductor region (32, 34 and 35), along a direction orthogonal to the transfer direction of the signal charges, so as to sandwich the surface buried region 34 serving as the charge-transfer path in between, via the insulating film 41. Also, although the illustration of the cross-sectional structure on the side of the second field-control electrodes 43a and 43b are omitted, similarly to the cross-sectional view of FIG. 2(a), the pair of second field-control electrodes 43a and 43b are also laminated on the semiconductor region (32, 34 and 35) via the insulating film 41, so as to sandwich the surface buried region 34 serving as the charge-transfer path in between.

In the plan view of FIG. 1, although an aperture is shown by a rectangular chain-dotted line, as illustrated in the cross-sectional view of FIG. 2(a), in such a way that light is selectively irradiated to a part of the charge-transfer path, a shield plate 51 that has the rectangular aperture is placed above the pair of first field-control electrodes 42a and 42b. In the plan view of FIG. 1, a part of the active-area formation layer 32 of first conductivity type (p-type), located just below the inside area of the aperture represented by the rectangular chain-dotted line, and a part of the surface buried region 34 of second conductivity type (n-type) implement a buried-photodiode region. In FIG. 1, the first field-control electrodes 42a and 42b and the second field-control electrodes 43a and 43b are arranged so as to surround the buried-photodiode region serving as a light receiving area just below the aperture. Then, by changing the potentials that are applied to the first field-control electrodes 42a and 42b and to the second field-control electrodes 43a and 43b, it is possible to alter the depleted potential of the surface buried region 34.

As illustrated in FIG. 3(a), a gate electrode of a first signal-readout transistor (amplification transistor) $TA_{ija}$ is connected to the first charge-readout region 36a through a contact window cut in the insulating film 41. A drain electrode of the first signal-readout transistor (amplification transistor) $TA_{ija}$ is connected to a power supply VDD, and a source electrode is connected to a drain electrode of a first switching transistor $TS_{ija}$ for pixel selection. A source electrode of the first switching transistor $TS_{ija}$ for the pixel selection is connected to a vertical signal line $B_{ja}$, and a control signal SL(i) for selecting a horizontal line is given to a gate electrode, from the vertical shift register 13 illustrated in FIG. 5. When the control signal SL(i) for selection is set to a high (H) level, the first switching transistor $TS_{ija}$ is turned on, and a current corresponding to a potential of the first charge-readout region 36a, which is amplified by the first signal-readout transistor $TA_{ija}$, is flowed to a vertical signal line $B_{jb}$. Moreover, a source electrode of a first reset transistor $TR_{ija}$ is connected to the first charge-readout region 36a. A drain electrode of the first reset transistor $TR_{ija}$ is connected to the power supply VDD, and a reset signal RT(i) is given to a gate electrode of the first reset transistor $TR_{ija}$, from the vertical shift register 13 illustrated in FIG. 5. When the reset signal RT(i) is set to high (H) level, the first reset transistor $TR_{ija}$ discharges the charges stored in the first charge-readout region 36a. Then, the first charge-readout region 36a is reset.

On the other hand, a gate electrode of a second signal-readout transistor (amplification transistor) $TA_{ijb}$ is connected to the second charge-readout region 36b through a contact window cut in the insulating film 41. A drain electrode of the second signal-readout transistor (amplification transistor) $TA_{ijb}$ is connected to the power supply VDD, and a source electrode is connected to a drain electrode of a second switching transistor $TS_{ijb}$ for pixel selection. A source electrode of the second switching transistor $TS_{ijb}$ for the pixel selection is connected to a vertical signal line $B_{jb}$, and the control signal SL(i) for selecting the horizontal line is given to a gate electrode, from the vertical shift register 13 illustrated in FIG. 5. When the control signal SL(i) for selection is set to high (H) level, the second switching transistor $TS_{ijb}$ is turned on, and a current corresponding to a potential of the second charge-readout region 36b, which is amplified by the second signal-readout transistor $TA_{ijb}$, is flowed to the vertical signal line $B_{jb}$. Moreover, a source electrode of a second reset transistor $TR_{ijb}$ is connected to the second charge-readout region 36b. A drain electrode of the second reset transistor $TR_{ijb}$ is connected to the power supply VDD, and the reset signal RT(i) is given to a gate electrode of the second reset transistor $TR_{ijb}$. When the reset signal RT(i) is set to high (H) level, the second reset transistor $TR_{ijb}$ discharges the charges stored in the second charge-readout region 36b. Then, the second charge-readout region 36b is reset.

Hereafter, while focusing to the first field-control electrodes 42a and 42b illustrated in FIG. 2 for convenience, we explain the change of the potential profiles illustrated in FIG. 2(b) and FIG. 2(c). FIG. 2(b) illustrates the change in the potential profile at lower edge (bottom) of conduction band, measured along the IA-IA direction in the horizontal direction in the cross-sectional view of FIG. 2(a), which is caused by the voltage applied to the first field-control electrodes 42a and 42b, and FIG. 2(c) illustrates the change in the potential profile of the upper edge (top) of valence band, measured along the IIIA-IIIA direction in the horizontal direction in the cross-sectional view of FIG. 2(a), which is caused by the voltage applied to the first field-control electrodes 42a and 42b. Although the potential profile is susceptible to the occupation area of the buried-photodiode region, the impurity concentration of the surface buried region 34 and the impurity concentration of the p+ pinning layer 35 at the surface, when a low or negative voltage (a voltage of a first potential level) is applied to the first field-control electrodes 42a and 42b, a potential well with respect to electrons becomes shallow as illustrated by dashed line of FIG. 2(b), and when a high voltage (a voltage of a second potential level) is applied to the first field-control electrodes 42a and 42b, the potential well with respect to electrons becomes deep as illustrated by the solid line of FIG. 2(b). On the other hand, as illustrated in FIG. 2(c), when the low or negative voltage (the voltage of the first potential level) is applied to the first field-control electrodes 42a and 42b, the potential well with respect to holes becomes deep as illustrated by dashed line of FIG. 2(c), and holes are accumulated in the pinning layer. However, when the high voltage (the voltage of the second potential well) is applied to the first field-control electrodes 42a and 42b, the potential well with respect to holes becomes shallow as illustrated by the solid line of FIG. 2(c), and holes are depleted. For this reason, in order that the depleted potential of the buried-photodiode region is greatly changed by the voltage of the first field-control electrodes 42a and 42b, the value of the impurity concentration of acceptors in the p+ pinning layer 35 at the surface is important.

In short, in the buried-photodiode region, when a low or a lower negative voltage is applied to each of the first field-control electrodes 42a and 42b, the hole density of the p+ pinning layer 35 at the surface is set to be a similar value to the impurity concentration of the acceptors, which substantially establishes the p+ pinning layer 35 at the surface. However, when a very high voltage is applied to the first field-control electrodes 42a and 42b, the hole density of the p+ pinning layer 35 at the surface is decreased, which leads to a depleted state of the buried-photodiode region, and therefore, the potential increases. Hence, in order to increase a depth $\Delta V_{well}$ of the potential well at lower edge of conduction band illustrated in FIG. 2(b), in particular, the potential of the center in the potential profile at upper edge of valence band illustrated in FIG. 2(c) is required to be greatly changed. If the impurity concentration of the p+ pinning layer 35 at the surface is very high (for example, the impurity concentration is $10^{19}$ cm$^{-3}$ or more), the buried-photodiode region is never depleted, and the potential of the p+ pinning layer 35 at center is substantially fixed to a substrate potential and never changed, even if the field-control voltage applied to the first field-control electrodes 42a and 42b is changed. In such a case, the change in the $\Delta V_{well}$ is kept small.

On the other hand, the impurity concentration of the p+ pinning layer 35 at the surface is desired to be set as high as possible in order to reduce a dark current in the buried-photodiode region. As a generation factor of the dark current, there is a generation and re-combination current $J_d$ that is caused by the state of interface traps between silicon and a silicon oxide film. The generation and re-combination current $J_d$ is given by the following equation when hole density of the p+ pinning layer 35 at the surface is defined as p.

$$J_d = S_o n_i^2 p \quad (1)$$

Here, $S_o$ is a constant that represents a generation velocity, and $n_i$ represents intrinsic carrier concentration. That is, as represented by Eq. (1), the generation and re-combination current $J_d$ that is caused by the state of interface traps is reversely proportional to the hole density in the p+ pinning layer 35 at the surface.

Thus, in order to get both of the realization of the lower dark current and the greater change in the depleted potential induced by the first field-control electrodes 42a and 42b, it is necessary to optimally select the hole density of the p+ pinning layer 35 at the surface. The optimal value of the hole density is considered to be approximately between the first half of $10^{18}$ cm$^{-3}$ orders and the second half of $10^{17}$ cm$^{-3}$ orders. The change in the depleted potential is also related to the thickness of the p+ pinning layer 35 at the surface, and therefore, the thickness of the p+ pinning layer 35 is desired to be about 0.1 micrometer. The change in the depleted potential depends on a speculation such that whether or not the carrier concentration in the p+ pinning layer 35 can be largely altered by voltages applied to the first field-control electrodes 42a and 42b.

As already described, the insulating film 41 is a dielectric film serving as the so-called "gate insulating film", and the thickness of the insulating film 41 at the portions just under the first field-control electrode 42a, the first field-control electrode 42b, the second field-control electrode 43a, the second field-control electrode 43b, the first transfer electrode 48a and the second transfer electrode 48b is set thinner than the thickness of the other portion, respectively. Then, as the material of the insulating film of each of the portions serving as the gate insulating film, although silicon oxide film ($SiO_2$ film) is preferable, as the material for the insulating gate structure of insulated-gate transistors (MIS transistors), various insulating films can be used, other than the silicon oxide film ($SiO_2$ film). For example, the above material may be an ONO film that is implemented by a triple-level lamination film of the silicon oxide film ($SiO_2$ film)/silicon nitride film ($Si_3N_4$ film)/the silicon oxide film ($SiO_2$ film). Moreover, oxide or silicon nitride that includes at least one element of strontium (Sr), aluminum (Al), magnesium (Mg), yttrium (Y), hafnium (Hf), zirconium (Zr), tantalum (Ta) and bismuth (Bi) can be used as the gate insulating film.

The actual structure of the insulating film 41 may be implemented by a stepped double-level structure, in which inter-layer insulating films are selectively and partially laminated on the thin insulating film serving as the gate insulating film so as to establish a stepped configuration, such that the protruding portions of inter-layer insulating films surrounds each of the first field-control electrode 42a, the first field-control electrode 42b, the second field-control electrode 43a, the second field-control electrode 43b, the first transfer electrode 48a and the second transfer electrode 48b. Or, the insulating film 41 may be formed into the stepped configuration so that the other inter-layer insulating films or field insulating films, which are different in thickness from the gate insulating film, are selectively laminated, so as to surround the first field-control electrode 42a, the first field-control electrode 42b, the second field-control electrode 43a, the second field-control electrode 43b, the first transfer electrode 48a and the second transfer electrode 48b, in the regions other than the regions serving as the gate insulating film. In this case, the materials of the inter-layer insulating films or field insulating films may be dielectrics, which are equal to or different from the materials of the gate insulating film. For example, the portions of the inter-layer insulating films may be formed by dielectric that has smaller relative dielectric constant than the portion of the gate insulating film.

In a case that silicon oxide film is employed for a portion serving as the gate insulating film in the insulating film 41, let us speculate on charge density $Q_{ox}$ per unit area, which is induced across two end surfaces of a capacitor insulating film of a parallel plate capacitor, in which silicon oxide film is used as the capacitor insulating film (dielectric film). That is, with the inter-electrode voltage V across two terminal plates of the parallel plate capacitor, and the capacitance $C_{ox}$ per unit area, the charge density $Q_{ox}$ per unit area, induced across two end surfaces of the capacitor insulating film, can be determined from the relation of the following equation.

$$Q_{ox} = C_{ox} V \quad (2)$$

For example, when the thickness of silicon oxide film serving as the insulating film 41 is seven nanometers and the potential difference of the inter-electrode voltage V is 3 volts, the charge density $Q_{ox}$ per unit area induced across two end surfaces of silicon oxide film becomes about $1.5 \times 10^{-6}$ cm$^{-2}$.

On the other hand, when the hole carrier concentration of the p+ pinning layer 35 is $1 \times 10^{18}$ cm$^{-3}$ and the thickness of the p+ pinning layer 35 is 0.1 micrometer, and if the hole density is assumed to be uniform in the thickness range, the value of hole density $Q_{pin}$ is given by, $$Q_{pin} = 1.6 \times 10^{19} \times 10^{18} \text{cm}^{-3} \times 0.1 \times 10^{-4} \text{cm}$$
$$= 1.6 \times 10^{-6} \text{cm}^{-2}$$

Thus, the hole density $Q_{pin}$ becomes a value similar to the charge density $Q_{ox}$ per unit area induced across two end surfaces of silicon oxide film. However, the estimated value of hole density $Q_{pin}$ shall be considered merely as rough speculation. Because the p+ pinning layer 35 exist in an area adjacent to a silicon region defined just beneath the insulating film 41, in a planar pattern, and the p+ pinning layer 35 is not disposed in the silicon region just beneath the insulating film 41, the first field-control electrodes 42a and 42b cannot directly control the hole density of the p+ pinning layer 35. However, with respect to the planar pattern, if the first field-control electrodes 42a and 42b can change the charge density of the surface buried regions 34 located on the side of the silicon region just beneath the insulating film 41, it is possible to change the hole density of the p+ pinning layer 35 on the surface buried region 34. Hence, depending on conditions, it is possible to deplete the p+ pinning layer 35.

As already mentioned, although the above explanation has been carried out focusing the attention to the first field-control electrodes 42a and 42b for convenience, when voltages are applied to the second field-control electrodes 43a and 43b along an IB-IB direction (IIIB-IIIB direction) of FIG. 1, the potential profiles, at lower edge (bottom) of conduction band and at upper edge (top) of valence band pertaining to the sides of the second field-control electrodes 43a and 43b, change similarly to the changes of the potential profiles as illustrated in FIG. 2(b) and FIG. 2(c), respectively. That is, although the illustration is omitted, even for the second field-control electrodes 43a and 43b, the changes of the potential profiles can be established similarly to the changes illustrated in FIG. 2(b) and FIG. 2(c). Thus, it is possible to recite the explanation perfectly similar to the explanation as to the case of the first field-control electrodes 42a and 42b.

In the usual solid-state imaging devices, the pinning layer is a layer for suppressing the generation of carriers and capturing of signal carriers at the surface, in a dark time, and is conventionally used as the layer preferable for reducing the dark current and for reducing the capturing of signal carriers. However, the p+ pinning layer 35 of the semiconductor element pertaining to the first embodiment conducts not only the conventionally known functions but also an important function for carrying out a specific action, by which the depleted potential of the buried-photodiode region is greatly changed with the voltages applied to the first field-control electrodes 42a and 42b.

By applying gate voltages of different levels from each other to the first field-control electrodes 42a and 42b and to the second field-control electrodes 43a and 43b illustrated in FIG. 1 and FIG. 3(a), it is possible to realize a charge-modulation element and the like, in which with light irradiated to an opening (aperture) of the shield plate 51, the carriers (electrons) generated in the buried-photodiode region, assigned at a part of the charge-transfer path, move at a high speed along the longer lateral direction (charge-transfer direction), by the field-control voltages applied to the first field-control electrodes 42a and 42b and to the second field-control electrodes 43a and 43b. That is, in the semiconductor element pertaining to the first embodiment, as illustrated in FIG. 1 and FIG. 3(a), the first charge-storage region 38a and the second charge-storage region 38b are disposed at both ends of the longer lateral direction (charge-transfer direction) of the charge-transfer path. Thus, by executing a scheme such that gate voltages of first and second potential levels, which are different from each other, aew applied to the first field-control electrodes 42a and 42b and to the second field-control electrodes 43a and 43b, it is possible to realize a TOF range sensor, in which carriers (electrons) generated in the buried-photodiode region, assigned at a part of the charge-transfer path, can be transferred along the longer lateral direction (charge-transfer direction) by the field-control voltages applied to the first field-control electrodes 42a and 42b and to the second field-control electrodes 43a and 43b, so that the signal charges can be distributed to different two directions at a high speed.

That is, by applying the gate voltages of the first and second potential levels to the first field-control electrodes 42a and 42b and the second field-control electrodes 43a and 43b, it is possible to create potential inclinations as illustrated in FIG. 3(b). For example, when each of the first field-control electrodes 42a and 42b=−2 volts (the voltage of the first potential level) and each of the second field-control electrodes 43a and 43b=1 volt (the voltage of the second potential level), the generated photo electrons are transferred to the second charge-storage region 38b on the right. Reversely, when each of the first field-control electrodes 42a and 42b=1 volt (the voltage of the second potential level) and each of the second field-control electrodes 43a and 43b is −2 volts (the voltage of the first potential level), the generated photo electrons are transferred to the first charge-storage region 38a on the left.

Figure 5:
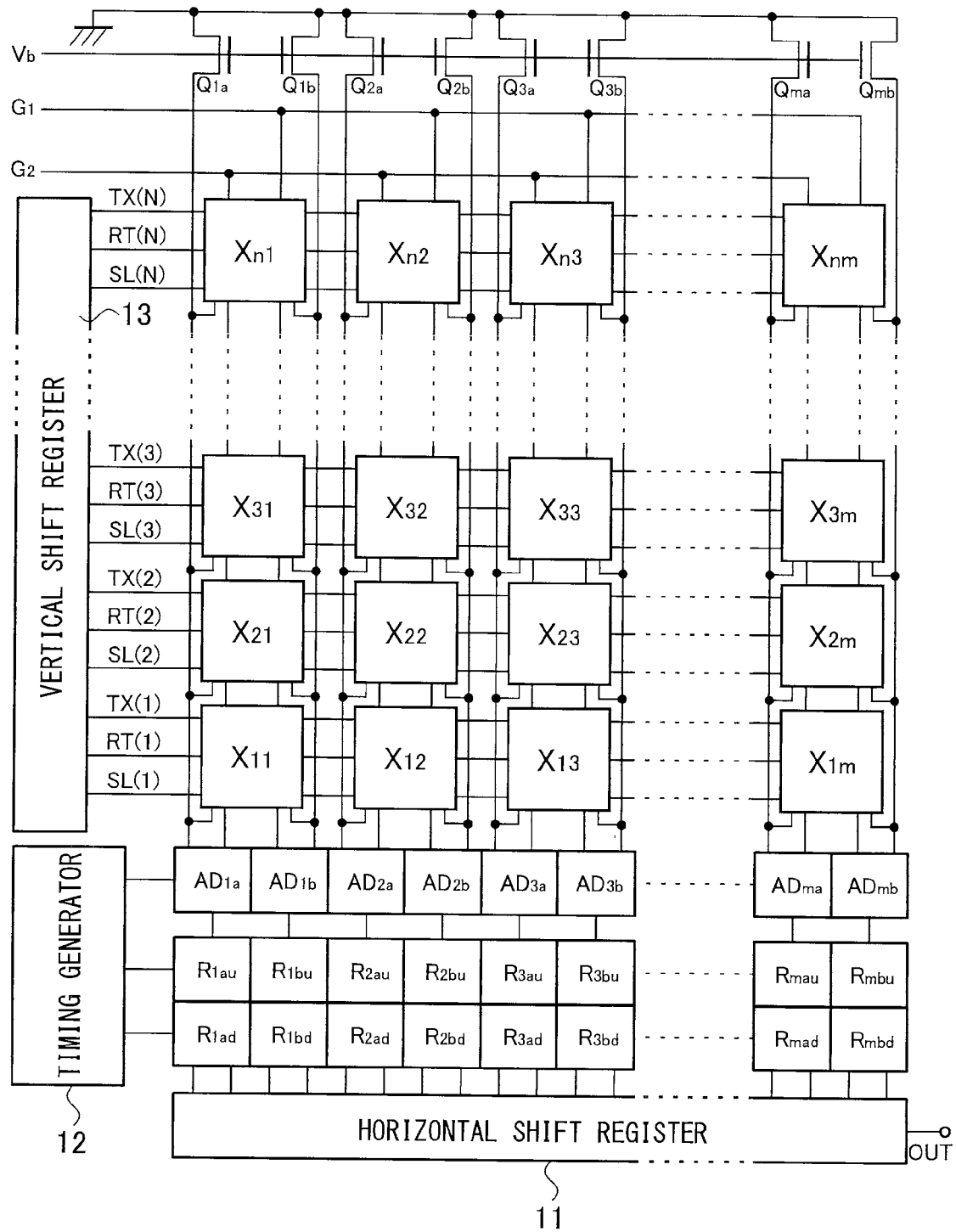
FIG. 5 is a schematic plan view illustrating a gross outline of a layout on a semiconductor chip of a solid-state imaging device pertaining to the first embodiment in the present invention.

By applying the transfer-control signal TX(i) to the first transfer electrode 48a from the vertical shift register 13 illustrated in FIG. 5, the signal charges stored in the first charge-storage region 38a are transferred to the first charge-readout region 36a. Similarly, by applying the transfer-control signal TX(i) to the second transfer electrode 48b from the vertical shift register 13 illustrated in FIG. 5, the signal charges stored in the second charge-storage region 38b are transferred to the second charge-readout region 36b. As illustrated in FIG. 3(a), the gate electrode of the first signal-readout transistor (amplification transistor) $TA_{ija}$ is connected to the first charge-readout region 36a. Thus, with the voltage corresponding to the charge quantity transferred to the first charge-readout region 36a, the output amplified by the first signal-readout transistor (amplification transistor) $TA_{ija}$ is delivered through the first switching transistor $TS_{ija}$ to the outside. Similarly, the gate electrode of the second signal-readout transistor (amplification transistor) $TA_{ijb}$ is connected to the second charge-readout region 36b. Hence, with the voltage corresponding to the charge quantity transferred to the second charge-readout region 36b, the output amplified by the second signal-readout transistor (amplification transistor) $TA_{ijb}$ is delivered through the second switching transistor $TS_{ijb}$ to the outside.

For example, in an application to a time of flight (TOF) range sensor, as a repetitive pulse signal from a light source placed at the TOF range sensor, light is irradiated to a target, and a delay time $T_d$ necessary for the round trip of the light reflected by the target may be measured. That is, in the application to the TOF range sensor, as mentioned above, the delay time $T_d$ is measured by periodically repeating operations for applying the field-control voltages of different levels from each other, to the first field-control electrodes 42a and 42b and the second field-control electrodes 43a and 43b, respectively, synchronously with a repetition cycle of a light pulse. That is, the light pulse, having a pulse width shorter than the doubled pulse width of each of the pulses of the field-control voltages applied to the first field-control electrodes 42a and 42b and to the second field-control electrodes 43a and 43b, respectively, is used. By receiving the short light pulse at a predetermined timing such that the pulse width includes a transition time from the first to the second potential levels and a transition time from the second to the first potential levels, it is possible to determine the delay time $T_d$ caused by a round trip time until the light pulse is reflected by the target and returned (a method of determining the delay time $T_d$ will be explained by using the timing chart illustrated in FIG. 12 and Eqs. (3) to (5), in the third embodiment). A distance L from the light source of the light pulse to the target can be determined by multiplying a half of the delay time $T_d$ by light velocity, after the delay time $T_d$, determined by the round trip time of the light pulse, is obtained.

As mentioned above, according to the semiconductor element pertaining to the first embodiment, as compared with a case in which a conventional MOS structure is used to control the potential just beneath the gate electrode in a longitudinal direction (vertical direction), the signal charges can be transferred at higher speed so that the electric field is substantially constant over the long distance in the charge-transfer direction, because the electric field control caused by static induction effect in a transverse direction (orthogonal to the charge-transfer direction) is used. That is, when the semiconductor element pertaining to the first embodiment is applied to the TOF range sensor, as compared with a CMOS type TOF range image sensor that uses a conventional buried photodiode, a length of the transfer path can be set long, which can improve a substantial fill factor (aperture ratio) and achieve a high sensitivity.

Moreover, in the structure in which the conventional MOS structure was used to control the potential just beneath the gate electrode in the longitudinal direction, there were noise and the dark current, which were caused by interface defects, interface states and the like at interface between the gate oxide film and the silicon surface. However, according to the semiconductor element pertaining to the first embodiment, because the control of electric field by the static induction effect in the transverse direction is used, the problems of the generations of the noise and the dark current, which are ascribable to interface defects, interface states and the like at interface between the gate oxide film and the silicon surface, and the problem of the slowing down of the transfer speed can be avoided.

Also, according to the semiconductor element pertaining to the first embodiment, because the signal charges can be alternately transferred at high speed to the first charge-storage region 38a and the second charge-storage region 38b, which are located at both ends (both terminals) of the charge-transfer path, the semiconductor element can be applied not only to the TOF range sensor but also to applications such as observing physical phenomenon in which the same phenomenon is repeated within an extremely short time. For example, if the semiconductor element pertaining to the first embodiment is applied to elements for measuring a lifetime of fluorescent material, the signal charges are transferred at high speed in a manner such that the electric field is substantially constant over the long distance in the charge-transfer direction. Hence, it is possible to realize a higher precision measurement.

Variation of First Embodiment

The feature of the semiconductor element pertaining to the first embodiment lies in a feature that the signal charges can be transferred at high speed in a manner such that the electric field is substantially constant over the long range in the charge-transfer direction. Focusing to the above feature, as illustrated in FIG. 4, it may be possible to realize a semiconductor element that has triple field-control electrodes implemented by the first field-control electrodes 42a and 42b, the second field-control electrodes 43a and 43b and the third field-control electrodes 44a and 44b, alternatively, it may be possible to realize semiconductor elements that have quadruple or more field-control electrodes, and it is further possible to realize the configuration in which the signal charges can be transferred at high speed in the situation that the electric field is substantially constant over the long range.

Figure 4:
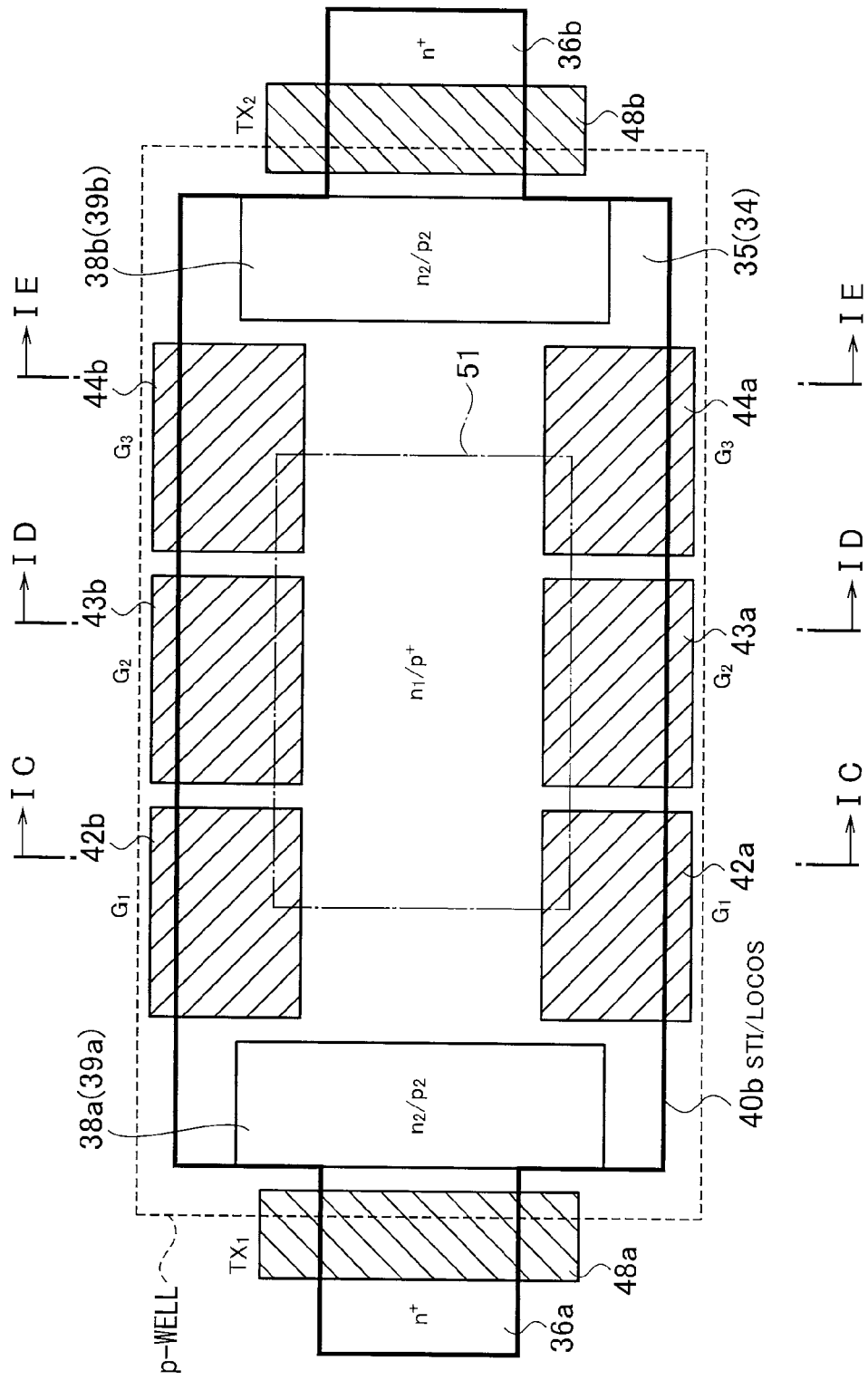
FIG. 4 is a schematic plan view explaining a gross outline of a layout on a semiconductor chip of a semiconductor element pertaining to a variation of the first embodiment in the present invention.

That is, as illustrated in the plan view of FIG. 4, the semiconductor element pertaining to the variation of the first embodiment in the present invention further encompasses the charge-transfer path, which is defined in the semiconductor region (32, 34 and 35) and through which the signal charges are transferred, a pair of first field-control electrodes 42a and 42b laminated via the insulating film (whose illustration is omitted, and as to the cross-sectional structure, refer to FIG. 2(a) and FIG. 3(a)) on the semiconductor region (32, 34 and 35) so as to sandwich the charge-transfer path in between, in a planar pattern, along the direction orthogonal to the transfer direction of the signal charges, a pair of second field-control electrodes 43a and 43b, which are separated from the first field-control electrodes 42a and 42b, respectively, and arranged adjacently to the first field-control electrodes 42a and 42b, respectively, along the transfer direction, and laminated via the insulating film on the semiconductor region (32, 34 and 35) so as to sandwich the charge-transfer path in between, in a planar pattern, along the direction orthogonal to the transfer direction, and a pair of third field-control electrodes 44a and 44b, which are separated from the second field-control electrodes 43a and 43b, respectively, and arranged adjacently to the edge sides of the second field-control electrodes 43a and 43b on the side opposite to the first field-control electrodes 42a and 42b, respectively, along the transfer direction, and laminated via the insulating film on the semiconductor region (32, 34 and 35) so as to sandwich the charge-transfer path in between, in a planar pattern, along the direction orthogonal to the transfer direction.

In FIG. 4, a belt-like area, which is implemented by an area being sandwiched between the pair of rectangular first field-control electrodes 42a and 42b, an area that is defined continuously to the right of the above area and being sandwiched between the pair of rectangular second field-control electrodes 43a and 43b and an area that is continuously defined still further to the right of the above area and being sandwiched between the pair of third rectangular field-control electrodes 44a and 44b, which extends along the left to right direction as a longer lateral direction (charge-transfer direction), is referred as "the charge-transfer path" in the semiconductor region (32, 34 and 35). The movement of the signal charges that are transferred through the semiconductor region (32, 34 and 35) is controlled by applying the field-control voltages, which differ from each other, to the first field-control electrodes 42a and 42b and the second field-control electrodes 43a and 43b, respectively, and applying the field-control voltages, which differ from each other, to the second field-control electrodes 43a and 43b and the third field-control electrodes 44a and 44b, and then changing the depleted potential in the charge-transfer path. In the semiconductor element pertaining to the variation of the first embodiment, for example, it is also possible to carry out an optional operational mode, by which a constant voltage is applied to the second field-control electrodes 43a and 43b in the center.

The first charge-storage region 38a and the second charge-storage region 38b are disposed at both ends of the longer lateral direction (charge-transfer direction) of the charge-transfer path illustrated in the plan view of FIG. 4. In FIG. 4, the first charge-readout region 36a is disposed still further to the left of the first charge-storage region 38a on the left, through the first transfer electrode 48a. On the other hand, in FIG. 4, the second charge-readout region 36b is disposed still further to the right of the second charge-storage region 38b on the right, through the second transfer electrode 48b.

Although the illustration of the cross-sectional structure is omitted, similarly to those illustrated in the cross-sectional views of FIG. 2(a) and FIG. 3, even in the semiconductor element pertaining to the variation of the first embodiment, the semiconductor region (32, 34 and 35) contains an active-area formation layer 32 implemented by a semiconductor layer of first conductivity type (p-type) and a surface buried region 34 of second conductivity type (n-type) formed on a part of upper portion of the active-area formation layer 32. Then, electrons, which are the majority carriers in the surface buried region 34 and serve as the signal charges, are transferred through the surface buried region 34. In contact with the surface of the surface buried region 34 serving as the charge-transfer path, a pinning layer 35 of first conductivity type (p-type) is laminated. In the pinning layer 35, the density of holes that serve as the carrier of the opposite conductivity type to the signal charges are changed by the voltages applied to the first field-control electrodes 42a and 42b, to the second field-control electrodes 43a and 43b and to the third field-control electrodes 44a and 44b, together with the change in the depleted potential in the charge-transfer path.

As illustrated in a plan view of FIG. 4, in such a way that the light is selectively irradiated to a part of the charge-transfer path, a shield plate 51 having the rectangular aperture shown by the chain-dotted line is placed above the pair of first field-control electrodes 42a and 42b, and a part of the active-area formation layer 32 of first conductivity type (p-type) located just below the inside area of the aperture and a part of the surface buried region 34 of second conductivity type (n-type) implement the buried-photodiode region. In FIG. 4, the first field-control electrodes 42a and 42b, the second field-control electrodes 43a and 43b and the third field-control electrodes 44a and 44b are arranged so as to surround the buried-photodiode region serving as the light receiving area just below the aperture. Then, by changing the potentials that are applied to the first field-control electrodes 42a and 42b, to the second field-control electrodes 43a and 43b and to the third field-control electrodes 44a and 44b, it is possible to alter the depleted potential of the surface buried region 34 in a manner such that the electric field is substantially constant over the long range in the charge-transfer direction.

By applying gate voltages of different levels from each other to the first field-control electrodes 42a and 42b, to the second field-control electrodes 43a and 43b and to the third field-control electrodes 44a and 44b illustrated in FIG. 4, it is possible to realize a charge-modulation element and the like, in which with the light irradiated to the opening (aperture) of the shield plate 51, the carriers (electrons) generated in the buried-photodiode region assigned at a part of the charge-transfer path can move at high speed along the longer lateral direction (charge-transfer direction), because an electric field is established with substantially constant strength over the long range in the charge-transfer direction, by the field-control voltages applied to the first field-control electrodes 42a and 42b, to the second field-control electrodes 43a and 43b and to the third field-control electrodes 44a and 44b.

That is, in the semiconductor element pertaining to the variation of the first embodiment, as illustrated in FIG. 4, the first charge-storage region 38a and the second charge-storage region 38b are disposed at both ends of the longer lateral direction (charge-transfer direction) of the charge-transfer path. Thus, by applying field-control voltages of the first, second and the third potential levels, which are different from each other, to the first field-control electrodes 42a and 42b, to the second field-control electrodes 43a and 43b and to the third field-control electrodes 44a and 44b, it is possible to realize a TOF range sensor in which the carriers (electrons) generated in the buried-photodiode region assigned at a part of the charge-transfer path can be moved while the signal charges are distributed to two different directions at high speed, by the electric field established with the substantially constant strength over the long range, in the longer lateral direction (charge-transfer direction), by the field-control voltages applied to the first field-control electrodes 42a and 42b, to the second field-control electrodes 43a and 43b and to the third field-control electrodes 44a and 44b.

That is, by applying the field-control voltages of the first, second and the third potential levels to the first field-control electrodes 42a and 42b, the second field-control electrodes 43a and 43b and the third field-control electrodes 44a and 44b, it is possible to create the potential inclinations in which the electric field is substantially constant over the long range in the charge-transfer direction, although the potential inclinations are substantially similar to that illustrated in FIG. 3(b). For example, when the constant voltage of the second potential level such as zero volt or the like is applied to the second field-control electrodes 43a and 43b at the center and each of the first field-control electrodes 42a and 42b=−2 volts (voltage of the first potential level) and each of the third field-control electrodes 44a and 44b=1 volt (the voltage of the third potential level), the generated photo electrons are transferred to the second charge-storage region 38b on the right. Reversely, when each of the first field-control electrodes 42a and 42b=1 volt (voltage of the third potential level) and each of the third field-control electrodes 44a and 44b is −2 volts (voltage of the first potential level), the generated photo electrons are transferred to the first charge-storage region 38a on the left.

By periodically repeating the above operations and then receiving the light pulse shorter than two times of the pulse width of the field-control voltage, at a predetermined timing such that the pulse width includes the transition time to the voltage of the third potential level from the first potential level and the transition time to the voltage of the first potential level from the third potential level, it is possible to determine the delay time $T_d$ caused by the round trip time until the light pulse is reflected by the target and returned (the method of determining the delay time $T_d$ will be explained later in the third embodiment). The distance L from the light source of the light pulse to the target can be determined by multiplying the half of the delay time $T_d$ by the light velocity, after the delay time $T_d$ determined by the round trip time of the light pulse is obtained.

As mentioned above, according to the semiconductor element pertaining to the variation of the first embodiment, because the control of electric field by the static induction effect in the transverse direction is used, as compared with the semiconductor element that has two field-control electrodes which are continuous in the charge-transfer direction, the signal charges can be transferred at higher speed so that the electric field is substantially constant over the longer range in the charge-transfer direction. In particular, according to the semiconductor element pertaining to the variation of the first embodiment, the signal charges can be transferred at higher speed to the first charge-storage region 38a and the second charge-storage region 38b. Thus, by applying the semiconductor element not only to the TOF range sensor but also to application for observing physical phenomenon in which the same phenomenon is repeated within the extremely short time, it is possible to achieve a higher precision measurement. For example, the semiconductor element pertaining to the variation of the first embodiment can be used as the element for measuring lifetime of fluorescent material with higher precision.

Furthermore, by adding optionally a pair of fourth field-control electrodes that are separated from the third field-control electrodes 44a and 44b, respectively, and arranged adjacently to the edge sides of the third field-control electrodes 44a and 44b on the side opposite to the second field-control electrodes 43a and 43b, respectively, along the transfer direction (right direction) of FIG. 4, and laminated via the insulating film 41 on the semiconductor region (32, 34 and 35) so as to sandwich the charge-transfer path in between, in a planar pattern, the pair of fourth field-control electrodes are arranged along the direction orthogonal to the transfer direction, and then, by applying field-control voltages differing from each other to the third field-control electrodes 44a and 44b and the fourth field-control electrodes, so as to control the movement of the signal charges transferring through the semiconductor region (32, 34 and 35), it is possible to achieve effectiveness such that the signal charges can be transferred at higher speed, because the electric field can be kept substantially constant over the longer range, than the semiconductor element having triple field-control electrodes continuous in the charge-transfer direction, which are exemplified in FIG. 4.

In this case, by designing an architecture that facilitate application of field-control voltages of first, second, the third and the fourth levels, which differ from each other, to the first field-control electrodes 42a and 42b, to the second field-control electrodes 43a and 43b, to the third field-control electrodes 44a and 44b and to the fourth field-control electrodes, it is possible to realize TOF range sensors and the like, in which, with the static induction effect in the transverse direction, the gentle potential inclination is produced along the longer lateral direction (charge-transfer direction), and the electric field is kept with substantially constant strength over the longer range, and the signal charges are distributed to two different directions, moving at high speed.

—Solid-State Imaging Device—

In a conventional image sensor, the charges are transferred by using the electric field produced just under the transfer-gate electrodes that are continuously arranged. Also in the CCD image sensor, the charges are moved under the transfer-gate electrodes that are continuously arranged. Because the semiconductor element pertaining to the first embodiment can be applied to pixels in the CMOS image sensor, by applying the architecture of the semiconductor element pertaining to the first embodiment to the pixels in the CMOS image sensor, the signal charges can be transferred at higher speed in the inside of each pixel than the conventional image sensor or CCD image sensor. In particular, in order to transfer the charges through multiple stages in the inside of each pixel, by using the buried photodiode structure for facilitating the effect of the field-control voltage in the direction orthogonal to the transfer direction of the signal charges so that the depleted potential of the transfer path can be changed by the electric field in the transverse direction, the signal charges can be transferred at high speed.

FIG. 5 is a schematic block diagram illustrating a rough configuration of a solid-state imaging device pertaining to the first embodiment of the present invention, in which the semiconductor elements pertaining to the first embodiment are two-dimensionally arrayed as unit pixels $X_{ij}$ (i=1 to m; j=1 to n: m and n are integer) so as to implement a pixel-array area. In the solid-state imaging device pertaining to the first embodiment, A/D convertors $AD_{1a}$, $AD_{1b}$; $AD_{2a}$, $AD_{2b}$; $AD_{3a}$, $AD_{3b}$; - - - ; $AD_{ma}$, $AD_{mb}$ for reading out signals and carrying out A/D conversions are integrated around the pixel-array area, and signals are converted into digital signals, which are read out as time-series signals to the outside, or the signals are read out as original analog signals to the outside.

In the solid-state imaging device (two-dimensional image sensor) pertaining to the first embodiment of the present invention, as illustrated in FIG. 5, the pixel-array area and a peripheral circuitry (11, 12 and 13) are arranged and integrated on the same semiconductor chip. In the pixel-array area, many pixels $X_{ij}$ are arrayed in a shape of a two-dimensional matrix, and for example, a rectangular imaging area is delineated. On a lower side of the pixel-array area, a horizontal shift register 11 is provided along pixel rows $X_{11}$, $X_{12}$, $X_{13}$, - - - , $X_{1m}$; $X_{21}$, $X_{22}$, $X_{23}$, - - - $X_{2m}$; $X_{31}$, $X_{32}$, $X_{33}$, - - - $X_{3m}$; - - - $X_{n1}$, $X_{n2}$, $X_{n3}$, - - - $X_{nm}$ directions illustrated in the horizontal direction in FIG. 5, and on a left side of the pixel-array area, a vertical shift register 13 is provided along pixel columns $X_{11}$, $X_{21}$, $X_{31}$, - - - , $X_{n1}$; $X_{12}$, $X_{22}$, $X_{32}$, - - - $X_{n2}$; $X_{13}$, $X_{23}$, $X_{33}$, - - - $X_{n3}$; - - - $X_{1m}$, $X_{2m}$, $X_{3m}$, - - - $X_{nm}$ directions illustrated in the vertical direction in FIG. 5. A timing generator 12 is connected to the vertical shift register 13 and the horizontal shift register 11.

A register $R_{1au}$ and a register $R_{1ad}$ are connected to the A/D convertor $AD_{1a}$. By a control signal from the timing generator 12, an A/D converted result of the A/D convertor $AD_{1a}$ is stored in one of the register $R_{1au}$ and the register $R_{1ad}$. More concretely, the A/D converted result of a reset level in outputs of the pixels is stored in the register $R_{1au}$, and the A/D converted result of signal levels ascribable to the optical charges in the outputs of the pixels are stored in the register $R_{1ad}$. Then, a difference between both of the A/D converted results is determined in digital regime, and the noise is cancelled. Consequently, the signal levels ascribable to the optical charges are extracted so as to obtain signals, in which fixed pattern noise and a part of temporal random noise (reset noise) are cancelled. Although the illustration is omitted, actually, the above process is carried out in each of the columns of the image sensor (however, the above process for determining the difference may be carried out outside of the tip, optionally).

Similarly, a register $R_{1bu}$ and a register $R_{1bd}$ are connected to the A/D convertor $AD_{1b}$. By a control signal from the timing generator 12, an A/D converted result of the A/D convertor $AD_{1b}$ is stored in one of the register $R_{1bu}$ and the register $R_{1bd}$. More concretely, the A/D converted result of a reset level in the outputs of the pixels is stored in the register $R_{1bu}$, and the A/D converted result of the signal levels ascribable to optical charges in the outputs of the pixels are stored in the register $R_{1bd}$. Then, the difference between both of the A/D converted results is determined in digital regime, and the noise is cancelled.

Moreover, a register $R_{2au}$ and a register $R_{2ad}$ are connected to the A/D convertor $AD_{2a}$, and a register $R_{2bu}$ and a register $R_{2bd}$ are connected to the A/D convertor $AD_{2b}$. Similarly, a register $R_{3au}$ and a register $R_{3ad}$ are connected to the A/D convertor $AD_{3a}$, and a register $R_{3bu}$ and a register $R_{3bd}$ are connected to the A/D convertor $AD_{3b}$. Moreover, similarly, a register $R_{mau}$ and a register $R_{mad}$ are connected to the A/D convertor $AD_{ma}$, and a register $R_{mbu}$ and a register $R_{mbd}$ are connected to the A/D convertor $AD_{mb}$.

That is, the solid-state imaging device pertaining to the first embodiment is organized so that, in units of pixel rows $X_{11}, X_{12}, X_{13}, ---, X_{1m}; X_{21}, X_{22}, X_{23}, ---X_{2m}; X_{31}, X_{32}, X_{33}, ---X_{3m}; ---X_{n1}, X_{n2}, X_{n3}, ---X_{nm}$ in the pixel-array area, the respective pixel rows $X_{11}, X_{12}, X_{13}, ---, X_{1m}; X_{21}, X_{22}, X_{23}, ---X_{2m}; X_{31}, X_{32}, X_{33}, ---X_{3m}; ---X_{n1}, X_{n2}, X_{n3}, ---X_{nm}$ can be vertically scanned by the vertical shift register 13, and further, the pixel signals of the respective pixel rows $X_{11}, X_{12}, X_{13}, ---, X_{1m}; X_{21}, X_{22}, X_{23}, ---X_{2m}; X_{31}, X_{32}, X_{33}, ---X_{3m}; ---X_{n1}, X_{n2}, X_{n3}, ---X_{nm}$ can be read out into the A/D convertors $AD_{1a}, AD_{1b}; AD_{2a}, AD_{2b}; AD_{3a}, AD_{3b}; ---; AD_{ma}, AD_{mb}$ by the horizontal shift register 11, through vertical signal lines $B_{ja}$ and $B_{jb}$, which are respectively assigned for the pixel columns $X_{11}, X_{21}, X_{31}, ---, X_{n1}; X_{12}, X_{22}, X_{32}, ---X_{n2}; X_{13}, X_{23}, X_{33}, ---X_{n3}; ---X_{1m}, X_{2m}, X_{3m}, ---X_{nm}$.

For example, transfer-control signals TX(i) are sent from the vertical shift register 13 to each of the first transfer electrode 48a and the second transfer electrode 48b in each pixel $X_{ij}$. Since the transfer-control signals TX(i) are given to the first transfer electrode 48a in each pixel $X_{ij}$ from the vertical shift register 13 illustrated in FIG. 5, the signal charges stored in the first charge-storage region 38a in each pixel $X_{ij}$ are transferred to the first charge-readout region 36a in each pixel $X_{ij}$. On the other hand, since the transfer-control signals TX(i) are given to the second transfer electrode 48b in each pixel $X_{ij}$ from the vertical shift register 13 illustrated in FIG. 5, the signal charges stored in the second charge-storage region 38b in each pixel $X_{ij}$ are transferred to the second charge-readout region 36b in each pixel $X_{ij}$. Moreover, the reset signals RT(i) are sent from the vertical shift register 13 to the gate electrodes of the first reset transistor $TR_{ija}$ and the second reset transistor $TR_{ijb}$ in each pixel $X_{ij}$. The source electrode of the first reset transistor $TR_{ija}$ is connected to the first charge-readout region 36a in each pixel $X_{ij}$. Thus, when the reset signals RT(i) are increased to high (H) level, the first reset transistor $TR_{ija}$ in each pixel $X_{ij}$ discharges the charges stored in the first charge-readout region 36a, and the first charge-readout region 36a is reset. Similarly, the second charge-readout region 36b in each pixel $X_{ij}$ is also reset.

After that, the control signals SL(i) for selecting a horizontal line are sent from the vertical shift register 13 to the gate electrodes of the first switching transistor $TS_{ija}$ and the second switching transistor $TS_{ijb}$ in each pixel $X_{ij}$. When the control signals SL(i) for selecting are increased to high (H) level, the first switching transistor $TS_{ija}$ in each pixel $X_{ij}$ is turned on, and a current corresponding to the potential of the first charge-readout region 36a, which is amplified by the first signal-readout transistor $TA_{ija}$, is flowed through the vertical signal line $B_{ja}$ and transmitted to the A/D convertor $AD_{ja}$. On the other hand, when the control signals SL(i) for selecting are increased to high (H) level, the second switching transistor $TS_{ijb}$ in each pixel $X_{ij}$ is turned on, and a current corresponding to the potential of the second charge-readout region 36b, which is amplified by the second signal-readout transistor $TA_{ijb}$, is flowed through the vertical signal line $B_{jb}$ and transmitted to the A/D convertor $AD_{jb}$.

In this way, in the solid-state imaging device pertaining to the first embodiment, the unit pixels $X_{ij}$ in the pixel-array area are sequentially scanned by the timing generator 12, the horizontal shift register 11 and the vertical shift register 13, and the operation for reading out pixel signals and an electron shuttering operation are executed, and the pixel signals are transmitted to the A/D convertors $AD_{1a}, AD_{1b}; AD_{2a}, AD_{2b}; AD_{3a}, AD_{3b}; ---; AD_{ma}, AD_{mb}$. The A/D convertors $AD_{1a}, AD_{1b}; AD_{2a}, AD_{2b}; AD_{3a}, AD_{3b}; ---; AD_{ma}, AD_{mb}$ carry out the A/D conversions of the pixel signals, respectively, under the control of the outputs from the timing generator 12.

The pixel signal as the digital signal that is A/D converted by the A/D convertor $AD_{1a}$ is controlled by the output of the timing generator 12 and stored in the register $R_{1au}$ and the register $R_{1ad}$, and then, is delivered as the image signal. On the other hand, the digital signal (pixel signal) that is A/D converted by the A/D convertor $AD_{1b}$ is controlled by the output of the timing generator 12 and stored in the register $R_{1bu}$ and the register $R_{1bd}$, and then, is delivered as the image signal. Also, the digital signal (pixel signal) that is A/D converted by the A/D convertor $AD_{2a}$ is controlled by the output of the timing generator 12 and stored in the register $R_{2au}$ and the register $R_{2ad}$, and then, is delivered as the image signal, and the digital signal (pixel signal) that is A/D converted by the A/D convertor $AD_{2b}$ is controlled by the output of the timing generator 12 and stored in the register $R_{2bu}$ and the register $R_{2bd}$, and then, is delivered as the image signal.

Similarly, the pixel signal as the digital signal that is A/D converted by the A/D convertor $AD_{3a}$ is controlled by the output of the timing generator 12 and stored in the register $R_{3a}$ and the register $R_{1ad}$, and then, is delivered as the image signal, and the digital signal (pixel signal) that is A/D converted by the A/D convertor $AD_{3b}$ is controlled by the output of the timing generator 12 and stored in the register $R_{3bu}$ and the register $R_{3bd}$, and then, is delivered as the image signal. Moreover, the digital signal (pixel signal) that is A/D converted by the A/D convertor $AD_{ma}$ is controlled by the output of the timing generator 12 and stored in the register $R_{mau}$ and the register $R_{mad}$, and then, is delivered as the image signal, and the digital signal (pixel signal) that is A/D converted by the A/D convertor $AD_{mb}$ is controlled by the output of the timing generator 12 and stored in the register $R_{mbu}$ and the register $R_{mbd}$, and then, is delivered as the image signal.

As already explained, because the electric field is controlled by the static induction effect along the transverse direction (orthogonal to the charge-transfer direction) in each of unit pixels $X_{ij}$ of the solid-state imaging device pertaining to the first embodiment, in which the semiconductor elements pertaining to the first embodiment are used as the unit pixels $X_{ij}$, the signal charges can be transferred at higher speed in the inside of each pixel $X_{ij}$, since the electric field can be kept substantially constant over the long distance in the charge-transfer direction, than conventional unit pixels implemented by a scheme of using conventional MOS structure, which controls the potential just beneath the gate electrode in the longitudinal direction (vertical direction).

Moreover, in the structure of unit pixel using the scheme of conventional MOS structures, which controls the potential just beneath the gate electrode in the longitudinal direction, the noise and the dark current have been generated by interface defects, interface states and the like at interface between the gate oxide film and the silicon surface. However, according to the solid-state imaging device pertaining to the first embodiment, because each unit pixel $X_{ij}$ uses the electric-field control by static induction effect in the transverse direction, in the inside of each unit pixel $X_{ij}$, it is possible to avoid the problems of the generations of the noise and the dark current, which are ascribable to interface defects, interface states and the like at interface between the gate oxide film and the silicon surface and the problem of the slowing down of the transfer speed. Hence, it is possible to realize the solid-state imaging device that is low in noise, high in resolution and fast in response speed.

Also, according to the solid-state imaging device pertaining to the first embodiment, the signal charges can be alternately transferred at high speed to the first charge-storage region 38a and the second charge-storage region 38b, which are located at both ends (both terminals) of the charge-transfer path in each unit pixel $X_{ij}$. Thus, the solid-state imaging device can be applied not only to the TOF range sensor but also to application for observing physical phenomenon in which the same phenomenon is repeated within in an extremely short time, and a two-dimensional image can be imaged. For example, if the solid-state imaging device pertaining to the first embodiment is applied as the element for measuring lifetime of fluorescent material, the signal charges are transferred at high speed so that the electric field is substantially constant over the long distance in the charge-transfer direction. Hence, it is possible to image the two-dimensional image with a higher precision.

Second Embodiment

Figure 6:
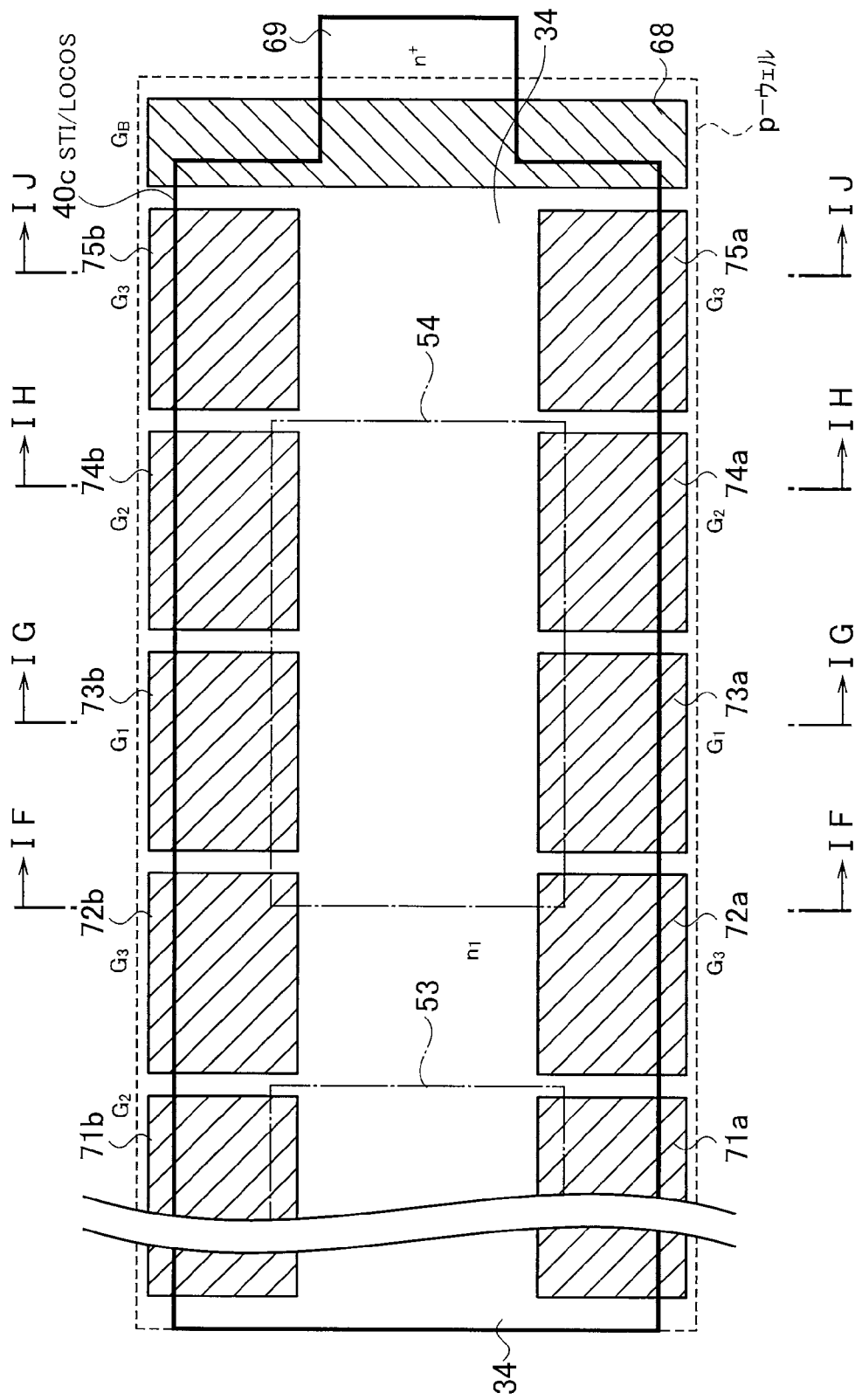
FIG. 6 is a schematic plan view explaining a gross outline of a layout on a semiconductor chip in a semiconductor element pertaining to a second embodiment in the present invention.

As illustrated in a plan view of FIG. 6, a semiconductor element pertaining to a second embodiment of the present invention encompasses a charge-transfer path, which is defined in a semiconductor region 34 and through which the signal charges are transferred, a pair of third field-control electrodes 72a and 72b in the preliminary stage ((k−1)$^{th}$ stage), laminated via an insulating film (whose illustration is omitted, but as to cross-sectional structure, see FIG. 2(a) and FIG. 3(a) in the first embodiment) on the semiconductor region 34 so as to sandwich the charge-transfer path in between, in a planar pattern, along the direction orthogonal to the transfer direction of the signal charges, a pair of first field-control electrodes 73a and 73b in a final stage (k$^{th}$ stage), which are arranged separately from and adjacently to the third field-control electrodes 72a and 72b in the preliminary stage ((k−1)$^{th}$ stage), respectively, along the transfer direction, and laminated via the insulating film on the semiconductor region 34, so as to sandwich the charge-transfer path in between, in the planar pattern, along the direction orthogonal to the transfer direction, a pair of second field-control electrodes 74a and 74b in the final stage (k$^{th}$ stage), which are separated from the first field-control electrodes 73a and 73b in the final stage (k$^{th}$ stage), respectively, along the transfer direction, and laminated via the insulating film on the semiconductor region 34 so as to sandwich the charge-transfer path in between, in the planar pattern, along the direction orthogonal to the transfer direction, and a pair of third field-control electrodes 75a and 75b in the final stage (k$^{th}$ stage), which are separated from the second field-control electrodes 74a and 74b in the final stage (k$^{th}$ stage), respectively, along the transfer direction, and laminated via the insulating film on the semiconductor region 34, so as to sandwich the charge-transfer path in between, in the planar pattern, along the direction orthogonal to the transfer direction.

In FIG. 6, a belt-like area encompassing an area being sandwiched between the pair of rectangular the third field-control electrodes 72a and 72b, an area defined continuously to the right of the above area and being sandwiched between the pair of rectangular first field-control electrodes 73a and 73b, an area continuously defined still further to the right of the above area and being sandwiched between the pair of rectangular second field-control electrodes 74a and 74b, and an area continuously defined still further to the right of the above area and being sandwiched between the pair of rectangular the third field-control electrodes 75a and 75b, which extends along the left to right direction as the longer lateral direction (charge-transfer direction), is referred as "the charge-transfer path" in the semiconductor region 34.

The semiconductor element pertaining to the second embodiment of the present invention is the charge transfer element adapted for three-phase operation. Actually, as illustrated in FIG. 6, the semiconductor element contains a pair of second field-control electrodes 71a and 71b in the preliminary stage ((k−1)$^{th}$ stage), so as to sandwich the charge-transfer path in between, along the direction orthogonal to the transfer direction, while being separated from the third field-control electrodes 72a and 72b in the preliminary stage ((k−1)$^{th}$ stage), respectively, on the left of the third field-control electrodes 72a and 72b in the preliminary stage ((k−1)$^{th}$ stage), namely on the left along the transfer direction. Moreover, although its illumination is omitted, the semiconductor element further contains a pair of first field-control electrodes in the preliminary stage ((k−1)$^{th}$ stage), which are separated from the second field-control electrodes 71a and 71b in the preliminary stage ((k−1)$^{th}$ stage), respectively, still further on the left to the second field-control electrodes 71a and 71b in the preliminary stage ((k−1)$^{th}$ stage) along the transfer direction.

Thus, in FIG. 6, the charge-transfer path of the semiconductor element pertaining to the second embodiment is the belt-like area that extends continuously to the area being sandwiched between the pair of rectangular the third field-control electrodes 72a and 72b in the preliminary stage ((k−1)$^{th}$ stage), and the belt-like area contains an extended area which is located continuously to the left of the above area and being sandwiched between the second field-control electrodes 71a and 71b, and further contains an extended area being sandwiched between the first field-control electrodes in the preliminary stage ((k−1)$^{th}$ stage). And, at the right end of the longer lateral direction (charge-transfer direction) of the charge-transfer path illustrated in the plan view of FIG. 6, a charge-readout region 69 is arranged via a transfer electrode (barrier gate electrode) 68.

Although the illustration of the cross-sectional structure is omitted, similarly to those illustrated in the cross-sectional views of FIG. 2(a) and FIG. 3, even in the semiconductor element pertaining to the second embodiment, the semiconductor region 34 contains an active-area formation layer 32 implemented by a semiconductor layer of first conductivity type (p-type) and a surface buried region 34 of second conductivity type (n-type) formed on a part of the upper portion of the active-area formation layer 32. Then, electrons as the majority carriers in the surface buried region 34 are transferred as the signal charges through the surface buried region 34. In contact with the surface of the surface buried region 34 serving as the charge-transfer path, a pinning layer 35 of first conductivity type (p-type) is laminated. In the pinning layer 35, the density of holes serving as the opposite-conductivity type carriers to the signal charges is changed by the voltages which are applied to the first field-control electrodes in the preliminary stage ((k−1)$^{th}$ stage) (whose illustration is omitted), the second field-control electrodes 71a and 71b in the preliminary stage ((k−1)$^{th}$ stage), the third field-control electrodes 72a and 72b in the preliminary stage ((k−1)$^{th}$ stage), the first field-control electrodes 73a and 73b in the final stage (k$^{th}$ stage), the second field-control electrodes 74a and 74b in the final stage (k$^{th}$ stage), and the third field-control electrodes 75a and 75b in the final stage (k$^{th}$ stage), together with the change in the depleted potential in the charge-transfer path.

As illustrated in a plan view of FIG. 6, in such a way that light is selectively irradiated to a part of the charge-transfer path, shield plates that have rectangular apertures 53 and 54, each of which is illustrated by chain-dotted line, are provided above the third field-control electrodes 72a and 72b in the preliminary stage ((k−1)$^{th}$ stage), the first field-control electrodes 73a and 73b in the final stage (k$^{th}$ stage), and the second field-control electrodes 74a and 74b in the final stage ($k^{th}$ stage). Then, a part of the active-area formation layer 32 of first conductivity type (p-type) located just below the insides of the apertures 53 and 54 and a part of the surface buried region 34 of second conductivity type (n-type) implement the buried-photodiode region.

In FIG. 6, the third field-control electrodes 72a and 72b in the preliminary stage (($k-1)^{th}$ stage), the first field-control electrodes 73a and 73b in the final stage ($k^{th}$ stage), the second field-control electrodes 74a and 74b in the final stage ($k^{th}$ stage) and the third field-control electrodes 75a and 75b in the final stage ($k^{th}$ stage) are arranged so as to surround the buried-photodiode region serving as the light receiving area just below the aperture 54. Then, when the potentials that are applied to the third field-control electrodes 72a and 72b in the preliminary stage (($k-1)^{th}$ stage), the first field-control electrodes 73a and 73b in the final stage ($k^{th}$ stage) and the second field-control electrodes 74a and 74b in the final stage ($k^{th}$ stage) are changed, the static induction effect in the transverse direction enables the depleted potential of the surface buried region 34 to be changed and also enables a depth of the bottom of electron-well to be changed.

Also, the first field-control electrodes in the preliminary stage (($k-1)^{th}$ stage) (whose illustration is omitted), the second field-control electrodes 71a and 71b in the preliminary stage (($k-1)^{th}$ stage), and the third field-control electrodes 72a and 72b in the preliminary stage (($k-1)^{th}$ stage) are arranged so as to surround the buried-photodiode region serving as the light receiving area just below the aperture 53. Then, when the potentials that are applied to the first field-control electrodes in the preliminary stage (($k-1)^{th}$ stage) (whose illustration is omitted) and the second field-control electrodes 71a and 71b in the preliminary stage (($k-1)^{th}$ stage) are changed, the static induction effect in the transverse direction enables the depleted potential of the surface buried region 34 to be changed and also enables the depth of the bottom of the electron well to be changed.

Figure 8:
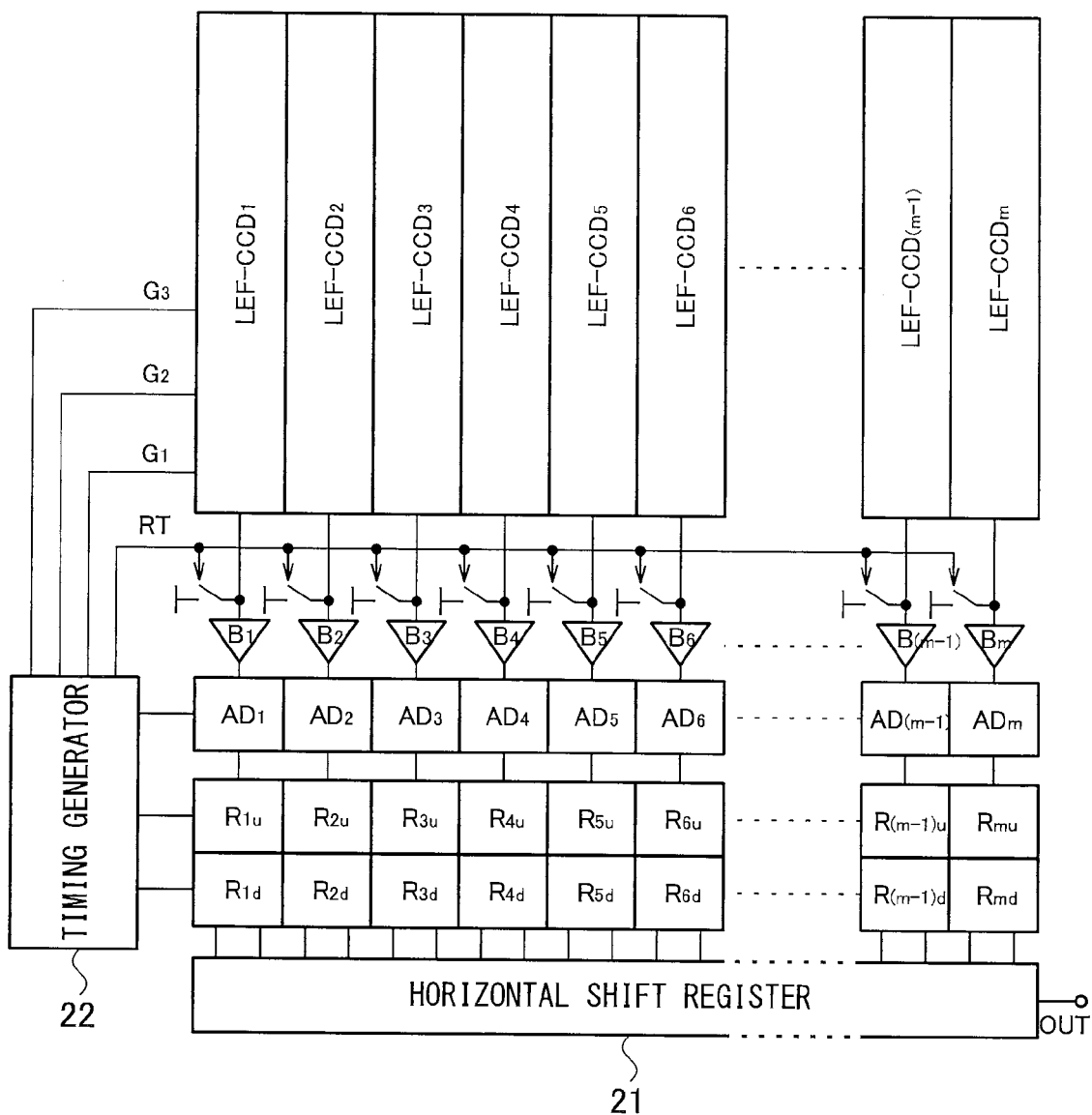
FIG. 8 is a schematic plan view explaining a gross outline of a layout on a semiconductor chip in a solid-state imaging device (CCD/CMOS hybrid image sensor) pertaining to the second embodiment in the present invention.

The source electrode of the reset transistor $TR_j$, which is illustrated as a switch in FIG. 8, is connected to the charge-readout region 69. The drain electrode of the reset transistor $TR_j$ is connected to the power supply VDD, and the reset signal RT is given to the gate electrode of the reset transistor $TR_j$ from the timing generator 22 illustrated in FIG. 8. When the reset signal RT is set to high (H) level, the reset transistor $TR_j$ discharges the charges stored in the charge-readout region 69, and the charge-readout region 69 is reset. As illustrated in FIG. 8, a buffer circuit (buffer amplifier) is further connected to the charge-readout region 69.

Although the illustration is omitted, the buffer circuit (buffer amplifier) $B_j$ is a source follower circuit implemented by a first output transistor $Q1_j$ and a second output transistor $Q2_j$. That is, a gate electrode of the first output transistor $Q1_j$ is connected to the charge-readout region 69 through a contact window cut in the insulating film 41. A drain electrode of the first output transistor $Q1_j$ is connected to the power supply VDD, and a source electrode is connected to a drain electrode of the second output transistor $Q2_j$. Then, the first output transistor $Q1_j$ and the second output transistor $Q2_j$ implement the source follower circuit.

A source electrode of the second output transistor $Q2_j$ is connected to an output terminal of the buffer circuit (buffer amplifier) $B_j$. The buffer circuit (buffer amplifier) $B_j$ connected to the charge-readout region 69 of FIG. 6 is an output circuit connected to the output terminal of each CCD-column in the vertical direction. Thus, the above buffer circuit (buffer amplifier) differs from the buffer circuits (buffer amplifiers) $B_{ija}$ and $B_{ijb}$ that are arranged in each pixel illustrated in FIG. 3(a) and does not have a row-selection switch and the like. A constant voltage Vb is applied to the gate electrode of the second output transistor $Q2_j$, which implements the source follower circuit, from the timing generator 22 illustrated in FIG. 8. Then, a current corresponding to a potential of the charge-readout region 69 is flowed to the output terminal of the buffer circuit (buffer amplifier) $B_j$.

The operation of the semiconductor element pertaining to the second embodiment of the present invention will be described below with reference to a timing chart illustrated in FIG. 7.

(a) At first, as illustrated in FIG. 7(a), a field-control voltage $G_1$ of the second potential level (=1 volt) is applied to the first field-control electrodes (whose illustration is omitted) in the preliminary stage (($k-1)^{th}$ stage) (the stage one stage prior to the final stage ($k^{th}$ stage)), a field-control voltage $G_2$ of the first potential level (=−2 volts) is applied to the second field-control electrodes 71a and 71b in the preliminary stage (($k-1)^{th}$ stage), a field-control voltage $G_3$ of the first potential level is applied to the third field-control electrodes 72a and 72b in the preliminary stage (($k-1)^{th}$ stage), the field-control voltage $G_1$ of the second potential level is applied to the first field-control electrodes 73a and 73b in the final stage ($k^{th}$ stage), the field-control voltage $G_2$ of the first potential level is applied to the second field-control electrodes 74a and 74b in the final stage ($k^{th}$ stage), and the field-control voltage $G_3$ of the first potential level is applied to the third field-control electrodes 75a and 75b in the final stage ($k^{th}$ stage). In a situation illustrated in FIG. 7(a), a transfer-control signal $G_B$ of low level (L) is applied to the transfer electrode (barrier gate electrode) 68. Consequently, the bottom level of the potential well is decreased between the first field-control electrodes (whose illustration is omitted) in the preliminary stage (($k-1)^{th}$ stage) and between the first field-control electrodes 73a and 73b in the final stage ($k^{th}$ stage). Then, the signal charges are stored between the first field-control electrodes (whose illustration is omitted) in the preliminary stage (($k-1)^{th}$ stage) and between the first field-control electrodes 73a and 73b in the final stage ($k^{th}$ stage).

(b) Next, as illustrated in FIG. 7(b), the field-control voltage $G_1$ of the second potential level is applied to the first field-control electrodes (whose illustration is omitted) in the preliminary stage (($k-1)^{th}$ stage), the field-control voltage $G_2$ of the second potential level is applied to the second field-control electrodes 71a and 71b in the preliminary stage (($k-1)^{th}$ stage), the field-control voltage $G_3$ of the first potential level is applied to the third field-control electrodes 72a and 72b in the preliminary stage (($k-1)^{th}$ stage), the field-control voltage $G_1$ of the second potential level is applied to the first field-control electrodes 73a and 73b in the final stage ($k^{th}$ stage), the field-control voltage $G_2$ of the second potential level is applied to the second field-control electrodes 74a and 74b in the final stage ($k^{th}$ stage), and the field-control voltage $G_3$ of the first potential level is applied to the third field-control electrodes 75a and 75b in the final stage ($k^{th}$ stage). In a situation illustrated in FIG. 7(b), the transfer-control signal $G_B$ of low level (L) is still kept to be applied to the transfer electrode (barrier gate electrode) 68. Consequently, a length of a region in which the bottom of the potential well is deep is enlarged to two times in a right direction. Then, the bottom level of the potential well is decreased between the first field-control electrodes (whose illustration is omitted) in the preliminary stage (($k-1)^{th}$ stage), between the second field-control electrodes 71a and 71b in the preliminary stage (($k-1)^{th}$ stage), between the first field-control electrodes 73a and 73b in the final stage ($k^{th}$ stage) and between the second field-control electrodes 74a and 74b in the final stage ($k^{th}$ stage). Then, a length of a region in which the signal charges are stored is enlarged to two times in the right direction. Then, the signal charges are stored between the first field-control electrodes (whose illustration is omitted) in the preliminary stage ((k−1)$^{th}$ stage), between the second field-control electrodes 71a and 71b in the preliminary stage ((k−1)$^{th}$ stage), between the first field-control electrodes 73a and 73b in the final stage (k$^{th}$ stage) and between the second field-control electrodes 74a and 74b in the final stage (k$^{th}$ stage). By the way, in a case that with the light irradiated to the opening (aperture) 54 of the shield plate, there are the carriers (electrons) generated in the buried-photodiode region that is formed in the part of the charge-transfer path, the carriers (electrons) generated in the potential wells between the first field-control electrodes 73a and 73b in the preliminary stage ((k−1)$^{th}$ stage) and between the second field-control electrodes 74a and 74b in the final stage (k$^{th}$ stage) are stored. Also, in a case that with the light irradiated to the opening (aperture) 53 of the shield plate, there are the carriers (electrons) generated in the buried-photodiode region that is formed in the part of the charge-transfer path, the carriers (electrons) generated in the potential wells between the first field-control electrodes (whose illustration is omitted) in the preliminary stage ((k−1)$^{th}$ stage) and between the second field-control electrodes 71a and 71b in the preliminary stage ((k−1)$^{th}$ stage) are stored.

(c) As illustrated in FIG. 7(c), the field-control voltage $G_1$ of the first potential level is applied to the first field-control electrodes (whose illustration is omitted) in the preliminary stage ((k−1)$^{th}$ stage), the field-control voltage $G_2$ of the second potential level is applied to the second field-control electrodes 71a and 71b in the preliminary stage ((k−1)$^{th}$ stage), the field-control voltage $G_3$ of the first potential level is applied to the third field-control electrodes 72a and 72b in the preliminary stage ((k−1)$^{th}$ stage), the field-control voltage $G_1$ of the first potential level is applied to the first field-control electrodes 73a and 73b in the final stage (k$^{th}$ stage), the field-control voltage $G_2$ of the second potential level is applied to the second field-control electrodes 74a and 74b in the final stage (k$^{th}$ stage), and the field-control voltage $G_3$ of the first potential level is applied to the third field-control electrodes 75a and 75b in the final stage (k$^{th}$ stage). In a situation illustrated in FIG. 7(c), the transfer-control signal $G_B$ of low level (L) is still kept to be applied to the transfer electrode (barrier gate electrode) 68. Consequently, a position of the region, where the bottom of the potential well is deep, moves in the right direction. Then, the bottom level of the potential well is decreased between the second field-control electrodes 71a and 71b in the preliminary stage ((k−1)$^{th}$ stage) and between the second field-control electrodes 74a and 74b in the final stage (k$^{th}$ stage). Then, the region, where the signal charges are stored, moves in the right direction toward the charge-readout region 69. Then, the signal charges are stored between the second field-control electrodes 71a and 71b in the preliminary stage ((k−1)$^{th}$ stage) and between the second field-control electrodes 74a and 74b in the final stage (k$^{th}$ stage).

(d) Next, as illustrated in FIG. 7(d), the field-control voltage $G_1$ of the first potential level is applied to the first field-control electrodes (whose illustration is omitted) in the preliminary stage ((k−1)$^{th}$ stage), the field-control voltage $G_2$ of the second potential level is applied to the second field-control electrodes 71a and 71b in the preliminary stage ((k−1)$^{th}$ stage), the field-control voltage $G_3$ of the second potential level is applied to the third field-control electrodes 72a and 72b in the preliminary stage ((k−1)$^{th}$ stage), the field-control voltage $G_1$ of the first potential level is applied to the first field-control electrodes 73a and 73b in the final stage (k$^{th}$ stage), the field-control voltage $G_2$ of the second potential level is applied to the second field-control electrodes 74a and 74b in the final stage (k$^{th}$ stage), and the field-control voltage $G_3$ of the second potential level is applied to the third field-control electrodes 75a and 75b in the final stage (k$^{th}$ stage). In a situation illustrated in FIG. 7(d), the transfer-control signal $G_B$ of low level (L) is still kept to be applied to the transfer electrode (barrier gate electrode) 68. Consequently, the length of the region, where the bottom of the potential well is deep, is enlarged to two times. Then, the bottom level of the potential well is decreased between the second field-control electrodes 71a and 71b in the preliminary stage ((k−1)$^{th}$ stage), between the third field-control electrodes 72a and 72b in the preliminary stage ((k−1)$^{th}$ stage), between the second field-control electrodes 74a and 74b in the final stage (k$^{th}$ stage), and between the third field-control electrodes 75a and 75b in the final stage (k$^{th}$ stage). Then, the length of the region in which the signal charges are stored is enlarged to two times in the right direction. Then, the signal charges are stored between the second field-control electrodes 71a and 71b in the preliminary stage ((k−1)$^{th}$ stage), between the third field-control electrodes 72a and 72b in the preliminary stage ((k−1)$^{th}$ stage), between the second field-control electrodes 74a and 74b in the final stage (k$^{th}$ stage), and between the third field-control electrodes 75a and 75b in the final stage (k$^{th}$ stage). Thus, the transfer of the signal charges is reached to the location between the third field-control electrodes 75a and 75b in the final stage (k$^{th}$ stage).

(e) Next, as illustrated in FIG. 7(e), the field-control voltage $G_1$ of the first potential level is applied to the first field-control electrodes (whose illustration is omitted) in the final stage (k$^{th}$ stage), the field-control voltage $G_2$ of the first potential level is applied to the second field-control electrodes 71a and 71b in the preliminary stage ((k−1)$^{th}$ stage), the field-control voltage $G_3$ of the second potential level is applied to the third field-control electrodes 3) 72a and 72b in the preliminary stage ((k−1)$^{th}$ stage), the field-control voltage $G_1$ of the first potential level is applied to the first field-control electrodes 73a and 73b in the final stage (k$^{th}$ stage), the field-control voltage $G_2$ of the first potential level is applied to the second field-control electrodes 74a and 74b in the final stage (k$^{th}$ stage), and the field-control voltage $G_3$ of the second potential level is applied to the third field-control electrodes 75a and 75b in the final stage (k$^{th}$ stage). In a situation illustrated in FIG. 7(e), the transfer-control signal $G_B$ of low level (L) is still kept to be applied to the transfer electrode (barrier gate electrode) 68. Consequently, the length of the region, where the bottom of the potential well is deep, shrinks back to the original length again. Then, the position of the region, where the bottom of the potential well is deep, moves in the right direction. Then, the bottom level of the potential well, between the third field-control electrodes 72a and 72b in the preliminary stage ((k−1)$^{th}$ stage) and between the third field-control electrodes 75a and 75b in the final stage (k$^{th}$ stage), decreases. Then, the region, where the signal charges are stored, moves in the right direction toward the charge-readout region 69. Then, the signal charges are stored between the third field-control electrodes 72a and 72b in the preliminary stage ((k−1)$^{th}$ stage) and between the third field-control electrodes 75a and 75b in the final stage (k$^{th}$ stage).

(f) Next, as illustrated in FIG. 7(f), the field-control voltage $G_1$ of the first potential level is applied to the first field-control electrodes (whose illustration is omitted) in the preliminary stage ((k−1)$^{th}$ stage), the field-control voltage $G_2$ of the first potential level is applied to the second field-control electrodes 71a and 71b in the preliminary stage ((k−1)$^{th}$ stage), the field-control voltage $G_3$ of the second potential level is applied to the third field-control electrodes 72a and 72b in the preliminary stage ($(k-1)^{th}$ stage), the field-control voltage $G_1$ of the second potential level is applied to the first field-control electrodes 73a and 73b in the final stage ($k^{th}$ stage), the field-control voltage $G_2$ of the first potential level is applied to the second field-control electrodes 74a and 74b in the final stage ($k^{th}$ stage), the field-control voltage $G_3$ of the second potential level is applied to the third field-control electrodes 75a and 75b in the final stage ($k^{th}$ stage). In a situation illustrated in FIG. 7(f), the transfer-control signal $G_B$ of low level (L) is still kept to be applied to the transfer electrode (barrier gate electrode) 68. Consequently, except for the final stage ($k^{th}$ stage), the length of the region, where the bottom of the potential well is deep, is enlarged to two times. Then, the bottom level of the potential well is decreased between the third field-control electrodes 72a and 72b in the preliminary stage ($(k-1)^{th}$ stage), between the first field-control electrodes 73a and 73b in the final stage ($k^{th}$ stage) and between the third field-control electrodes 75a and 75b in the final stage ($k^{th}$ stage). Then, the signal charges are stored between the third field-control electrodes 72a and 72b in the preliminary stage ($(k-1)^{th}$ stage), between the first field-control electrodes 73a and 73b in the final stage ($k^{th}$ stage) and between the third field-control electrodes 75a and 75b in the final stage ($k^{th}$ stage). Thus, the storage of the signal charges are still kept between the third field-control electrodes 75a and 75b in the final stage ($k^{th}$ stage).

(g) Next, as illustrated in FIG. 7(g), the field-control voltage $G_1$ of the second potential level is applied to the first field-control electrodes (whose illustration is omitted) in the preliminary stage ($(k-1)^{th}$ stage), the field-control voltage $G_2$ of the first potential level is applied to the second field-control electrodes 71a and 71b in the preliminary stage ($(k-1)^{th}$ stage), the field-control voltage $G_3$ of the first potential level is applied to the third field-control electrodes 72a and 72b in the preliminary stage ($(k-1)^{th}$ stage), the field-control voltage $G_1$ of the second potential level is applied to the first field-control electrodes 73a and 73b in the final stage ($k^{th}$ stage), the field-control voltage $G_2$ of the first potential level is applied to the second field-control electrodes 74a and 74b in the final stage ($k^{th}$ stage), and the field-control voltage $G_3$ of the first potential level is applied to the third field-control electrodes 75a and 75b in the final stage ($k^{th}$ stage). Moreover, the transfer-control signal $G_B$ of a high level (H) is applied to the transfer electrode (barrier gate electrode) 68. Consequently, except for the final stage ($k^{th}$ stage), the position of the region, where the bottom of the potential well is deep, moves in the right direction. Then, the bottom level of the potential well is decreased between the first field-control electrodes (whose illustration is omitted) in the preliminary stage ($(k-1)^{th}$ stage), between the first field-control electrodes 73a and 73b in the final stage ($k^{th}$ stage) and between the third field-control electrodes 75a and 75b in the final stage ($k^{th}$ stage). Then, in a condition that the signal charges are stored between the first field-control electrodes (whose illustration is omitted) in the preliminary stage ($(k-1)^{th}$ stage) and between the first field-control electrodes 73a and 73b in the preliminary stage ($(k-1)^{th}$ stage), the signal charges stored between the third field-control electrodes 75a and 75b in the final stage ($k^{th}$ stage) are transferred to the charge-readout region 69.

In this way, the field-control voltages $G_3$, $G_1$, $G_2$ and $G_3$ whose phases differ from each other are sequentially applied to the third field-control electrodes 72a and 72b in the preliminary stage ($(k-1)^{th}$ stage), the first field-control electrodes 73a and 73b in the final stage ($k^{th}$ stage), the second field-control electrodes 74a and 74b in the final stage ($k^{th}$ stage) and the third field-control electrodes 75a and 75b in the final stage ($k^{th}$ stage) so that the depleted potentials of the charge-transfer path can be sequentially changed, and consequently, the position of the region, where the bottom of the potential well is deep, the potential well is created in the charge-transfer path in the semiconductor region 34, moves in the right direction toward the charge-readout region 69. Thus, the signal charges are sequentially transferred in the right direction, and finally, transferred to the charge-readout region 69.

In a case of CCD in which the conventional MOS structure was used to control the potential just beneath the gate electrode in the longitudinal direction (vertical direction), there were the problems of generations of noise and dark current, which were caused by interface defects, interface states and the like at interface between the gate oxide film and the silicon surface, and the problem of the slowing down of the transfer speed. However, according to the semiconductor element pertaining to the second embodiment, with the static induction effect in the transverse direction, the depth of the bottom of potential well is changed, and the signal charges are transferred. Thus, it is possible to avoid the problems of generations of noise and dark current, which are ascribable to interface defects, interface states and the like at interface between the gate oxide film and the silicon surface and the problem of the slowing down of the transfer speed.

In particular, according to the semiconductor element pertaining to the second embodiment, for example, the signal charges generated in the buried-photodiode region just below an aperture $APT_k$ in the $k^{th}$ stage are sequentially transferred through the charge-transfer path without any involvement of noise and dark current and arrive at the potential well in the charge-transfer path in the $(k+1)^{th}$ stage. After the arrival at the potential well in the charge-transfer path in the $(k+1)^{th}$ stage, optical charges generated in the buried-photodiode region just below an aperture $APT_{(k+1)}$ in the $(k+1)^{th}$ stage and the optical charges, which are generated in the buried-photodiode region just below the aperture $APT_k$ in the $k^{th}$ stage and transferred from the $k^{th}$ stage, are added.

In this way, according to the semiconductor element pertaining to the second embodiment, when there are m apertures, the signal charges generated in the respective buried-photodiode regions are sequentially added m times, without any involvement of noise and dark current in the charge-transfer path, by sequential transferring action up to the final stage ($m^{th}$ stage). For this reason, according to the semiconductor element pertaining to the second embodiment, if the transfer speed is made equal to the movement speed of a physical body, it is possible to realize a function of TDI in which a moving target can be imaged at a high speed without any image blurring.

CCD/CMOS Hybrid Image Sensor

Although FIG. 6 illustrates a partial schematic plan view only focusing to a limited area of the vicinity around the final stage, the semiconductor element pertaining to the second embodiment is actually a charge transfer element of lateral electric-field controlling architecture with multiple stages, which implements a column of a certain length, where many field-control electrodes are arrayed in the previous stage direction (the left direction of FIG. 6).

FIG. 8 illustrates a schematic block diagram that explains a rough configuration of a charge coupling device (CCD) image sensor in which the semiconductor elements (multi-stages charge-transfer elements) pertaining to the second embodiment as exemplified in FIG. 6 implement respectively a plurality of charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$, and those plurality of charge-transfer columns $LEF\text{-}CCD_1$, LEF- $CCD_2$, $LEF\text{-}CCD_3$, - - -, $LEF\text{-}CCD_{(m-1)}$ and $LEF\text{-}CCD_m$ are deployed one-dimensionally in the horizontal direction of FIG. 8, assigning the vertical direction of column as the longer lateral direction (charge-transfer direction), so that the pixel-array area can be consequently organized. That is, the pixel-array area implements a rectangular imaging area, and FIG. 8 exemplifies a configuration in which the charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$ are deployed one-dimensionally along the horizontal direction in the rectangular imaging area.

In the solid-state imaging device (two-dimensional image sensor) pertaining to the second embodiment of the present invention, as illustrated in FIG. 8, the pixel-array area and the peripheral circuitry (21 and 22) are arranged on the same semiconductor chip and integrated into a single structure. A horizontal shift register 21 for transferring signal outputs from respective vertical columns in the horizontal direction is provided on the lower side of the pixel-array area. On the other hand, a timing generator 22 is connected to the lower portion of the left side of the pixel-array area, extending in parallel with the direction of (vertical direction) of a first lateral electric-field controlling architecture CCD ($LEF\text{-}CCD_1$), a second lateral electric-field controlling architecture CCD ($LEF\text{-}CCD_2$), a third lateral electric-field controlling architecture CCD ($LEF\text{-}CCD_3$), - - -, a $(m-1)^{th}$ lateral electric-field controlling architecture CCD ($LEF\text{-}CCD_{(m-1)}$) and a $m^{th}$ lateral electric-field controlling architecture CCD ($LEF\text{-}CCD_m$), each of which extends along the vertical direction (upper-lower direction), which is assigned as the longer lateral direction, in FIG. 8.

Figure 7:
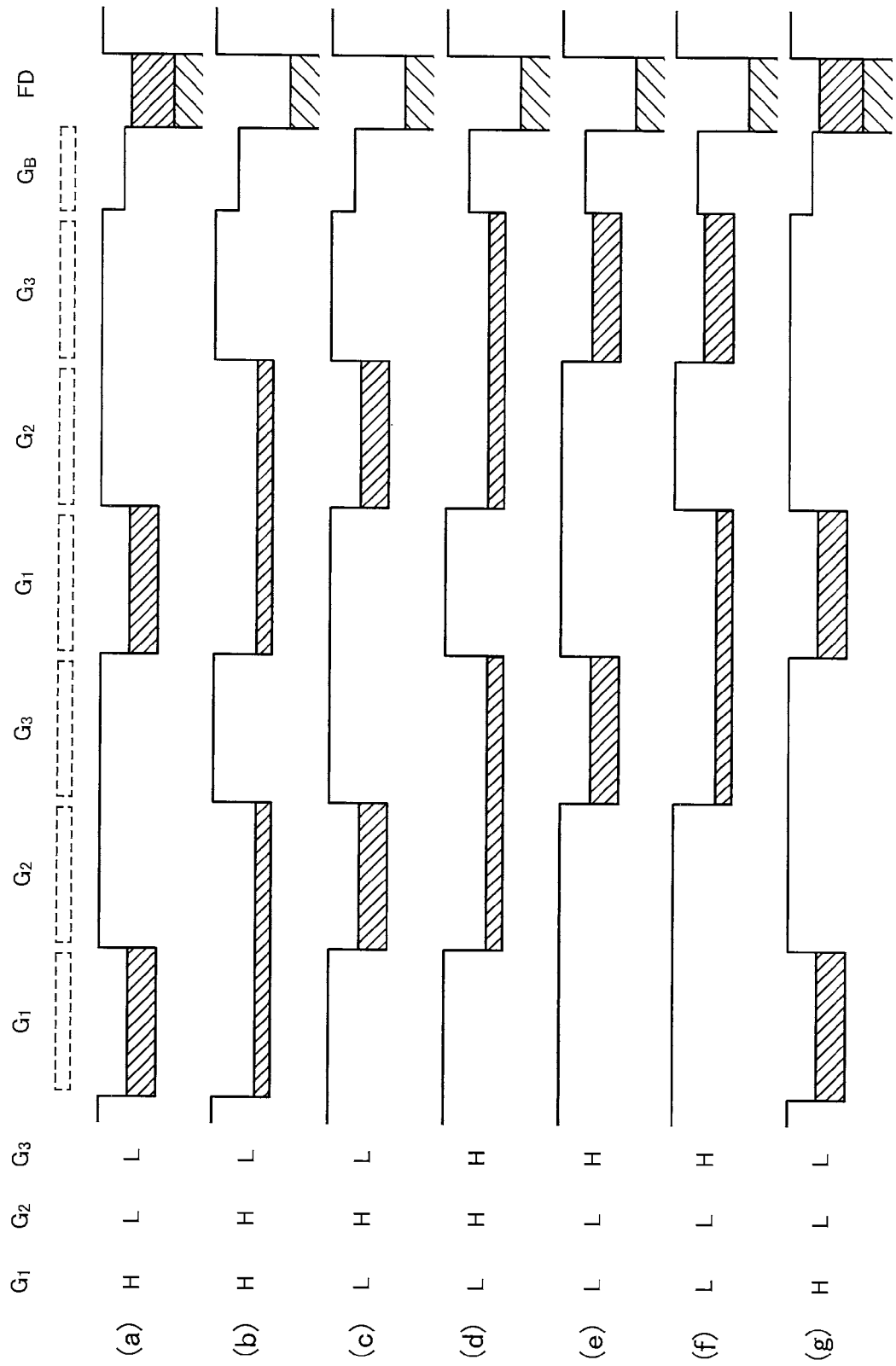
FIG. 7 is a timing chart that explains an operation of the semiconductor element pertaining to the second embodiment.

Similarly to the operation illustrated in FIG. 6 and FIG. 7, in the solid-state imaging device pertaining to the second embodiment, the three-phase electric field control signals $G_1$, $G_2$ and $G_3$ are supplied to each field-control electrode of respective charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$, from the timing generator 22. Then, by the static induction effect in the transverse direction, bottom-potentials of potential wells of the respective charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$ are changed so that the signal charges can be transferred through the charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$ in the vertical direction, respectively.

In FIG. 8, buffer circuits (buffer amplifiers) $B_1$, $B_2$, $B_3$, - - -, $B_{(m-1)}$ and $B_m$ are independently connected to the charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$ in the pixel-array area, through reset transistors $TR_1$, $TR_2$, $TR_3$, - - -, $TR_{(m-1)}$ and $TR_m$ illustrated as switches in FIG. 8, respectively. Each of the buffer circuits (buffer amplifiers) $B_j$ (=1 to m: m is integer of two or more) is the source follower circuit implemented by the first output transistor $Q1_j$ and the second output transistor $Q2_j$. The reset signal RT is supplied to the respective reset transistors $TR_1$, $TR_2$, $TR_3$, - - -, $TR_{(m-1)}$ and $TR_m$ from the timing generator 22.

Moreover, A/D converters $AD_1$, $AD_2$, $AD_3$, - - -, $AD_{(m-1)}$ and $AD_m$ are connected to the buffer circuits (buffer amplifiers) $B_1$, $B_2$, $B_3$, - - -, $B_{(m-1)}$ and $B_m$, which are connected to the respective columns. The A/D converters $AD_1$, $AD_2$, $AD_3$, - - -, $AD_{(m-1)}$ and $AD_m$ read out signals transmitted through the buffer circuits (buffer amplifiers) $B_1$, $B_2$, $B_3$, - - -, $B_{(m-1)}$ and $B_m$, from each column, through which the charges are transferred, so as to carry out the A/D conversion with signals supplied from the timing generator 22. That is, starting from the left of FIG. 8, the first charge-transfer column $LEF\text{-}CCD_1$ is connected through the first buffer circuit (buffer amplifier) $B_1$ to the first A/D converter $AD_1$. Also, the second charge-transfer column $LEF\text{-}CCD_2$ is connected through the second buffer circuit (buffer amplifier) $B_2$ to the second A/D converter $AD_2$. The third charge-transfer column $LEF\text{-}CCD_3$ is connected through the third buffer circuit (buffer amplifier) $B_3$ to the third A/D converter $AD_3$, - - - . Moreover, the $(m-1)^{th}$ charge-transfer column $LEF\text{-}CCD_{(m-1)}$ is connected through the $(m-1)^{th}$ buffer circuit (buffer amplifier) $B_{(m-1)}$ to the $(m-1)^{th}$ A/D converter $AD_{(m-1)}$. And, the $m^{th}$ charge-transfer column $LEF\text{-}CCD_m$ is connected through the $m^{th}$ buffer circuit (buffer amplifier) $B_m$ to the $m^{th}$ A/D converter $AD_m$.

A first upper-stage register $R_{1u}$ and a first lower-stage register Rid are connected to the first A/D converter $AD_1$. In accordance with a control signal from the timing generator 22, an A/D converted result of the A/D converter $AD_1$ is stored in one of the register $R_{1u}$ and the register Rid. More concretely, the A/D converted result of reset levels of outputs of pixels are stored in the register $R_{1u}$, and the A/D converted result of signal levels caused by optical charges of the outputs of the pixels are stored in the register Rid. Then, a difference between both is determined in digital regime, and noise is cancelled. Consequently, the signal level caused by the optical charges is extracted, thereby determining the signal from which fixed pattern noise and a part of a temporally random noise (reset noise) are cancelled. Although the illustration is omitted, this process is actually carried out in the column of the image sensor (however, the procedure for determining the difference may be carried out outside the chip).

Similarly, a second upper-stage register $R_{2u}$ and a second lower-stage register $R_{2d}$ are connected to the second A/D converter $AD_2$. In accordance with the control signal from the timing generator 22, an A/D converted result of the A/D converter $AD_2$ is stored in one of the register $R_{2u}$ and the register $R_{2d}$. That is, the A/D converted result of the reset level of the outputs of the pixels are stored in the register $R_{2u}$, and the A/D converted result of the signal level caused by the optical charges of the outputs of the pixels are stored in the register $R_{2d}$. Then, a difference between both is determined in digital regime, and noise is cancelled.

Similarly, a third upper-stage register $R_{3u}$ and a third lower-stage register $R_{3d}$ are connected to the third A/D converter $AD_3$. - - - . Moreover, a $(m-1)^{th}$ upper-stage register $R_{(m-1)u}$ and a $(m-1)^{th}$ lower-stage register $R_{(m-1)d}$ are connected to the $(m-1)^{th}$ A/D converter $AD_{(m-1)}$, and a $m^{th}$ upper-stage register $R_{mu}$ and a $m^{th}$ lower-stage register $R_{md}$ are connected to the $m^{th}$ A/D converter $AD_m$.

In this way, in the solid-state imaging device pertaining to the second embodiment illustrated in FIG. 8, the signals from the respective charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$ are read out by the buffer circuits (buffer amplifiers) $B_1$, $B_2$, $B_3$, - - -, $B_{(m-1)}$ and $B_m$, and then A/D-converted into the digital signals by the A/D converters $AD_1$, $AD_2$, $AD_3$, - - -, $AD_{(m-1)}$ and $AD_m$, respectively, and further stored in the upper-stage registers $R_{1u}$, $R_{2u}$, $R_{3u}$, - - - $R_{(m-1)u}$ and $R_{mu}$ and the lower-stage registers $R_{1d}$, $R_{2d}$, $R_{3d}$, - - - $R_{(m-1)d}$ and $R_{md}$ so that the signals can be transferred in the horizontal direction by the horizontal shift register 21 and that the signals can be read out as the image signal to the outside. Namely, the solid-state imaging device pertaining to the second embodiment implements a CCD/CMOS hybrid image sensor.

As mentioned already, in the solid-state imaging device pertaining to the second embodiment, because a plurality of charge-transfer columns $LEF\text{-}CCD_1$, $LEF\text{-}CCD_2$, $LEF\text{-}CCD_3$, - - -, $LEF\text{-}CCD_{(m-1)}$ and $LEF\text{-}CCD_m$, each of which are implemented by the semiconductor elements pertaining to the second embodiment, are deployed in the pixel-array area so as to form an imaging area, and because each of the charge-transfer columns LEF-CCD$_1$, LEF-CCD$_2$, LEF-CCD$_3$, - - -, LEF-CCD$_{(m-1)}$ and LEF-CCD$_{mj}$ uses the electric field control by the static induction effect in the transverse direction, in the inside of the charge-transfer columns LEF-CCD$_1$, LEF-CCD$_2$, LEF-CCD$_3$, - - - , LEF-CCD$_{(m-1)}$ and LEF-CCD$_m$, it is possible to avoid the problems of generations of noise and dark current, which are ascribable to interface defects, interface states and the like at interface between the gate oxide film and the silicon surface, and it is possible to avoid the problem of the slowing down of the transfer speed. On the contrary, in the conventional architecture, because the CCD vertical transfer path is implemented by the conventional MOS structure, configured to control the potential just beneath the gate electrode in the longitudinal direction (vertical direction) so as to transfer the charges, there were problems of noise and dark current, which were caused by interface defects, interface states and the like at interface between the gate oxide film and the silicon surface. Then, pertaining to the second embodiment, especially in the high speed charge transfer performance, similar advantageous behavior as the performance of CCD, it is possible to fabricate a solid-state imaging device that has a new function of realizing the noise-immune multi-stage transfer of the signal charges, only by a CMOS image-sensor manufacturing-method, or by adding a simple process to the CMOS image-sensor manufacturing-method.

In the conventional CCD image sensor, although CCD architecture is used not only for the vertical transfer but also for the horizontal transfer of the signal charges, in the solid-state imaging device (CCD/CMOS Hybrid Image Sensor) pertaining to the second embodiment illustrated in FIG. 8, the vertical transfer of the signal charges is carried out by CCD architecture, but for the horizontal reading out of the signal charges, the signal charges are A/D converted by the A/D converter implemented by CMOS circuit, and the signal charges are read out as the digital signal by CMOS digital circuit.

According to the solid-state imaging device pertaining to the second embodiment, in each of the charge-transfer columns LEF-CCD$_1$, LEF-CCD$_2$, LEF-CCD$_3$, - - -, LEF-CCD$_{(m-1)}$ and LEF-CCD$_{mj}$, for example, the signal charges generated in the aperture APT$_k$ in the k$^{th}$ stage are sequentially transferred through the charge-transfer path of each charge-transfer column without any involution of noise and dark current and arrive at the potential well in the charge-transfer path in the (k+1)$^{th}$ stage. After the arrival at the potential well in the charge-transfer path in the (k+1)$^{th}$ stage, the optical charges generated in the APT$_{(k+1)}$ in the (k+1)$^{th}$ stage and the optical charges which are generated in the aperture APT$_k$ in the k$^{th}$ stage and transferred from the k$^{th}$ stage are added. In this way, according to the solid-state imaging device pertaining to the second embodiment, if there are m apertures in each charge-transfer column, the signal charges can be added m times without any involution of noise and dark current in the charge-transfer path, by successive transferring actions up to the final stage (m$^{th}$ stage). For this reason, according to the solid-state imaging device pertaining to the second embodiment, if the transfer speed is made coincident with the movement speed of the physical body, it is possible to realize the function of the TDI in which the moving target can be imaged at high speed without any image blurring.

Variation of Second Embodiment

In the second embodiment of the present invention, although the three-phase charge-transfer element has been explained as an example, the present invention is not limited to the three-phase charge-transfer element, and the scheme of the present invention can be provided even by using a two-phase clock as follows.

Figure 9:
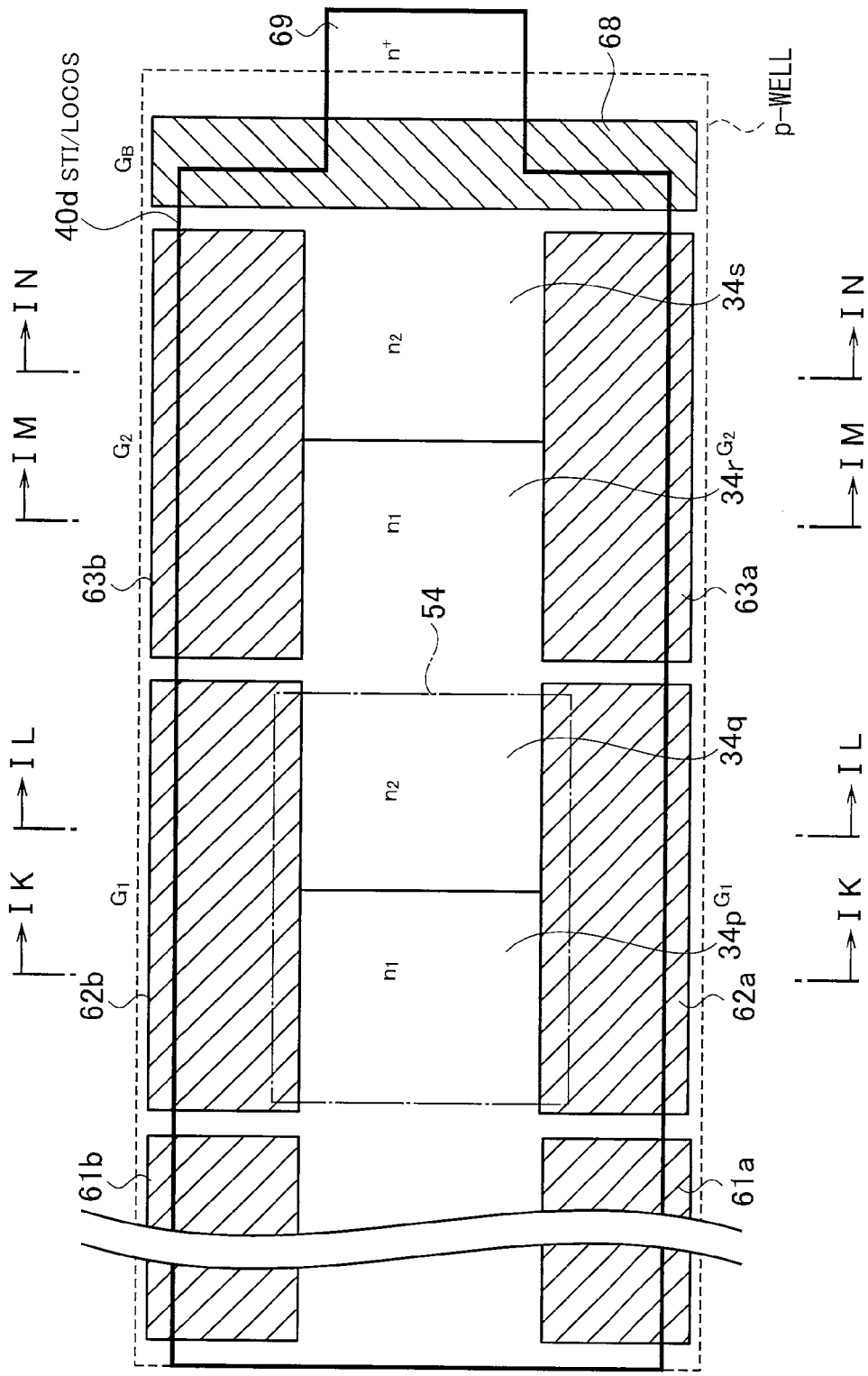
FIG. 9 is a schematic plan view explaining a gross outline of a layout on a semiconductor chip in a semiconductor element pertaining to a variation of the second embodiment in the present invention.

As illustrated in a plan view of FIG. 9, a semiconductor element pertaining to a variation of the second embodiment of the present invention encompasses a charge-transfer path through which signal charges are transferred, defined in semiconductor regions 34$p$, 34$q$, 34$r$ and 34$s$, penetrating through the semiconductor regions 34$p$, 34$q$, 34$r$ and 34$s$ that are adjacently disposed each other and aligned in a line, a pair of field-control electrodes 62$a$ and 62$b$ in the preliminary stage ((k−1)$^{th}$ stage) that are laminated via an insulating film (whose illustration is omitted, and for their cross-sectional structure, refer to FIG. 2($a$) and FIG. 3($a$) of the first embodiment) on the semiconductor regions 34$p$, 34$q$, 34$r$ and 34$s$ so as to sandwich the charge-transfer path in between, in a planar pattern, along a direction orthogonal to a transfer direction of the signal charges, and a pair of field-control electrodes 63$a$ and 63$b$ in the final stage (k$^{th}$ stage) that are arranged separately from and adjacently to field-control electrodes 62$a$ and 62$b$ in the preliminary stage ((k−1)$^{th}$ stage), respectively, along the transfer direction and laminated via the insulating film on the semiconductor regions 34$p$, 34$q$, 34$r$ and 34$s$, so as to sandwich the charge-transfer path in between, in the planar pattern, along the direction orthogonal to the transfer direction.

In the semiconductor element pertaining to the variation of the second embodiment, an impurity concentration n$_2$ of each of the semiconductor regions 34$q$ and 34$s$ is higher than an impurity concentration n$_1$ of each of the semiconductor regions 34$p$ and 34$r$. Since the relationship between the impurity concentration is set to be n$_2$>n$_1$, the potential well on each side of the semiconductor regions 34$q$ and 34$s$ is deeper than the potential well on each side of the semiconductor regions 34$p$ and 34$r$. That is, although the illustration is omitted, in the cross-sectional view taken on line IK-IK and on line IL-IL in FIG. 9, by the voltage applied to the first field-control electrodes 62$a$ and 62$b$, the potential profile at lower edge (bottom) of conduction band varies similarly to FIG. 2($b$), and the potential profile of the upper edge (top) of valence band varies similarly to FIG. 2($c$), and because the impurity concentration n$_2$ of the semiconductor region 34$q$ is higher than the impurity concentration n$_1$ of the semiconductor region 34$p$, the potential well of the lower edge (bottom) of conduction band in the region of the impurity concentration n$_2$ on the right is deep.

Also, in the cross-sectional view taken on line IM-IM and on line IN-IN in FIG. 9, by the voltage applied to the second field-control electrodes 63$a$ and 63$b$, the potential profile at lower edge (bottom) of conduction band varies similarly to FIG. 2($b$), and the potential profile of the upper edge (top) of valence band varies similarly to FIG. 2($c$), and because the impurity concentration n$_2$ of the semiconductor region 34$s$ is higher than the impurity concentration n$_1$ of the semiconductor region 34$r$, the potential well of the lower edge (bottom) of conduction band in the region of the impurity concentration n$_2$ on the right is deep.

Thus, in the semiconductor element pertaining to the variation of the second embodiment, in a situation in which a voltage is not applied to the (m−1)$^{th}$ field-control electrodes 62$a$ and 62$b$ and the m$^{th}$ field-control electrodes 63$a$ and 63$b$, the potential well on the right is deep between the (m−1)$^{th}$ field-control electrodes 62$a$ and 62$b$ and the m$^{th}$ field-control electrodes 63$a$ and 63$b$.

In FIG. 9, a belt-like area encompassing an area being sandwiched between the pair of rectangular field-control electrodes 62$a$ and 62$b$ and an area defined continuously to the right of the above area and being sandwiched between the pair of rectangular field-control electrodes 63a and 63b, which extends along the left to right direction as the longer lateral direction (charge-transfer direction), is referred as "the charge-transfer path" in the semiconductor regions 34p, 34q, 34r and 34s. Actually, as illustrated in FIG. 9, the semiconductor element pertaining to the variation of the second embodiment contains a pair of (m−2)$^{th}$ stage field-control electrodes 61a and 61b, so as to sandwich the charge-transfer path in between, along the direction orthogonal to the transfer direction, separately from the (m−1)$^{th}$ stage field-control electrodes 62a and 62b, respectively, on the left of the (m−1)$^{th}$ stage field-control electrodes 62a and 62b, namely, on the left along the transfer direction. Moreover, although the illustration is omitted in FIG. 9, the semiconductor element pertaining to the variation of the second embodiment is a multi-stage charge-transfer element that further contains a pair of (m−3)$^{th}$ stage field-control electrodes, which are located still further to the left of the (m−2)$^{th}$ stage field-control electrodes 61a and 61b, namely, on the left along the transfer direction and separated from the (m−2)$^{th}$ stage field-control electrodes 61a and 61b, respectively.

Thus, in FIG. 9, the charge-transfer path of the semiconductor element pertaining to the variation of the second embodiment is defined by the belt-like area encompassing the area being sandwiched between the pair of rectangular (m−1)$^{th}$ stage field-control electrodes 62a and 62b and the area located continuously to the left of the above region and being sandwiched between the (m−2)$^{th}$ stage field-control electrodes 61a and 61b and the (m−3)$^{th}$ stage field-control electrodes and further extended continuously to the left of the above region. And, a charge-readout region 69 is disposed at the right end of the longer lateral direction (charge-transfer direction) of the charge-transfer path illustrated in the plan view of FIG. 9, via a transfer electrode (barrier gate electrode) 68.

Although the illustration of its cross-sectional structure is omitted, similarly to those illustrated in the cross-sectional views of FIG. 2(a) and FIG. 3, also in the semiconductor element pertaining to the variation of the second embodiment, the semiconductor regions 34p, 34q, 34r and 34s encompasses an active-area formation layer 32 implemented by a semiconductor layer of first conductivity type (p-type), and the surface buried regions 34p, 34q, 34r and 34s of second conductivity type (n-type) formed on a part of the upper portion of the active-area formation layer 32. Then, electrons that are the majority carriers in the surface buried regions 34p, 34q, 34r and 34s are transferred as the signal charges through the surface buried regions 34p, 34q, 34r and 34s. A pinning layer of first conductivity type (p-type) is laminated in contact with the surface of the surface buried regions 34p, 34q, 34r and 34s that services as the charge-transfer path. In the pinning layer, a density of holes that serve as the opposite-conductivity type carriers to the signal charges is changed by the voltages of two-phase clocks, which are applied to the (m−3)$^{th}$ stage field-control electrodes, the (m−2)$^{th}$ stage field-control electrodes 61a and 61b, the (m−1)$^{th}$ stage field-control electrodes 62a and 62b and the m$^{th}$ stage field-control electrodes 63a and 63b, together with the change in the depleted potential in the charge-transfer path.

As illustrated in a plan view of FIG. 9, in such a way that the light is selectively irradiated to a part of the charge-transfer path, the shield plate that has a rectangular aperture 54 illustrated by chain-dotted line is provided above the (m−1)$^{th}$ stage field-control electrodes 62a and 62b. Then, a part of the active-area formation layer 32 of first conductivity type (p-type) located just below the inside area of the aperture 54 and a part of the surface buried region 34p and 34q of second conductivity type (n-type) implement the buried-photodiode region. In FIG. 9, the (m−1)$^{th}$ stage field-control electrodes 62a and 62b are arranged so as to surround the buried-photodiode region serving as the light receiving area just below the aperture 54. Then, when the potentials that are applied to the (m−1)$^{th}$ stage field-control electrodes 62a and 62b and the m$^{th}$ stage field-control electrodes 63a and 63b are changed, the static induction effect in the transverse direction enables the depleted potential of the semiconductor regions 34p, 34q, 34r and 34s to be changed and enables the depth of the bottom of potential well to be changed. Also, the (m−3)$^{th}$ stage field-control electrodes, the (m−2)$^{th}$ stage field-control electrodes 61a and 61b and the (m−1)$^{th}$ stage field-control electrodes 62a and 62b are arranged so as to surround the buried-photodiode region serving as the light receiving area just below the aperture 53. Then, when the potentials applied to the (m−3)$^{th}$ stage field-control electrodes and the (m−2)$^{th}$ stage field-control electrodes 61a and 61b are changed by the clock pulses of two-phases, the static induction effect in the transverse direction enables the depleted potential of the semiconductor regions 34p, 34q, 34r and 34s to be changed and enables the depth of the bottom of potential well to be changed.

Although the illustration is omitted, similarly to that illustrated in FIG. 8, the source electrode of the reset transistor TR$_j$ is connected to the charge-readout region 69. The drain electrode of the reset transistor TR$_j$ is connected to the power supply VDD, and the reset signal RT is given to the gate electrode of the reset transistor TR$_j$ from the timing generator 22 illustrated in FIG. 8. When the reset signal RT is set to high (H) level, the reset transistor TR$_j$ discharges the charges stored in the charge-readout region 69, and the charge-readout region 69 is reset. Similarly to that illustrated in FIG. 8, the buffer circuit (buffer amplifier) B$_j$ is further connected to the charge-readout region 69.

Although the illustration is omitted, the buffer circuit (buffer amplifier) B$_j$ is the source follower circuit implemented by the first output transistor Q1$_j$ and the second output transistor Q2$_j$. That is, the gate electrode of the first output transistor Q1$_j$ is connected to the charge-readout region 69 through a contact window cut in the insulating film 41. The drain electrode of the first output transistor Q1$_j$ is connected to the power supply VDD, and the source electrode is connected to the drain electrode of the second output transistor Q2$_j$. Then, the first output transistor Q1$_j$ and the second output transistor Q2$_j$ implement the source follower circuit.

The source electrode of the second output transistor Q2$_j$ is connected to the output terminal of the buffer circuit (buffer amplifier) B$_j$. The buffer circuit (buffer amplifier) B$_j$ connected to the charge-readout region 69 of FIG. 9 is the output circuit connected to the output terminal of each CCD-column in the vertical direction. Thus, the above buffer circuit (buffer amplifier) B$_j$ differs from the buffer circuits (buffer amplifiers) B$_{ija}$ and B$_{ijb}$, that are arranged in each pixel illustrated in FIG. 3(a) and does not have the row-selection switch and the like. The constant voltage Vb is applied to the gate electrode of the second output transistor Q2$_j$, which implements the source follower circuit, from the timing generator 22 similar to that illustrated in FIG. 8. Then, the current corresponding to the potential of the charge-readout region 69 is flowed to the output terminal of the buffer circuit (buffer amplifier) B$_j$.

For example, in a situation in which the transfer-control signal G$_B$ of low level (L) is still kept to be applied to the transfer electrode (barrier gate electrode) 68, the field-control voltage G$_1$ of the second potential level (high level H) is applied to the field-control electrodes in the (m−3)$^{th}$ stage, and the field-control voltage $G_2$ of the first potential level (low level L) is applied to the field-control electrodes 61a and 61b in the $(m-2)^{th}$ stage, and the field-control voltage $G_1$ of the second potential level is applied to the field-control electrodes 62a and 62b in the $(m-1)^{th}$ stage, and the field-control voltage $G_2$ of the first potential level is applied to the field-control electrodes 63a and 63b in the $m^{th}$ stage. In this situation, the bottom level of the potential well is decreased between the field-control electrodes in the $(m-3)^{th}$ stage and between the field-control electrodes 62a and 62b in the $(m-1)^{th}$ stage. Then, the signal charges, which are stored between the field-control electrodes in the $(m-4)^{th}$ stage and between the field-control electrodes 61a and 61b in the $(m-2)^{th}$ stage move in the right direction toward the charge-readout region 69, and the signal charges are stored between the field-control electrodes in the $(m-3)^{th}$ stage and between the field-control electrodes 62a and 62b in the $(m-1)^{th}$ stage.

In the semiconductor element pertaining to the variation of the second embodiment, the impurity concentration $n_2$ of each of the semiconductor regions 34q and 34s is higher than the impurity concentration $n_1$ of each of the semiconductor regions 34p and 34r. Thus, since the potential well in the region of impurity concentration $n_2$ on the right is deep between the field-control electrodes 63a and 63b in the $m^{th}$ stage, the signal charges are stored in the potential-well created side of the region of the impurity concentration $n_2$ on the right. Also, since the potential well in the region of impurity concentration $n_2$ on the right is deep even between the field-control electrodes in the $(m-3)^{th}$ stage, the signal charges are stored in the potential-well created side of the region of the impurity concentration $n_2$ on the right.

Next, the field-control voltage $G_2$ of the first potential level is applied to the field-control electrodes in the $(m-3)^{th}$ stage, and the field-control voltage $G_2$ of the second potential level is applied to the field-control electrodes 61a and 61b in the $(m-2)^{th}$ stage, and the field-control voltage $G_1$ of the first potential level is applied to the field-control electrodes 62a and 62b in the $(m-1)^{th}$ stage, and the field-control voltage $G_2$ of the second potential level is applied to the field-control electrodes 63a and 63b in the $m^{th}$ stage. Even in this situation, the transfer-control signal $G_B$ of low level (L) is still kept to be applied to the transfer electrode (barrier gate electrode) 68. Then, the bottom level of the potential well is decreased between the field-control electrodes 61a and 61b in the $(m-2)^{th}$ stage and between the field-control electrodes 63a and 63b in the $m^{th}$ stage. Then, the region, where the signal charges are stored, moves in the right direction. Thus, since the signal charges are stored between the field-control electrodes 61a and 61b in the $(m-2)^{th}$ stage and between the field-control electrodes 63a and 63b in the $m^{th}$ stage, the transfer of the signal charges arrives at the portion between the third field-control electrodes 63a and 63b in the $m^{th}$ stage. Since the potential well in the region of impurity concentration $n_2$ on the right is deep between the third field-control electrodes 63a and 63b in the $m^{th}$ stage, the signal charges are stored in the potential-well created side of the region of the impurity concentration $n_2$ on the right. Also, since the potential well in the region of impurity concentration $n_2$ on the right is deep even between the field-control electrodes 61a and 61b in the $(m-2)^{th}$ stage, the signal charges are stored in the potential well in the region of impurity concentration $n_2$ on the right.

And, the field-control voltage $G_2$ of the second potential level is applied to the field-control electrodes in the $(m-3)^{th}$ stage, and the field-control voltage $G_2$ of the first potential level is applied to the field-control electrodes 61a and 61b in the $(m-2)^{th}$ stage, and the field-control voltage $G_1$ of the second potential level is applied to the field-control electrodes 62a and 62b in the $(m-1)^{th}$ stage, and the field-control voltage $G_2$ of the first potential level is applied to the field-control electrodes 63a and 63b in the $m^{th}$ stage. Moreover, the transfer-control signal $G_B$ of the high level (H) is applied to the transfer electrode (barrier gate electrode) 68. Then, the signal charges, which are stored in the potential well in the region of impurity concentration $n_2$ on the right between the third field-control electrodes 63a and 63b in the $m^{th}$ stage, are transferred to the charge-readout region 69.

In this way, the field-control voltages $G_1$ and $G_2$ whose phases differ from each other are sequentially applied to the field-control electrodes 62a and 62b in the $(m-1)^{th}$ stage and the field-control electrodes 63a and 63b in the $m^{th}$ stage. Then, since the depleted potential in the charge-transfer path is sequentially changed, the position of the region, where the bottom of the potential well, created in the charge-transfer path defined in the semiconductor regions 34p, 34q, 34r and 34s, is deep moves in the right direction toward the charge-readout region 69, while the condition that the potential well in the region of impurity concentration $n_2$ on the right is deep is maintained. Thus, the signal charges are sequentially transferred in the right direction and finally transferred from the potential well in the region of impurity concentration $n_2$, allocated on the right between the third field-control electrodes 63a and 63b in the $m^{th}$ stage, to the charge-readout region 69.

In the case of the CCD in which the conventional MOS structure was used to control the potential just beneath the gate electrode in the longitudinal direction (vertical direction), there were the problems of generations of noise and dark current, which were caused by the defect and the like at interface between the gate oxide film and the silicon surface and the problem of the slowing down of the transfer speed. However, according to the semiconductor element pertaining to the variation of the second embodiment, with the static induction effect in the transverse direction, the depth of the bottom of potential well is changed, and the signal charges are transferred. Thus, it is possible to avoid the problems of generations of noise and dark current which are caused by the defect and the like at interface between the gate oxide film and the silicon surface and the problem of the slowing down of the transfer speed.

Third Embodiment

Figure 10:
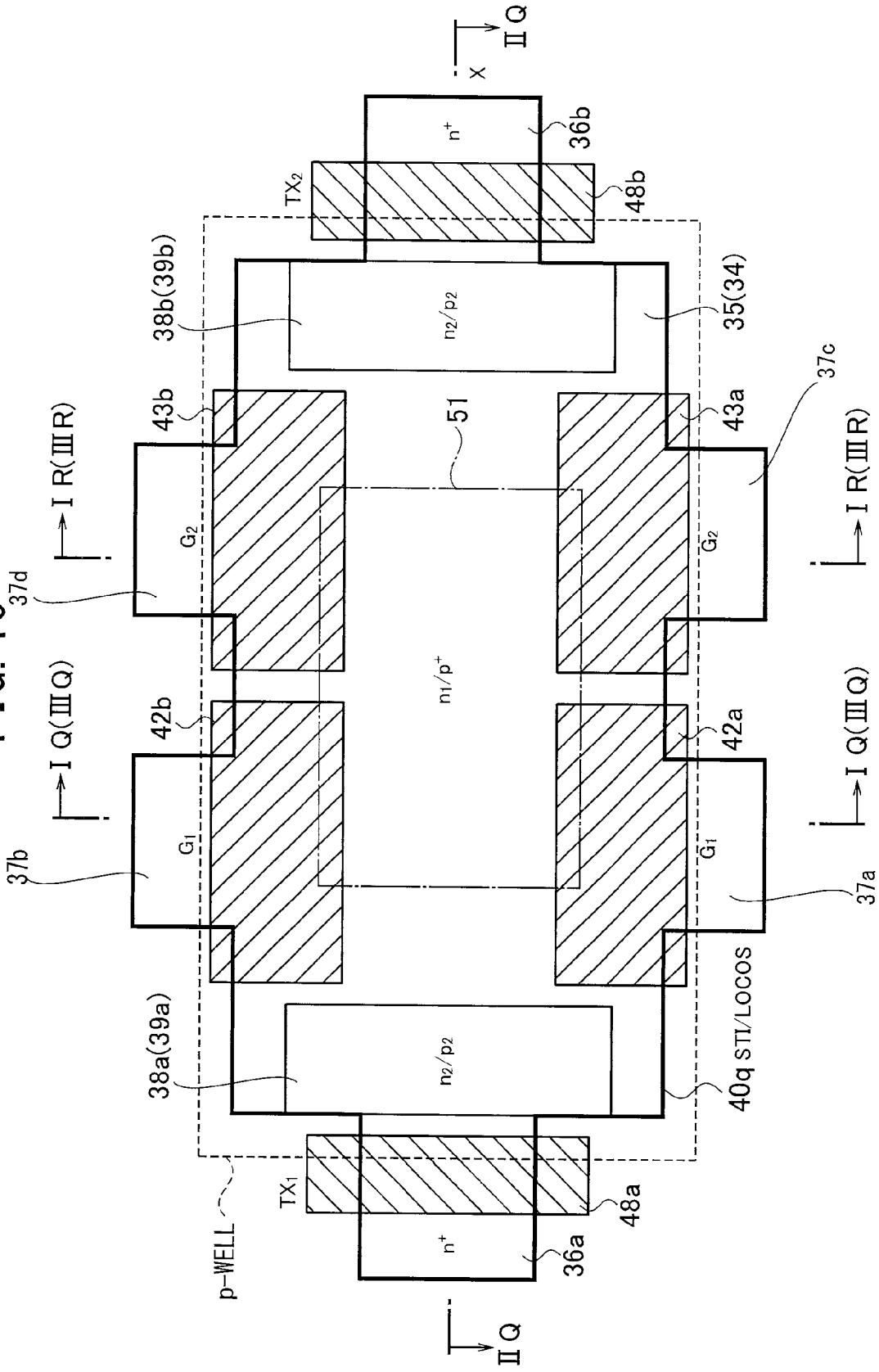
FIG. 10 is a schematic plan view explaining a gross outline of a layout on a semiconductor chip in a semiconductor element pertaining to a third embodiment in the present invention.

As illustrated in a plan view of FIG. 10, a semiconductor element pertaining to a third embodiment of the present invention encompasses a charge-transfer path, which is defined in a semiconductor region (34 and 35) and through which the signal charges are transferred, a pair of first field-control electrodes 42a and 42b laminated via the insulating film (whose illustration is omitted) on the semiconductor region (34 and 35) so as to sandwich the charge-transfer path in between, in a planar pattern, along the direction orthogonal to the transfer direction of the signal charges, and a pair of second field-control electrodes 43a and 43b, which are arrayed separately from and adjacently to the first field-control electrodes 42a and 42b, respectively, along the transfer direction, and laminated via the insulating film (whose illustration is omitted) on the semiconductor region (34 and 35) so as to sandwich the charge-transfer path in between, in the planar pattern, along the direction orthogonal to the transfer direction.

In FIG. 10, a belt-like area, which is implemented by an area being sandwiched between the pair of rectangular first field-control electrodes 42a and 42b and an area defined continuously to the right of the above area and being sandwiched between the pair of rectangular second field-control electrodes 43a and 43b, which extends along the left to right direction as the longer lateral direction (charge-transfer direction), is referred as "the charge-transfer path" in the semiconductor region (34 and 35). The movement of the signal charges that are transferred through the semiconductor region (34 and 35) is controlled by applying the field-control voltages, which differ from each other, to the first field-control electrodes 42a and 42b and the second field-control electrodes 43a and 43b, respectively, and consequently changing the depleted potential in the charge-transfer path.

Moreover, as illustrated in FIG. 10, the semiconductor element pertaining to the third embodiment further encompasses a pair of first charge-extraction regions 37a and 37b, which are provided with the charge-transfer path between, on a part of the upper portion of the semiconductor region (34 and 35), at positions outside the pair of first field-control electrodes 42a and 42b, along the direction orthogonal to the transfer direction of the signal charges, and a pair of second charge-extraction regions 37c and 37d, which are provided with the charge-transfer path between, on a part of the upper portion of the semiconductor region (34 and 35), at positions outside the pair of second field-control electrodes 43a and 43b, along the direction orthogonal to the transfer direction of the signal charges.

A first charge-storage region 38a and a second charge-storage region 38b are provided at both ends of the longer lateral direction (charge-transfer direction) of the charge-transfer path illustrated in the plan view of FIG. 10, respectively. In FIG. 10, a first charge-readout region 36a is disposed still further to the left of the first charge-storage region 38a on the left, through a first transfer electrode 48a. On the other hand, in FIG. 10, a second charge-readout region 36b is disposed still further to the right of the second charge-storage region 38b on the right, through a second transfer electrode 48b.

As illustrated in the cross-sectional view of FIG. 11(a), the semiconductor region (34 and 35) illustrated in FIG. 10 encompasses an active-area formation layer 32 implemented by a semiconductor layer of first conductivity type (p-type) and a surface buried region 34 of second conductivity type (n-type) formed on a part of upper portion of the active-area formation layer 32. Then, electrons, which are the majority carriers in the surface buried region 34, are transferred as the signal charges through the surface buried region 34. In contact with the surface of the surface buried region 34 serving as the charge-transfer path, a pinning layer 35 of first conductivity type (p-type) is laminated. Thus, actually, the semiconductor region (34 and 35) of the semiconductor element pertaining to the third embodiment is stacked as triple-level layers. Hence, in the explanation of the third embodiment, hereafter, the semiconductor region (34 and 35) is represented as the semiconductor region (32, 34 and 35).

Although the cross-sectional views of FIG. 11(a) illustrate an example of the structure in which the active-area formation layer 32 is grown on the semiconductor substrate 31 of first conductivity type (p-type) by epitaxial growth and the like, the active-area formation layer 32 may be formed on the semiconductor substrate 31 of second conductivity type (n-type). In the pinning layer 35, the density of holes, which are the opposite-conductivity type carriers to the signal charges is altered with the change in depleted potential in the charge-transfer path, by the variation of voltages applied to the first field-control electrodes 42a and 42b and the second field-control electrodes 43a and 43b.

Although the insulating film 41 is not illustrated in the plan view of FIG. 10, as illustrated in the cross-sectional view of FIG. 11(a), the pair of first field-control electrodes 42a and 42b can be understood to be laminated on the semiconductor region (32, 34 and 35), along the direction orthogonal to the transfer direction of the signal charges, so as to sandwich the surface buried region 34 serving as the charge-transfer path in between, via the insulating film 41. Also, although the illustration of the cross-sectional structure on the side of the second field-control electrodes 43a and 43b are omitted, similarly to the cross-sectional view of FIG. 11(a), the pair of second field-control electrodes 43a and 43b are also laminated on the semiconductor region (32, 34 and 35) via the insulating film 41, so as to sandwich the surface buried region 34 serving as the charge-transfer path in between.

In the plan view of FIG. 10, since an aperture is shown by a rectangular chain-dotted line, as illustrated in the cross-sectional view of FIG. 11(a), in such a way that the light is selectively irradiated to a part of the charge-transfer path, the shield plate 51 having the rectangular aperture is placed above the pair of first field-control electrodes 42a and 42b. In the plan view of FIG. 10, a part of the active-area formation layer 32 of first conductivity type (p-type) located just below the inside area of the aperture represented by the rectangular chain-dotted line and a part of the surface buried region 34 of second conductivity type (n-type) implement a buried-photodiode region. In FIG. 10, the first field-control electrodes 42a and 42b and the second field-control electrodes 43a and 43b are arranged so as to surround the buried-photodiode region serving as the light receiving area just below the aperture. Then, by changing the potentials applied to the first field-control electrodes 42a and 42b and the second field-control electrodes 43a and 43b, it is possible to alter the depleted potential of the surface buried region 34.

As illustrated in FIG. 10, the first field-control electrodes 42a and 42b and the second field-control electrodes 43a and 43b are provided so that the field-control voltages which differ from each other can be applied to the first field-control electrodes 42a and 42b and the second field-control electrodes 43a and 43b. Thus, it is possible to realize the charge-modulation element in which, with the light irradiated to the opening (aperture) of the shield plate 51, the carriers (electrons) generated in the buried-photodiode region defined in a part of the charge-transfer path can move at high speed along the longer lateral direction, by the field-control voltages applied to the first field-control electrodes 42a and 42b and the second field-control electrodes 43a and 43b, and the architecture that the above charge-modulation element can be realized is similar to the architecture of the semiconductor element pertaining to first embodiment.

Hereafter, while focusing to the first field-control electrodes 42a and 42b illustrated in FIG. 10 and FIG. 11(a), we explain them for convenience. FIG. 11(b) illustrates the change in the potential profile at lower edge (bottom) of conduction band, measured along the IQ-IQ direction in the horizontal direction in the cross-sectional view of FIG. 11(a), which is caused by the voltage applied to the first field-control electrodes 42a and 42b, and FIG. 11(c) illustrates the change in the potential profile of the upper edge (top) of valence band, measured along the IIIQ-IIIQ direction in the horizontal direction in the cross-sectional view of FIG. 11(a), which is caused by the voltage applied to the first field-control electrodes 42a and 42b. In FIG. 11(b) and FIG. 11(c), the potential profile with respect to the voltage of the first potential level is illustrated by dashed line, and the potential profile with respect to the voltage of the second potential level that is greater than the first potential level is illustrated by thin solid line, and the potential profile with respect to the voltage of a the third potential level that is much greater than the voltage of the second potential level is illustrated by thick solid line. In FIG. 11, as the voltages applied to the first field-control electrodes 42a and 42b and the second field-control electrodes 43a and 43b, the voltage of the first potential level is assumed to be −2 volts, and the voltage of the second potential level is assumed to be 1 volt, and the voltage of the third potential level is assumed to be 3 volts.

As illustrated in FIG. 11(c), when a low or negative voltage (a voltage of the first potential level) is applied to the first field-control electrodes 42a and 42b, the potential well with respect to holes in the potential profile of the upper edge (top) of valence band is deep as illustrated by dashed line of FIG. 11(c), and holes are consequently accumulated in the pinning layer. However, when a high voltage (a voltage of the second potential level) is applied to the first field-control electrodes 42a and 42b, the potential well with respect to holes is shallow as illustrated by thin solid line of FIG. 11(c), and holes are consequently depleted. When a higher voltage of the third potential level is applied, the potential well with respect to holes becomes further shallower as illustrated by thick solid line of FIG. 11(c). On the other hand, as illustrated in FIG. 11(b), when each of the first field-control electrodes 42a and 42b has the voltage of the first potential level or the voltage of the second potential level, the depleted potential of a center is changed in a situation in which the barriers along the transverse directions in the potential profile at lower edge (bottom) of conduction band is still kept to be created. When the voltage of the third potential level is applied, the barriers along the transverse directions disappear, and the charges are extracted to the first charge-extraction regions 37a and 37b.

As mentioned above, while focusing to the first field-control electrodes 42a and 42b, we explain the operation of the semiconductor element pertaining to the third embodiment, for convenience, by applying voltages to the second field-control electrodes 43a and 43b along an IR-IR direction (IIIR-IIIR direction) in FIG. 10, on the sides of the second field-control electrodes 43a and 43b, the potential profile at lower edge (bottom) of conduction band varies similarly to FIG. 11(b), and the potential profile of the upper edge (top) of valence band varies similarly to FIG. 11(c). That is, although the illustration is omitted, for the second field-control electrodes 43a and 43b, it is possible to realize the potential profile similar to those illustrated in FIG. 11(b) and FIG. 11(c). Thus, the explanation perfectly similar to the case of the first field-control electrodes 42a and 42b is established. Hence, when the second field-control electrodes 43a and 43b are applied with voltages of the first potential level or the voltage of the second potential level, the depleted potential at center is altered, while the barriers along the transverse directions are still kept to be created, and when a voltage of the third potential level is applied, the barriers along the transverse directions disappear, and the charges are consequently extracted to the second charge-extraction regions 37c and 37d.

In this way, in the semiconductor element pertaining to the third embodiment, because the voltage of the third potential level higher than the first or second potential level for controlling the movement of the signal charges is applied to the first field-control electrodes 42a and 42b and the second field-control electrodes 43a and 43b. The signal charges can be extracted to the first charge-extraction regions 37a and 37b and the second charge-extraction regions 37c and 37d. That is, in accordance with the timing chart illustrated in FIG. 12, by applying the gate voltages, whose levels differ from each other, to the first field-control electrodes 42a and 42b and the second field-control electrodes 43a and 43b, it is possible to create the potential inclinations illustrated in FIG. 11(b) and FIG. 11(c). Then, when the first field-control electrodes 42a and 42b=1 volt and the second field-control electrodes 43a and 43b=−2 volts, the generated photo electrons are transferred to the first charge-storage region 38a on the left. When the first field-control electrodes 42a and 42b=−2 volts and the second field-control electrodes 43a and 43b=1 volt, the generated photo electrons are transferred to the second charge-storage region 38b on the right. When the first field-control electrodes 42a and 42b=3 volts and the second field-control electrodes 43a and 43b=3 volts, the generated photo electrons are extracted to the first charge-extraction regions 37a and 37b and the second charge-extraction regions 37c and 37d.

Figure 12:
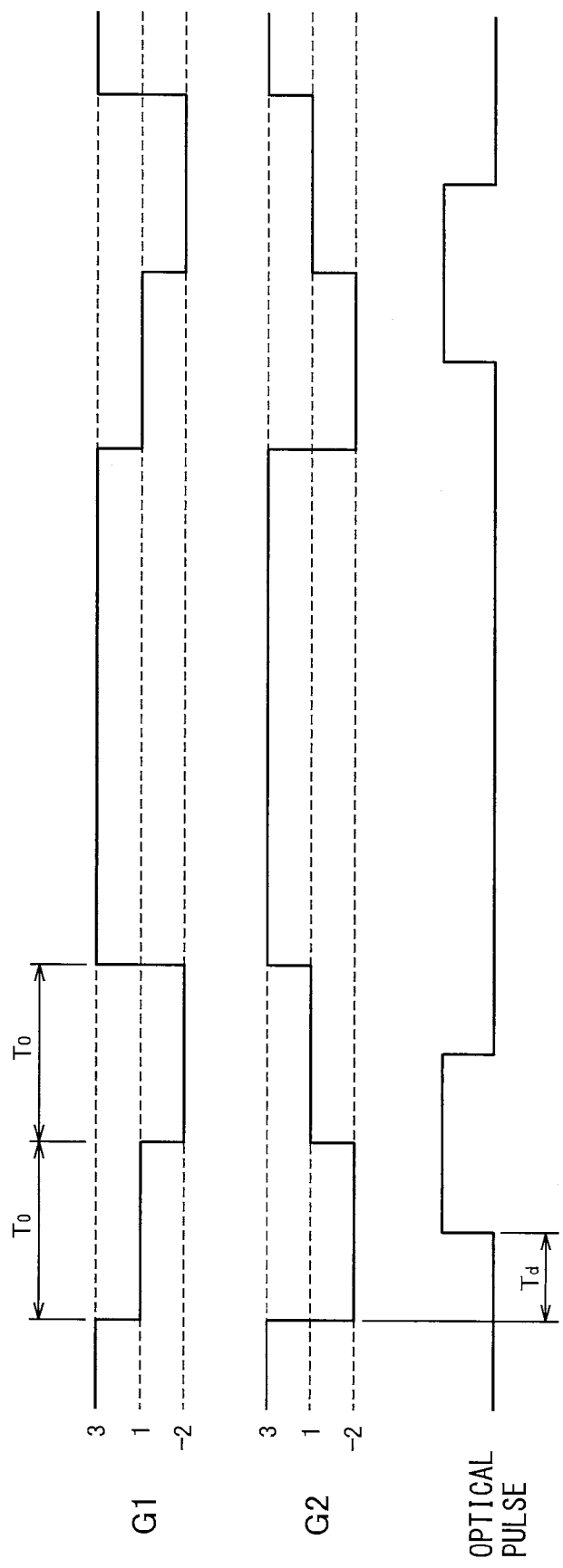
FIG. 12 is a timing chart that explains an operation of the semiconductor element pertaining to the third embodiment.

The foregoing operations are periodically repeated, and optical pulses modulated with short duty cycle are received at timing as illustrated in FIG. 12. At this time, if an amplitude of optical current generated by received optical pulse, after N repetitions of cycles, is defined as $I_{ph}$, a pulse width of the voltage of the first or second potential level applied to the first field-control electrodes 42a and 42b and the second field-control electrodes 43a and 43b is defined as $T_0$, and a delay time of the optical pulse is defined as $T_d$, charge quantity $Q_1$ stored in the second charge-storage region 38b on the right and charge quantity $Q_2$ stored in the first charge-storage region 38a on the right are given by:

$$Q_1 = I_{ph}(T_0 - T_d) \tag{3}$$

$$Q_2 = I_{ph} T_d \tag{4}$$

From Eqs. (3) and (4), the delay time $T_d$ of the optical pulse can be determined as a ratio between the charges, from the following equation:

$$T_d = T_0 Q_1 / (Q_1 + Q_2) \tag{5}$$

After multiplying light velocity by the half of the delay time $T_d$, a distance L to be determined can be calculated, because the round trip time of the optical pulse is known from the delay time $T_d$ through Eq. (5).

As mentioned above, according to the semiconductor element pertaining to the third embodiment, the signal charges can be transferred to the first charge-storage region 38a and the second charge-storage region 38b at high speed and/or can be extracted to the first charge-extraction regions 37a and 37b and the second charge-extraction regions 37c and 37d at high speed. Since the transfer-control signals TX(i) are given to the first transfer electrode 48a, the signal charges stored in the first charge-storage region 38a are transferred to the first charge-readout region 36a. Similarly, since the transfer-control signals TX(i) are given to the second transfer electrode 48b, the signal charges stored in the second charge-storage region 38b are transferred to the second charge-readout region 36b.

Although the illustration is omitted, similarly to the circuit topology illustrated in FIG. 3(a), because the gate electrode of the first signal-readout transistor (amplification transistor) $TA_{ija}$ is connected to the first charge-readout region 36a, with the voltage corresponding to the charge quantity transferred to the first charge-readout region 36a, an output amplified by the first signal-readout transistor (amplification transistor) $TA_{ija}$ is delivered through the first switching transistor $TS_{ija}$ to the outside. Similarly, because the gate electrode of the second signal-readout transistor (amplification transistor) $TA_{ijb}$ is connected to the second charge-readout region 36b, with the voltage corresponding to the charge quantity transferred to the second charge-readout region 36b, an output amplified by the second signal-readout transistor (amplification transistor) $TA_{ijb}$ is delivered through the second switching transistor $TS_{ijb}$ to the outside.

Fourth Embodiment

Figure 13:
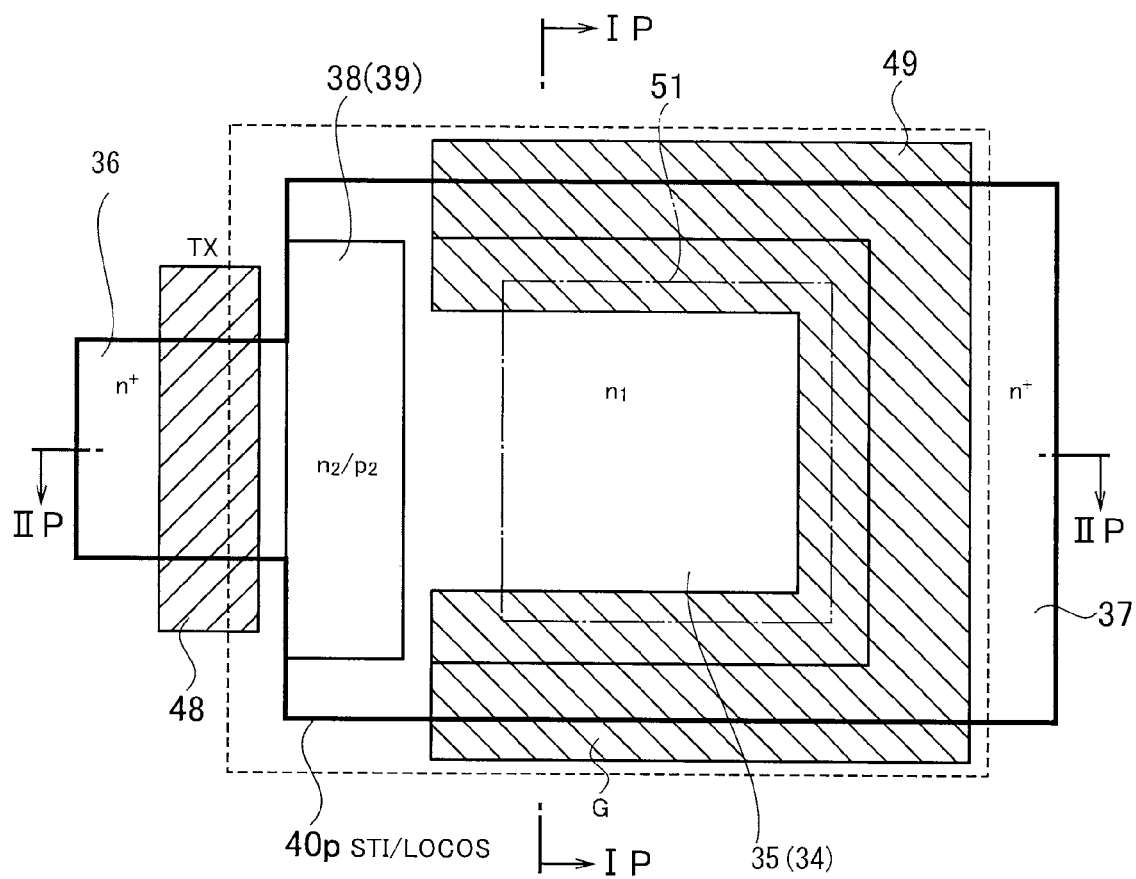
FIG. 13 is a schematic plan view illustrating a gross outline of a layout on a semiconductor chip in a semiconductor element pertaining to a fourth embodiment in the present invention.

As illustrated in FIG. 13, a semiconductor element pertaining to a fourth embodiment of the present invention encompasses a charge-transfer path, which is defined in a semiconductor region (34 and 35) and through which the signal charges are transferred, and a field-control electrode 49 formed into squared C-shape, and the field-control electrode 49 is laminated via an insulating film (whose illustration is omitted) on the semiconductor region (34 and 35) so as to sandwich the charge-transfer path in between, in a planar pattern, along the direction orthogonal to the transfer direction of the signal charges. In FIG. 13, a belt-like area, an area sandwiched by branched patterns of the C-shaped portion at upper and lower sides, or an area surrounded by the square-shaped portion without one line at left side, of the field-control electrode 49, assigns its left to right direction as the longer lateral direction (charge-transfer direction), and the longer lateral direction is referred as "the charge-transfer path" in the semiconductor region (34 and 35). Since the field-control voltage is applied to the field-control electrode 49 and then the depleted potential in the charge-transfer path is changed between the branched patterns of the C-shape, the movement of the signal charges transferring in the semiconductor region (34 and 35) is controlled.

A charge-storage region 38 is provided at the left end in the longer lateral direction of the charge-transfer path illustrated in the plan view of FIG. 13. In FIG. 13, the charge-readout region 36 is disposed still further to the left of the charge-storage region 38 on the left, through the transfer electrode 48. On the other hand, in FIG. 13, the charge-extraction region 37 is arranged on the right, disposed in the outside of the C-shaped field-control electrode 49.

Figure 14:
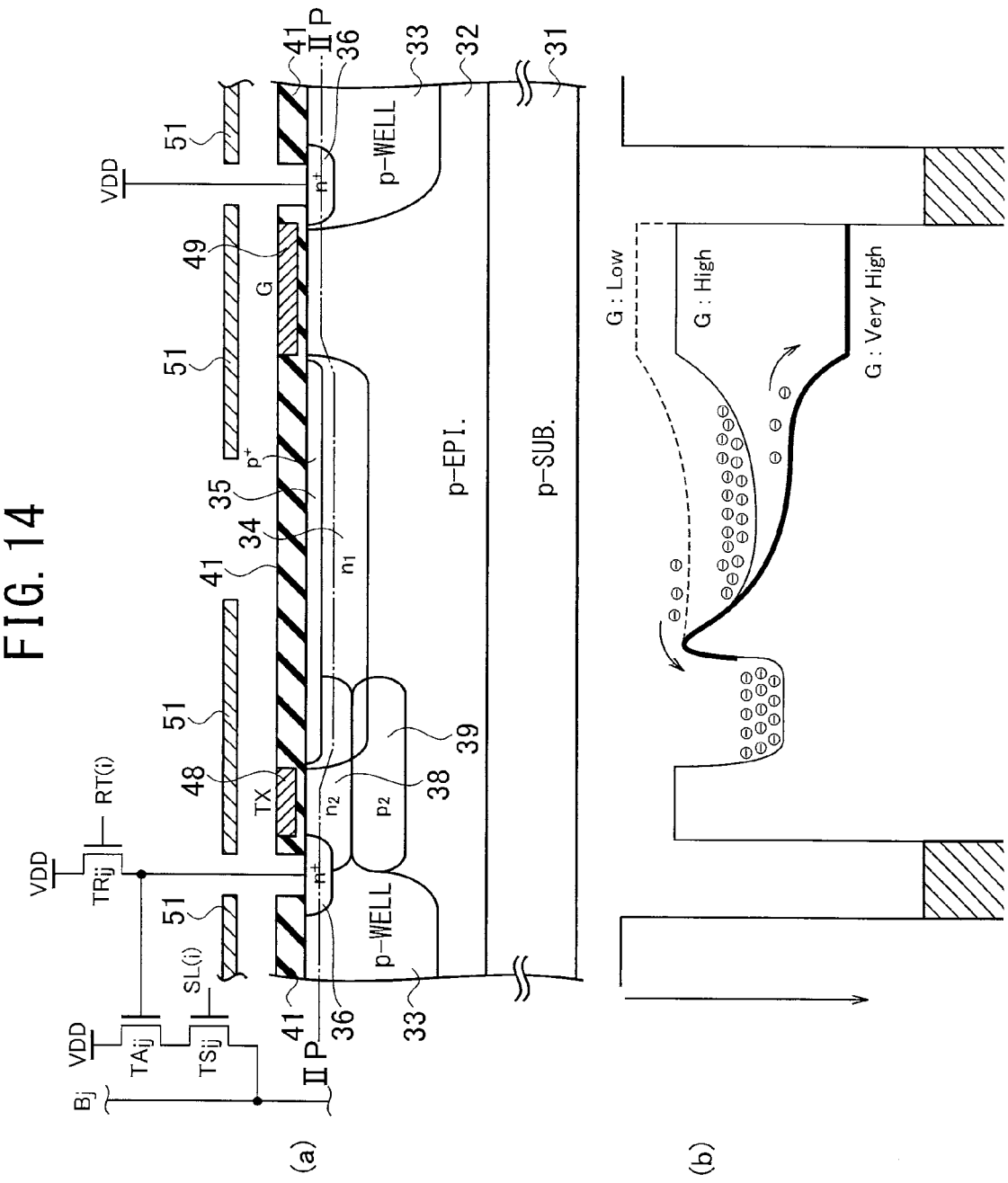
FIG. 14(a) is a schematic cross-sectional view explaining an adumbrative structure of the semiconductor element pertaining to the fourth embodiment, taken on line IIP-IIP in FIG. 13.
FIG. 14(b) is a view illustrating a potential profile of a lower edge (bottom) of a corresponding conduction band in the cross-sectional view in FIG. 14 (a), with voltages applied to a field-control electrode as a parameter.

As illustrated in the cross-sectional view of FIG. 14(a), the semiconductor region (34 and 35) illustrated in FIG. 13 encompasses an active-area formation layer 32 implemented by a semiconductor layer of first conductivity type (p-type) and a surface buried region 34 of second conductivity type (n-type) formed on a part of upper portion of the active-area formation layer 32. Then, electrons, which are the majority carriers in the surface buried region 34, are transferred as the signal charges through the surface buried region 34 toward the charge-storage region 38. In contact with the surface of the surface buried region 34 serving as the charge-transfer path, a pinning layer 35 of first conductivity type (p-type) is laminated. Thus, actually, the semiconductor region (34 and 35) of the semiconductor element pertaining to the third embodiment has the triple-level structure.

Thus, in the explanation of the fourth embodiment, hereafter, although the semiconductor region (34 and 35) is represented as the semiconductor region (32, 34 and 35), the semiconductor region (32, 34 and 35) of the semiconductor element pertaining to the fourth embodiment actually contains the active-area formation layer 32 of first conductivity type (p-type), the surface buried region 34 of second conductivity type (n-type) formed on a part of upper portion of the active-area formation layer 32, and the pinning layer 35 of first conductivity type (p-type) formed in contact with the surface of the surface buried region 34. Although the cross-sectional view of FIG. 14(a) exemplifies a structure in which the active-area formation layer 32 is grown on the semiconductor substrate 31 of first conductivity type (p-type) by epitaxial growth and the like, the active-area formation layer 32 may be formed on the semiconductor substrate 31 of second conductivity type (n-type). In the pinning layer 35, the density of holes, which are the opposite-conductivity type carriers to the signal charges, is altered by the change in depleted potential in the charge-transfer path and the voltages applied to the field-control electrode 49.

Although the insulating film 41 is not illustrated in the plan view of FIG. 13, as illustrated in the cross-sectional view of FIG. 14(a), the field-control electrode 49, which is formed into C-shape, is understood to be laminated on the semiconductor region (32, 34 and 35), via the insulating film 41.

Although the plan view of FIG. 13 illustrates the aperture by rectangular chain-dotted line, as illustrated in the cross-sectional view of FIG. 14(a), in such a way that the light is selectively irradiated to a part of the charge-transfer path, the shield plate 51 having the rectangular aperture is placed above the C-shaped field-control electrode 49. In the plan view of FIG. 13, the part of the active-area formation layer 32 of first conductivity type (p-type) located just below the inside area of the aperture represented by the rectangular chain-dotted line and the part of the surface buried region 34 of second conductivity type (n-type) implement the buried-photodiode region. In FIG. 13, the C-shaped field-control electrode 49 is arranged so as to surround the three sides of the buried-photodiode region serving as a light receiving area just below the aperture. Then, by changing the potentials applied to the field-control electrode 49, it is possible to alter the depleted potential of the surface buried region 34.

Although the potential profile is susceptible to an area-size of the aperture and impurity concentrations of the surface buried region 34 and the p+ pinning layer 35 at the surface, when a low or a negative voltage (voltage of the first potential level) is applied to the field-control electrode 49, the potential well with respect to electrons becomes shallow as illustrated by dashed line of FIG. 14(b), and when the high voltage (voltage of the second potential level) is applied to the field-control electrode 49, the potential well with respect to electrons becomes deep as illustrated by thin solid line of FIG. 14(b).

In the semiconductor element pertaining to the fourth embodiment, in the transfer direction, the region with deep potential well is crated as the charge-storage region 38, as illustrated in FIG. 13 and FIG. 14(a). Thus, when the negative voltage (voltage of the first potential level) is applied to the field-control electrode 49, electrons in the buried-photodiode region are transferred to the charge-storage region 38. On the other hand, when the high voltage (voltage of the second potential level) is applied to the field-control electrode 49, because the potential well is crated and a potential barrier is established against the charge-storage region 38, the photo electrons generated in the buried-photodiode region are held and stored in the inside of the diode. Moreover, as illustrated by thick solid line of FIG. 14(b), when a very high voltage (voltage of the third potential level) is applied to the field-control electrode 49, electrons stored in the buried-photodiode region are extracted to the charge-extraction region 37 arranged in the right direction.

As illustrated in FIG. 14(a), a gate electrode of a signal-readout transistor (amplification transistor) $TA_{ij}$ is connected to the charge-readout region 36 through a contact window cut in the insulating film 41. A drain electrode of the signal-readout transistor (amplification transistor) $TA_{ij}$ is connected to the power supply VDD, and a source electrode is connected to a drain electrode of a switching transistor $TS_{ij}$ for pixel selection. A source electrode of the switching transistor $TS_{ij}$ for the pixel selection is connected to a vertical signal line $B_j$, and a control signals SL(i) for selecting a horizontal line is given to a gate electrode of the switching transistor $TS_{ij}$, for example, from a circuit that has a function similar to the vertical shift register 13 illustrated in FIG. 5. When the control signals SL(i) for selection is set to high (H) level, the switching transistor $TS_{ij}$ is turned on, and a current corresponding to a potential of the charge-readout region 36, which is amplified by the signal-readout transistor $TA_{ija}$, is flowed to the vertical signal line $B_{jb}$.

Moreover, a source electrode of a reset transistor $TR_{ij}$ is connected to the charge-readout region 36. A drain electrode of the reset transistor $TR_{ij}$ is connected to the power supply VDD, and a reset signal RT(i) is given to a gate electrode of the reset transistor $TR_{ij}$, from the circuit that has the function similar to the vertical shift register 13 illustrated in FIG. 5. When the reset signal RT(i) is set to high (H) level, the reset transistor $TR_{ij}$ discharges the charges stored in the charge-readout region 36. Then, the charge-readout region 36 is reset. The transfer-control signal TX(i) is given to a transfer electrode 48 illustrated in FIG. 14(a), from the circuit that has the function similar to the vertical shift register 13 illustrated in FIG. 5. Thus, the signal charges stored in the charge-storage region 38 are transferred to the charge-readout region 36. As illustrated in FIG. 14(a), the gate electrode of the signal-readout transistor (amplification transistor) $TA_{ij}$ is connected to the charge-readout region 36. Hence, with the voltage corresponding to the charge quantity transferred to the charge-readout region 36, an output amplified by the signal-readout transistor (amplification transistor) $TA_{ij}$ is delivered through a switching transistor $TS_{ij}$ to the outside.

In this way, on the basis of the level of the field-control voltage applied to the field-control electrodes 49 which are formed on three sides around the buried-photodiode region and each of which has squared C-shape, it is possible to control the transfer of the carriers from the buried-photodiode region, the storage and extraction of carriers. At this time in order that the depleted potential of the buried-photodiode region is greatly changed by the field-control voltage of the field-control electrode 49, it is important to speculate an appropriate value of impurity concentration of holes in the p+ pinning layer 35 at the surface. That is, in the potential profile that is measured along a IIP-IIP direction along the horizontal direction in the cross-sectional view of FIG. 14(a), in order to increase the depth $\Delta V_{well}$ of the potential well at lower edge of conduction band similar to those illustrated in FIG. 2(b) and FIG. 11(b), in particular, the potential of the center in the potential profile of the upper edge of the valence band is required to be greatly changed, similarly to those illustrated in FIG. 2(c) and FIG. 11(c).

In short, when a field-control voltage of low or low negative voltage (voltage of the first potential level) is applied to the field-control electrode 49, the hole density of the p+ pinning layer 35 at the surface is set similar to the impurity concentration of the acceptors, which substantially implements p+ pinning layer 35 in potential well at the center, as illustrated in FIG. 11(c), when a field-control voltage of the third potential level that is higher than the voltage of the first or second potential level, configured to control the movement of the signal charges, is applied to the field-control electrode 49, because the hole density inside the p+ pinning layer 35 is decreased so as to establish a depleted state, the potential increases. However, in a case that the impurity concentration of the p+ pinning layer 35 at the surface is very high (for example, the impurity concentration of $10^{19}$ cm$^{-3}$ or more), because the buried-photodiode region will never be depleted, the potential of the p+ pinning layer 35 at center is substantially fixed to the substrate potential, even if the level of the field-control voltage applied to the field-control electrode 49 is changed. In such a case, the change in the $\Delta V_{well}$ remain small.

On the other hand, the impurity concentration of the p+ pinning layer 35 at the surface is desired to be set as high as possible in order to reduce the dark current in the buried-photodiode region. As described in the semiconductor element pertaining to the first embodiment, in order to achieve both of low dark current and a large change in the depleted potential induced by the field-control electrode 49, it is necessary to optimally select the hole density of the p+ pinning layer 35 at the surface. The optimal value of the hole density is considered to be approximately between the smaller half of the order of $10^{18}$ cm$^{-3}$ and the larger half of the order of $10^{17}$ cm$^{-3}$ orders.

Also, because the change in the depleted potential depends on the thickness of the p+ pinning layer 35, the thickness of the p+ pinning layer 35 is desired to be about 0.1 micrometer at surface. The design of the thickness of the p+ pinning layer 35 depends on whether or not the carrier concentration inside the p+ pinning layer 35 can be largely altered by the change in the field-control voltage applied to the field-control electrode 49, which is formed into C-shape.

Because the p+ pinning layer 35 is disposed in an area neighboring to the silicon region just below the C-shaped field-control electrode 49, although the C-shaped field-control electrode 49 cannot directly control the hole density of the p+ pinning layer 35, if the C-shaped field-control electrode 49 has a capability of changing the hole density of the p+ pinning layer 35, it is possible to change the impurity concentration of the p+ pinning layer 35 located adjacently to the field-control electrode 49. Hence, depending on a condition, it is possible to deplete the p+ pinning layer 35.

Fifth Embodiment

Figure 15:
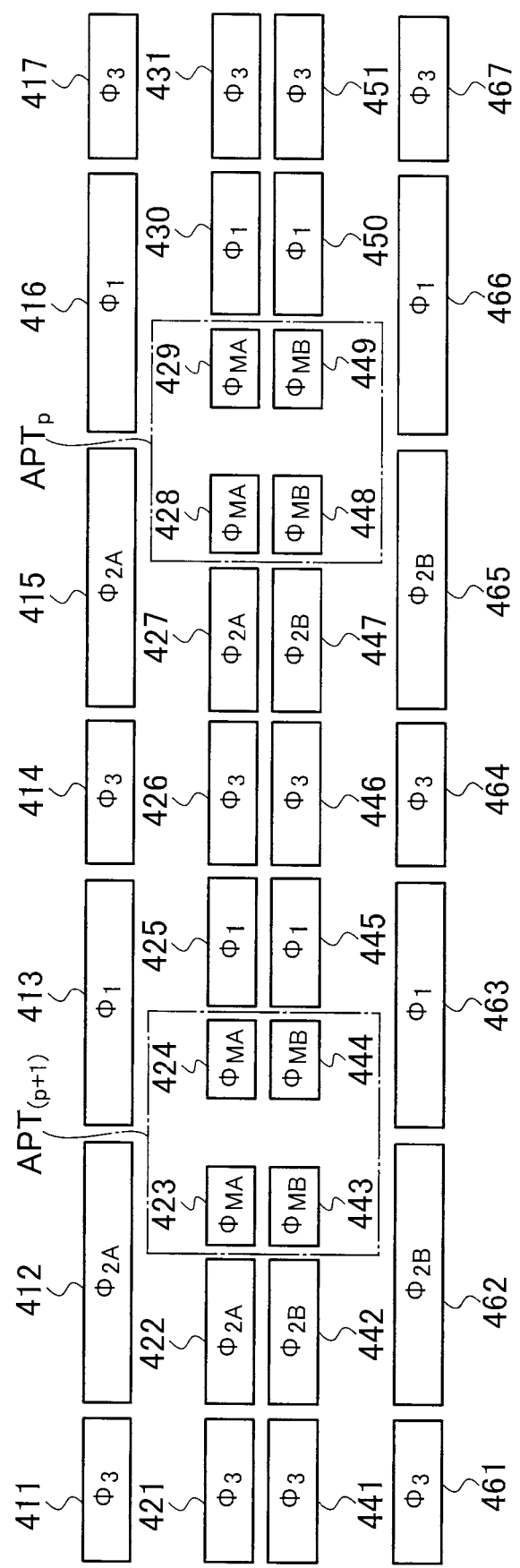
FIG. 15 is a schematic plan view explaining a gross outline of a layout on a semiconductor chip in a semiconductor element pertaining to a fifth embodiment in the present invention.

As illustrated in a plan view of FIG. 15, a semiconductor element pertaining to a fifth embodiment of the present invention encompasses a main charge-transfer path, which is defined in a semiconductor region and through which signal charges are transferred, a pair of third field-control electrodes 411 and 461 in rear stage ((p+1)$^{th}$ stage) arrayed on left ends, via an insulating film (whose illustration is omitted, but as to cross-sectional structure, see FIG. 2(a) and FIG. 3(a)) in the first embodiment) on the semiconductor region so as to sandwich the main charge-transfer path in the planar pattern, along a direction orthogonal to a main transfer direction in which the signal charges are transferred along the main charge-transfer path, a pair of second field-control electrodes 412 and 462 in (p+1)$^{th}$ stage, which are arranged separately from and adjacently to the third field-control electrodes 411 and 461 in (p+1)$^{th}$ stage, respectively, toward the right direction and laminated via the insulating film on the semiconductor region, so as to sandwich the main charge-transfer path in the planar pattern, along the direction orthogonal to the main transfer direction, and a pair of first field-control electrodes 413 and 463 in (p+1)$^{th}$ stage, which are laminated via the insulating film on the semiconductor region, so as to sandwich the main charge-transfer path in the planar pattern, along the direction orthogonal to the main transfer direction, separately from the second field-control electrodes 412 and 462 in (p+1)$^{th}$ stage, respectively, toward the right direction.

Moreover, the semiconductor element pertaining to the fifth embodiment encompasses a pair of third field-control electrodes 414 and 464 in the front stage (p$^{th}$ stage), which are laminated via the insulating film on the semiconductor region, so as to sandwich the main charge-transfer path in the planar pattern, along the direction orthogonal to the main transfer direction, separately from the first field-control electrodes 413 and 463 in (p+1)$^{th}$ stage, respectively, toward the right direction, a pair of second field-control electrodes 415 and 465 in p$^{th}$ stage, which are laminated via the insulating film on the semiconductor region, so as to sandwich the main charge-transfer path in the planar pattern, along the direction orthogonal to the main transfer direction, and separately from the third field-control electrodes 414 and 464 in $p^{th}$ stage, respectively, toward the right direction, a pair of first field-control electrodes 416 and 466 in $p^{th}$ stage, which are laminated via the insulating film on the semiconductor region, so as to sandwich the main charge-transfer path in the planar pattern, along the direction orthogonal to the main transfer direction, and separately from the second field-control electrodes 415 and 465 in $p^{th}$ stage, respectively, toward the right direction, and a pair of third field-control electrodes 417 and 467 in the further front stage ($(p-1)^{th}$ stage), located still further to the front stage, which are laminated via the insulating film on the semiconductor region, so as to sandwich the main charge-transfer path in the planar pattern, along the direction orthogonal to the main transfer direction, and separately from the first field-control electrodes 416 and 466 in $p^{th}$ stage, respectively, toward the right direction.

Moreover, in the center of the main charge-transfer path defined between the arrays of the pair of third field-control electrodes 411 and 461 in $p^{th}$ stage, second field-control electrodes 412 and 462 in $(p+1)^{th}$ stage, first field-control electrodes 413 and 463 in $(p+1)^{th}$ stage, the third field-control electrodes 414 and 464 in $p^{th}$ stage, second field-control electrodes 415 and 465 in $p^{th}$ stage, first field-control electrodes 416 and 466 in $p^{th}$ stage and the third field-control electrodes 417 and 467 in $(p-1)^{th}$ stage, so as to implement a central divider, a pair of third auxiliary electrodes 421 and 441 in $(p+1)^{th}$ stage, second auxiliary electrodes 422 and 442 in $(p+1)^{th}$ stage, first auxiliary electrodes 425 and 445 in $(p+1)^{th}$ stage, the third auxiliary electrodes 426 and 446 in $p^{th}$ stage, second auxiliary electrodes 427 and 447 in $p^{th}$ stage, first auxiliary electrodes 430 and 450 in $p^{th}$ stage, and the third auxiliary electrodes 431 and 451 in $(p-1)^{th}$ stage are arrayed, and the main charge-transfer path is separated into "a main charge-transfer path at upper lane" and "a main charge-transfer path at lower lane".

Moreover, in the arrays between the pair of second field-control electrodes 412 and 462 in $(p+1)^{th}$ stage, first field-control electrodes 413 and 463 in $(p+1)^{th}$ stage, second field-control electrodes 415 and 465 in $p^{th}$ stage and the first field-control electrodes 416 and 466 in $p^{th}$ stage, a pair of first modulation electrodes 423 and 443 in $(p+1)^{th}$ stage, second modulation electrodes 424 and 444 in $(p+1)^{th}$ stage, first modulation electrodes 428 and 448 in $p^{th}$ stage and second modulation electrodes 429 and 449 in $p^{th}$ stage are provided.

By the way, the first modulation electrodes 423 and 443, the second modulation electrodes 424 and 444, the first modulation electrodes 428 and 448 and the second modulation electrodes 429 and 449 can be re-defined by focusing to a transfer path for charge modulation and carrying out a re-definition similar to the first embodiment so that the $(p+1)^{th}$ stage encompasses a pair of first modulation electrodes 423 and 424 laminated via the insulating film on the semiconductor region, so as to sandwich the transfer path for charge modulation, with respect to the planar pattern, along the main transfer direction, and a pair of second modulation electrodes 443 and 444 which are arranged separately from the first modulation electrodes 423 and 424, respectively, and laminated via the insulating film on the semiconductor region, so as to sandwich the transfer path for charge modulation, with respect to the planar pattern, along the main transfer direction. Similarly, the $p^{th}$ stage encompasses a pair of first modulation electrodes 428 and 429 laminated via the insulating film on the semiconductor region, so as to sandwich the transfer path for charge modulation, with respect to the planar pattern, along the main transfer direction, and a pair of second modulation electrodes 448 and 449 which are arranged separately from the first modulation electrodes 428 and 429, respectively, and laminated via the insulating film on the semiconductor region, so as to sandwich the transfer path for charge modulation, with respect to the planar pattern, along the main transfer direction. However, this re-definition is merely an issue of definition. Thus, the following explanation will be explained in accordance with the original definition.

The third auxiliary electrodes 421 and 441 in $(p+1)^{th}$ stage are disposed in areas being sandwiched between the pair of third field-control electrodes 411 and 461 in $(p+1)^{th}$ stage. The second auxiliary electrodes 422 and 442 in $(p+1)^{th}$ stage are shorter in length, measured along the main transfer path direction, than the second field-control electrodes 412 and 462 in $(p+1)^{th}$ stage, respectively, and disposed in areas being sandwiched between the pair of second field-control electrodes 412 and 462 in $((p+1)^{th}$ stage. The first modulation electrodes 423 and 443 in $(p+1)^{th}$ stage are also shorter in the length, measured along the main transfer path direction, than the second field-control electrodes 412 and 462 in $(p+1)^{th}$ stage, respectively, and disposed in areas being sandwiched between the pair of second field-control electrodes 412 and 462 in $(p+1)^{th}$ stage, adjacently to the right of the second auxiliary electrodes 422 and 442 in $(p+1)^{th}$ stage. The second modulation electrodes 424 and 444 in $(p+1)^{th}$ stage are shorter in the length, measured along the main transfer path direction, than the first field-control electrodes 413 and 463 in $(p+1)^{th}$ stage and disposed in areas being sandwiched between the pair of first field-control electrodes 413 and 463 in $(p+1)^{th}$ stage. The first auxiliary electrodes 425 and 445 in $(p+1)^{th}$ stage are also shorter in the length, measured along the main transfer path direction, than the first field-control electrodes 413 and 463 in $(p+1)^{th}$ stage and disposed in areas being sandwiched between the pair of first field-control electrodes 413 and 463 in $(p+1)^{th}$ stage, adjacently to the right of the second modulation electrodes 424 and 444 in $(p+1)^{th}$ stage.

On the other hand, the third auxiliary electrodes 426 and 446 in $p^{th}$ stage are disposed in areas being sandwiched between the pair of third field-control electrodes 414 and 464 in $p^{th}$ stage. The second auxiliary electrodes 427 and 447 in $p^{th}$ stage are shorter in the length, measured along the main transfer path direction, than the second field-control electrodes 415 and 465 in $p^{th}$ stage and disposed in areas being sandwiched between the pair of second field-control electrodes 415 and 465 in $p^{th}$ stage, respectively. The first modulation electrodes 428 and 448 in $p^{th}$ stage are also shorter in the length, measured along the main transfer path direction, than the second field-control electrodes 415 and 465 in $p^{th}$ stage, respectively, and disposed in areas being sandwiched between the pair of second field-control electrodes 415 and 465 in $p^{th}$ stage, adjacently to the right of the second auxiliary electrodes 427 and 447 in $p^{th}$ stage, respectively. The second modulation electrodes 429 and 449 in $p^{th}$ stage are shorter in the length, measured along the main transfer path direction, than the first field-control electrodes 416 and 466 in $p^{th}$ stage and disposed in areas being sandwiched between the pair of first field-control electrodes 416 and 466 in $p^{th}$ stage, respectively. The first auxiliary electrodes 430 and 450 in $p^{th}$ stage are also shorter in the length, measured along the main transfer path direction, than the first field-control electrodes 416 and 466 in $p^{th}$ stage and disposed in areas being sandwiched between the pair of first field-control electrodes 416 and 466 in $p^{th}$ stage, adjacently to the right of the second modulation electrodes 429 and 449 in $p^{th}$ stage, respectively. Moreover, as shown at the right end of FIG. 15, the third auxiliary electrodes 431 and 451 in $(p-1)^{th}$ stage are disposed in areas being sandwiched between the pair of third field-control electrodes 417 and 467 in $(p-1)^{th}$ stage.

As illustrated in FIG. 15, in the semiconductor element pertaining to the fifth embodiment, a channel of a constant width exists between the first modulation electrode 423 and second modulation electrode 424 in $(p+1)^{th}$ stage and between the first modulation electrode 443 and second modulation electrode 444 in $(p+1)^{th}$ stage which are continuous between the first modulation electrode 423 and the second modulation electrode 424, and "the transfer path for charge modulation in $(p+1)^{th}$ stage" is defined in the direction orthogonal to the main charge-transfer path direction. Also, a channel of a constant width exists between the first modulation electrode 428 and second modulation electrode 429 in $p^{th}$ stage and between the first modulation electrode 448 and second modulation electrode 449 in $p^{th}$ stage which are continuous between the first modulation electrode 428 and the second modulation electrode 429 in $p^{th}$ stage, and "the transfer path for charge modulation in $p^{th}$ stage" is defined in the direction orthogonal to the main charge-transfer path direction.

—Clock Pattern of Fifth Embodiment—

Figure 16:
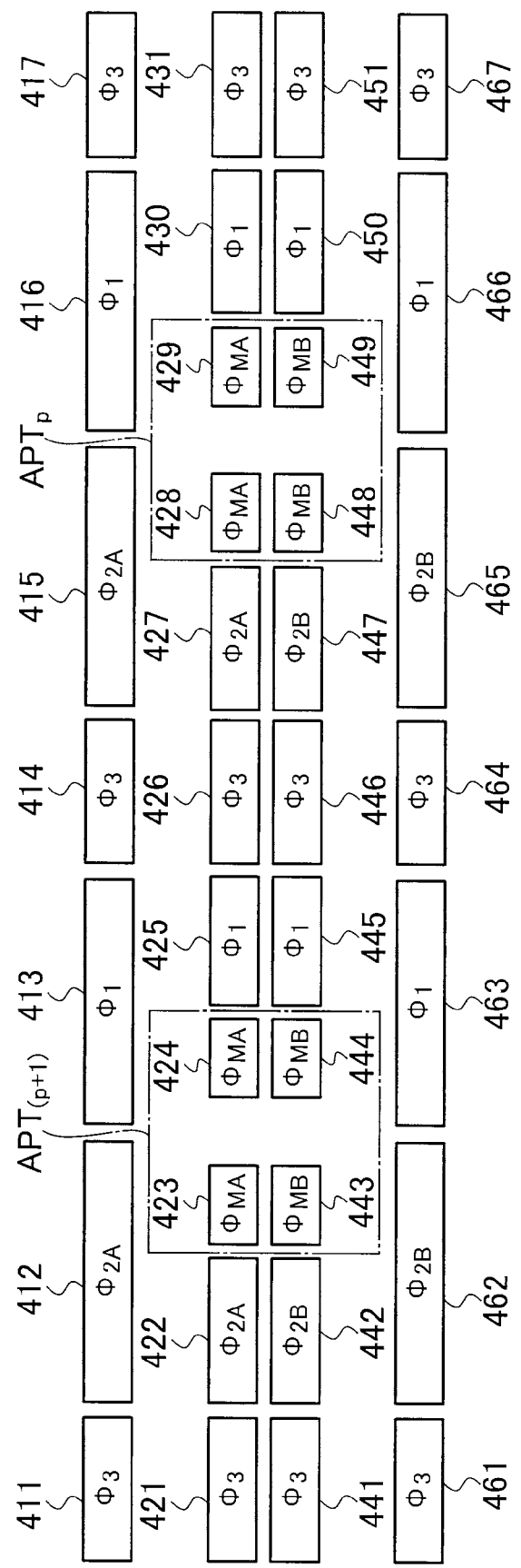
FIG. 16 is a timing chart that explains a clock pattern of each voltage pulse at a three-phase clock, which is necessary for an operation of the semiconductor element pertaining to the fifth embodiment.

In the semiconductor element pertaining to the fifth embodiment of the present invention, in addition to the three-phase clock implemented by a first voltage pulse $\Phi 1$, a second voltage pulse $\Phi 2$ and a third voltage pulse $\Phi 3$ illustrated in FIG. 16, a first charge-modulation voltage pulse $\Phi_{MA}$ and a second charge-modulation voltage pulse $\Phi_{MB}$ are used for charge modulation. Also, the second voltage pulse $\Phi 2$ is divided into a second voltage pulse $\Phi 2A$ for the upper lane and a second voltage pulse $\Phi 2B$ for the lower lane.

That is, the first voltage pulse $\Phi 1$ of a clock pattern illustrated in FIG. 16 is applied to the first field-control electrodes 413 and 463 in $(p+1)^{th}$ stage and the first auxiliary electrodes 425 and 445 in $(p+1)^{th}$ stage. Also, the first voltage pulse $\Phi 1$ of the clock pattern illustrated in FIG. 16 is applied to the first field-control electrodes 416 and 466 in $p^{th}$ stage and the first auxiliary electrodes 430 and 450 in $p^{th}$ stage. Then, the transfers of the signal charges in the main charge-transfer path on the upper lane and the main charge-transfer path on the lower lane are controlled in synchronization with each other.

The second voltage pulse $\Phi 2A$ for the upper lane of the clock pattern illustrated in FIG. 16 is applied to the second field-control electrode 412 in $(p+1)^{th}$ stage and the second auxiliary electrode 422 in $(p+1)^{th}$ stage, and the second voltage pulse $\Phi 2A$ for the upper lane of the clock pattern illustrated in FIG. 16 is also applied to the second field-control electrode 415 in $p^{th}$ stage and the second auxiliary electrode 427 in $p^{th}$ stage. Then, the transfer of the signal charges in the main charge-transfer path on the upper lane is controlled. On the other hand, the second voltage pulse $\Phi 2B$ for the lower lane of the clock pattern illustrated in FIG. 16 is applied to the second auxiliary electrode 442 in $(p+1)^{th}$ stage and the second field-control electrode 462 in $(p+1)^{th}$ stage, and the second voltage pulse $\Phi 2B$ for the lower lane of the clock pattern illustrated in FIG. 16 is also applied to the second auxiliary electrode 447 in $p^{th}$ stage and the second field-control electrode 465 in $p^{th}$ stage. Then, the transfer of the signal charges in the main charge-transfer path on the lower lane is controlled.

Then, a third voltage pulse $\Phi 3$ of the clock pattern illustrated in FIG. 16 is applied to the third field-control electrodes 411 and 461 in $(p+1)^{th}$ stage and the third auxiliary electrodes 421 and 441 in $(p+1)^{th}$ stage, and the third voltage pulse $\Phi 3$ of the clock pattern illustrated in FIG. 16 is also applied to the third field-control electrodes 414 and 464 in $p^{th}$ stage, the third auxiliary electrodes 426 and 446 in $p^{th}$ stage, the third field-control electrodes 417 and 467 in $(p-1)^{th}$ stage and the third auxiliary electrodes 431 and 451 in $(p-1)^{th}$ stage. Then, the transfers of the signal charges in the main charge-transfer path on the upper lane and the main charge-transfer path on the lower lane are controlled in synchronization with each other.

Moreover, the first charge-modulation voltage pulse $\Phi_{MA}$ of the clock pattern illustrated in FIG. 16 is applied to the first modulation electrode 423 and second modulation electrode 424 in the $(p+1)^{th}$ stage and the first modulation electrode 428 and second modulation electrode 429 in the $p^{th}$ stage. On the other hand, the second charge-modulation voltage pulse $\Phi_{MB}$ of the clock pattern illustrated in FIG. 16 is applied to the first modulation electrode 443 and second modulation electrode 444 in the $(p+1)^{th}$ stage and the first modulation electrode 448 and second modulation electrode 499 in the $p^{th}$ stage.

Figure 17:
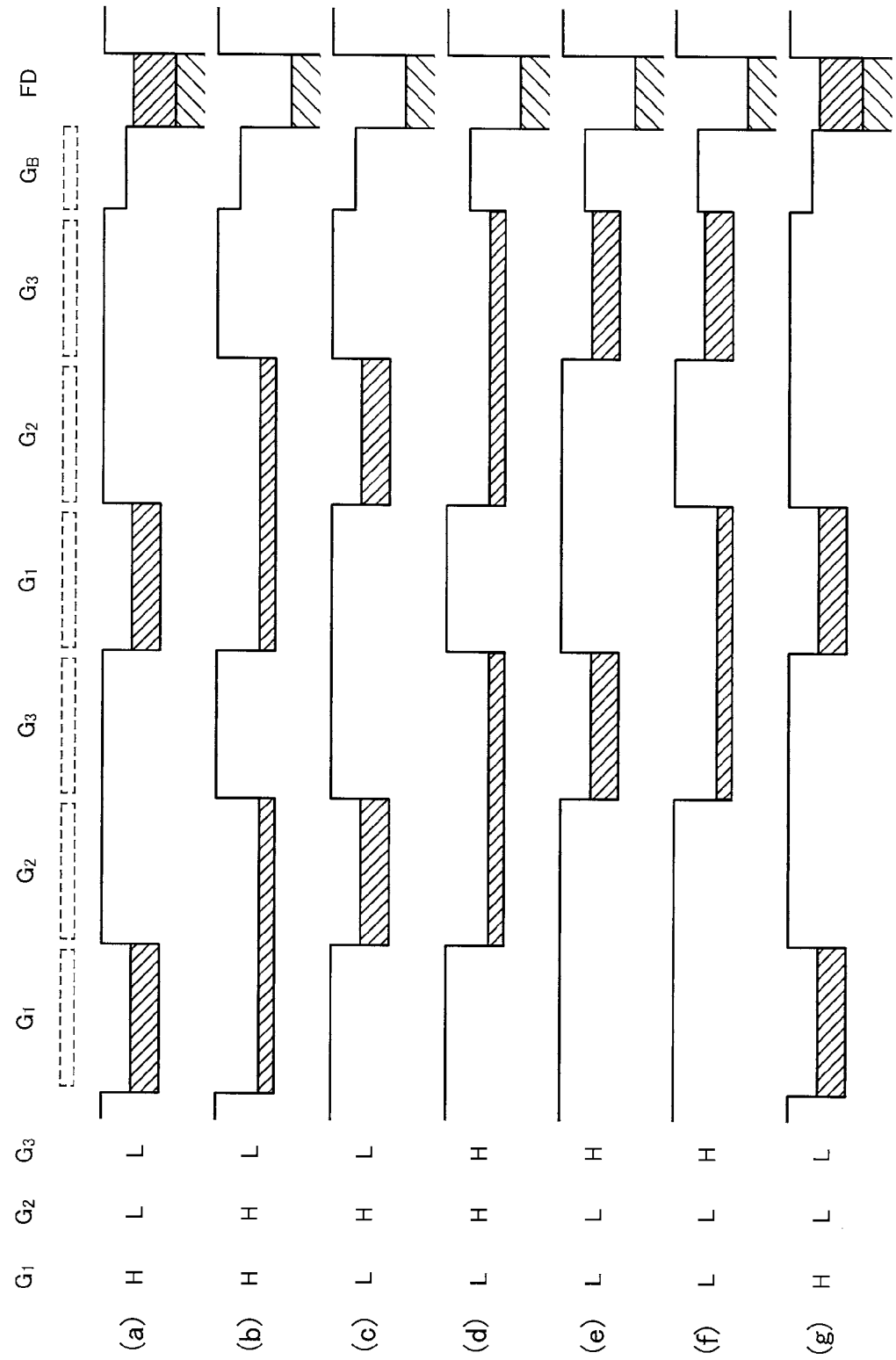
FIG. 17 is a schematic plan view explaining a voltage distribution at a phase of a timing $P_{MA}$ and states of storage positions of signal charges, in order to explain an operation of a charge-modulation mode of the semiconductor element pertaining to the fifth embodiment.
Figure 18:
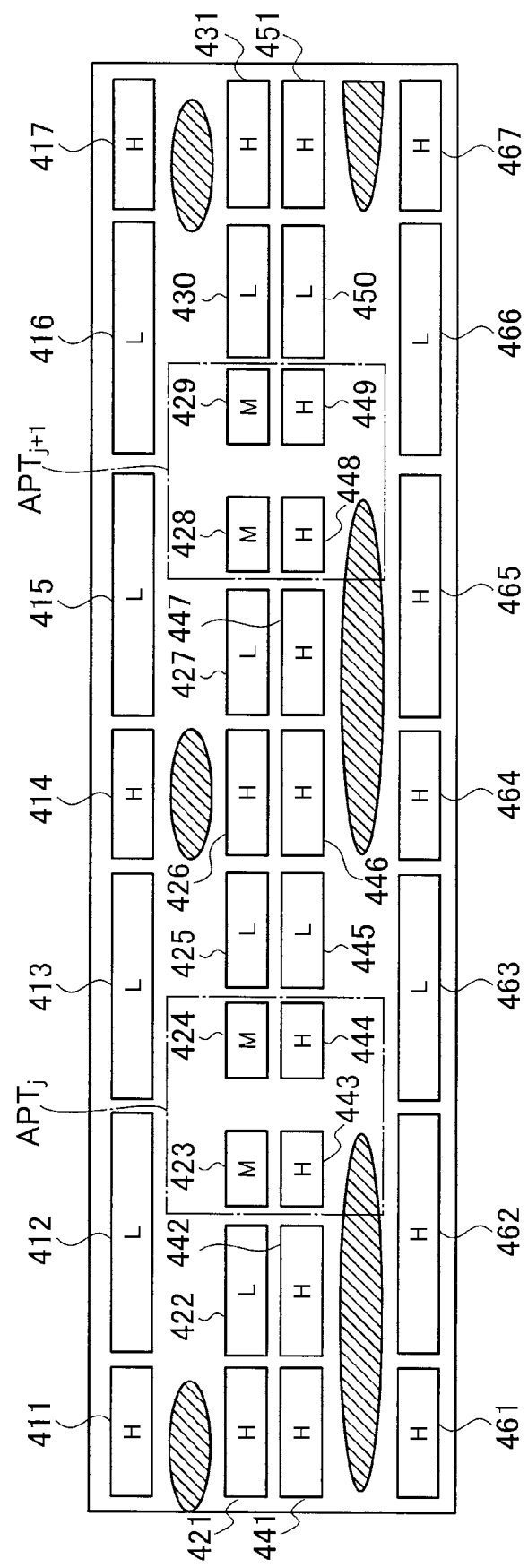
FIG. 18 is a schematic plan view explaining a voltage distribution at a phase of a timing $P_{MB}$ and states of storage positions of signal charges, in order to explain the operation of the charge-modulation mode of the semiconductor element pertaining to the fifth embodiment.

That is, in a period of a charge-modulation mode illustrated in FIG. 16, when the first charge-modulation voltage pulse $\Phi_{MA}$ and the second charge-modulation voltage pulse $\Phi_{MB}$ implement the clock pattern illustrated in FIG. 16, as illustrated in FIG. 17 and FIG. 18, the charges generated by light irradiated through the apertures $APT_p$, $APT_{(p+1)}$, - - - are alternately transferred to each potential well of the main charge-transfer paths on the upper lane and the lower lane. The difference between two charge quantities, ascribable to the overlapping of the optical pulses and the clocks, can be used to obtain the charge quantity, which depends on a light flight time, so that a range measurement can be carried out.

In this way, in the semiconductor element pertaining to the fifth embodiment, since the three-phase charge element is exemplified, in the transfer of the signal charges in the case of the three-phase charge-transfer element, six fractional-parts of period from $P_{T1}$ to $P_{T6}$ illustrated in FIG. 16 are used as the phases of the clock. By the way, in FIG. 16, although the $P_{T1}$ is illustrated to appear at both of the first and final fractional-parts of the charge-transfer period, one of them can be omitted.

—Charge-Modulation Mode—

In the semiconductor element pertaining to the fifth embodiment of the present invention, in the clock pattern illustrated in FIG. 16, signals are given so as to control the charge-modulation mode and the charge-transfer mode. In the period of the charge-modulation mode, as mentioned above, the first charge-modulation voltage pulse $\Phi_{MA}$ and the second charge-modulation voltage pulse $\Phi_{MB}$ are used, and the charges generated by light irradiated through the apertures $APT_p$, $APT_{(p+1)}$, - - - illustrated in FIG. 17 and FIG. 18 are alternately transferred to each potential well of the main charge-transfer paths on the upper lane and the lower lane. Thus, the difference between the two charge quantities, ascribable to the overlapping of the optical pulses and the clock pulses, is used to obtain the charge quantity, which depends on the light flight time, so that the range measurement can be carried out.

As illustrated in a plan view of FIG. 15, in such a way that the light is selectively irradiated to a part of the main charge-transfer path, a shield plate that has a rectangular aperture $APT_{(p+1)}$ in the $(p+1)^{th}$ stage illustrated by chain-dotted line is placed above the pair of first modulation electrodes 423 and 443 in the $(p+1)^{th}$ stage and second modulation electrodes 424 and 444 in the $(p+1)^{th}$ stage, and a part of an active-area formation layer of first conductivity type (p-type) (whose illustration is omitted, but as to cross-sectional structure, see FIG. 2(a) and the like) located just below the inside area of the aperture $APT_{(p+1)}$ in the $(p+1)^{th}$ stage and a part of a buried-photodiode region of second conductivity type (n-type) (whose illustration is omitted, but as to cross-sectional structure, see FIG. 2(a) and the like) implement the buried-photodiode region. In FIG. 15, so as to surround the buried-photodiode region that serves as a light receiving area just below the aperture $APT_{(p+1)}$ in the $(p+1)^{th}$ stage, the first modulation electrodes 423 and 443 in the $(p+1)^{th}$ stage and second modulation electrodes 424 and 444 in the $(p+1)^{th}$ stage are arranged. Then, when the first charge-modulation voltage pulse $\Phi_{MA}$ of the clock pattern illustrated in FIG. 16 is applied to the first modulation electrode 423 in the $(p+1)^{th}$ stage and second modulation electrode 424 in the $(p+1)^{th}$ stage and the second charge-modulation voltage pulse $\Phi_{MB}$ of the clock pattern illustrated in FIG. 16 is applied to the first modulation electrode 443 in the $(p+1)^{th}$ stage and second modulation electrode 444 in the $(p+1)^{th}$ stage, the depleted potential of the buried-photodiode region can be changed so that the electric field is substantially constant over the long range of the transfer path for charge modulation in the $(p+1)^{th}$ stage defined in the direction orthogonal to the main charge-transfer direction. Also, with the electric fields of the first charge-modulation voltage pulse $\Phi_{MA}$ and the second charge-modulation voltage pulse $\Phi_{MB}$, the signal charges can be distributed to and from between the main charge-transfer paths on the upper lane and on the lower lane, and the signal charges can be transferred at high speed in the main charge-transfer paths.

Similarly, in the plan view of FIG. 15, in such a way that the light is selectively irradiated to a part of the main charge-transfer path, a rectangular aperture $APT_p$ in the $p^{th}$ stage illustrated by chain-dotted line is placed above the pair of first modulation electrodes 428 and 448 in the $p^{th}$ stage and second modulation electrodes 429 and 449 in the $p^{th}$ stage, and a part of an active-area formation layer of first conductivity type (p-type) located just below the inside area of the aperture $APT_p$ in the $p^{th}$ stage and a part of a buried-photodiode region of second conductivity type (n-type) implement the buried-photodiode region. In FIG. 15, so as to surround the buried-photodiode region that serves as a light receiving area just below the aperture $APT_p$ in the $p^{th}$ stage, the first modulation electrodes 428 and 448 in the $p^{th}$ stage and second modulation electrodes 429 and 449 in the $p^{th}$ stage are arranged. Then, when the first charge-modulation voltage pulse $\Phi_{MA}$ of the clock pattern illustrated in FIG. 16 is applied to the first modulation electrode 428 in the $p^{th}$ stage and second modulation electrode 429 in the $p^{th}$ stage and the second charge-modulation voltage pulse $\Phi_{MB}$ of the clock pattern illustrated in FIG. 16 is applied to the first modulation electrode 448 in the $p^{th}$ stage and second modulation electrode 449 in the $p^{th}$ stage, the depleted potential of the buried-photodiode region can be changed so that the electric field is substantially constant over the long range of the transfer path for charge modulation in the $p^{th}$ stage defined in the direction orthogonal to the main charge-transfer direction. Also, with the electric fields of the first charge-modulation voltage pulse $\Phi_{MA}$ and the second charge-modulation voltage pulse $\Phi_{MB}$, the signal charges can be distributed to and from between the main charge-transfer paths on the upper lane and on the lower lane, and the signal charges can be transferred at high speed in the main charge-transfer paths.

<Timing $P_{MA}$ in Charge-Modulation Mode>

In the timing $P_{MA}$ in the timing chart illustrated in FIG. 16, the first voltage pulse $\Phi 1$ is set to be at the first potential level (low level: L), the second voltage pulse $\Phi 2A$ for the upper lane is set to be at the third potential level (high level: H), the second voltage pulse $\Phi 2B$ for the lower lane is set to be at the first potential level (low level: L), the third voltage pulse $\Phi 3$ is set to be at the third potential level (high level: H), the first charge-modulation voltage pulse $\Phi_{MA}$ is set to be at the third potential level (high level: H), and the second charge-modulation voltage pulse $\Phi_{MB}$ is set to be at the second potential level (middle level: M).

That is, as illustrated in FIG. 17, in the semiconductor element pertaining to the fifth embodiment, the voltage $\Phi 1$ of the first potential level (low level: L) is applied to the first field-control electrodes 413 and 463 in the $(p+1)^{th}$ stage and the first auxiliary electrodes 425 and 445 in the $(p+1)^{th}$ stage. Also, the voltage $\Phi 1$ of the first potential level (low level: L) is applied even to the first field-control electrodes 416 and 466 in the $p^{th}$ stage and the first auxiliary electrodes 430 and 450 in the $p^{th}$ stage. Consequently, potential barriers are created at a location between the first field-control electrode 413 and the first auxiliary electrode 425 and at a location between the first field-control electrode 416 and the first auxiliary electrode 430, in the main charge-transfer path on the upper lane, and at a location between the first field-control electrode 463 and the first auxiliary electrode 445 and at a location between the first field-control electrode 466 and the first auxiliary electrode 450, in the main charge-transfer path on the lower lane.

Also, the voltage $\Phi 2A$ of the third potential level (high level: H) is applied to the second field-control electrode 412 and second auxiliary electrode 422 in the $(p+1)^{th}$ stage, and the voltage $\Phi 2A$ of the third potential level (high level: H) is applied even to the second field-control electrode 415 and second auxiliary electrode 427 in the $p^{th}$ stage. Thus, the potential level of electrons is decreased in the potential well between the second field-control electrode 412 and the second auxiliary electrode 422 and the potential well between the second field-control electrode 415 and the second auxiliary electrode 427, in the main charge-transfer path on the upper lane.

On the other hand, when the voltage $\Phi 2B$ of the first potential level (low level: L) is applied to the second auxiliary electrode 442 in the $(p+1)^{th}$ stage and second field-control electrode 462 in the $(p+1)^{th}$ stage, and the voltage $\Phi 2B$ of the first potential level (low level: L) is applied even to the second auxiliary electrode 447 in the $p^{th}$ stage and second field-control electrode 465 in the $p^{th}$ stage, potential barriers are created at a location between the second auxiliary electrode 442 and the second field-control electrode 462 and at a location between the second auxiliary electrode 447 and the second field-control electrode 465, in the main charge-transfer path on the lower lane.

And, the voltage $\Phi 3$ of the third potential level (high level: H) is applied to the third field-control electrodes 411 and 461 in the $(p+1)^{th}$ stage and the third auxiliary electrodes 421 and 441 in the $(p+1)^{th}$ stage, and the voltage $\Phi 3$ of the third potential level (high level: H) is applied even to the third field-control electrodes 414 and 464 in the $p^{th}$ stage, and the third auxiliary electrodes 426 and 446 in the $p^{th}$ stage, and the third field-control electrodes 417 and 467 in the $(p-1)^{th}$ stage and the third auxiliary electrodes 431 and 451 in the $(p-1)^{th}$ stage. Thus, the potential level of electrons is decreased in the potential wells between the third field-control electrode 411 and the third auxiliary electrode 421, between the third field-control electrode 414 and the third auxiliary electrode 426 and between the third field-control electrode 417 and the third auxiliary electrode 431, in the main charge-transfer path on the upper lane, and between the third field-control electrode 461 and the third auxiliary electrode 441, between the third field-control electrode 464 and the third auxiliary electrode 446 and between the third field-control electrode 467 and the third auxiliary electrode 451, in the main charge-transfer path on the lower lane.

In this situation, when the voltage $\Phi_{MA}$ of the third potential level (high level: H) is applied to the first modulation electrode 423 in the $(p+1)^{th}$ stage, the second modulation electrode 424 in the $(p+1)^{th}$ stage, the first modulation electrode 428 in the $p^{th}$ stage and second modulation electrode 429 in the $p^{th}$ stage, and the voltage $\Phi_{MB}$ of the second potential level (middle level: M) is applied to the first modulation electrode 443 in the $(p+1)^{th}$ stage, the second modulation electrode 444 in the $(p+1)^{th}$ stage, the first modulation electrode 448 in the $p^{th}$ stage and second modulation electrode 449 in the $p^{th}$ stage, the potential level of electrons is decreased in the potential wells between the first modulation electrode 423 and the second modulation electrode 424 and between the first modulation electrode 428 and the second modulation electrode 429. For this reason, the potential inclination, in which the potential is decreased from the main charge-transfer path on the lower lane to the main charge-transfer path on the upper lane, is created in the transfer paths for charge modulation, which are defined from a location between the first modulation electrode 423 and the second modulation electrode 424 to a location between the first modulation electrode 443 and the second modulation electrode 444, which is continuous to the location between the first modulation electrode 423 and the second modulation electrode 424, and from a location between the first modulation electrode 428 and the second modulation electrode 429 and to a location between the first modulation electrode 448 and the second modulation electrode 449, which is continuous to the location between the first modulation electrode 428 and the second modulation electrode 429.

For this reason, the signal charges, which include the carriers generated in the buried-photodiode regions located just below the aperture $APT_{(p+1)}$ and aperture $APT_p$ illustrated in the plan view of FIG. 15, are transferred from the main charge-transfer path on the lower lane to the main charge-transfer path on the upper lane, through the transfer path for charge modulation. And, as illustrated in FIG. 17, the signal charges, which are transferred through the transfer path for charge modulation, is further transferred to the left direction along the main charge-transfer path on the upper lane, and then stored in the potential well extending from a location between the second field-control electrode 412 and second auxiliary electrode 422 in the main charge-transfer path on the upper lane to a location between the third field-control electrode 411 and the third auxiliary electrode 421 in the main charge-transfer path, the potential well extending from a location between the second field-control electrode 415 and the second auxiliary electrode 427 to a location between the third field-control electrode 414 and the third auxiliary electrode 426, and the potential well between the third field-control electrode 417 and the third auxiliary electrode 431, respectively.

<Timing $P_{MB}$ in Charge-Modulation Mode>

In the timing $P_{MB}$ in the timing chart illustrated in FIG. 16, the first voltage pulse $\Phi 1$ is set to be at the first potential level (low level: L), the second voltage pulse $\Phi 2A$ for the upper lane is set to be at the first potential level (low level H), the second voltage pulse $\Phi 2B$ for the lower lane is set to be at the third potential level (high level L), the third voltage pulse $\Phi 3$ is set to be at the third potential level (high level: H), the first charge-modulation voltage pulse $\Phi_{MA}$ is set to be at the second potential level (middle level: M), and the second charge-modulation voltage pulse $\Phi_{MB}$ is set to be at the third potential level (high level: H).

That is, as illustrated in FIG. 18, in the semiconductor element pertaining to the fifth embodiment, the voltage $\Phi 1$ of the first potential level (low level: L) is applied to the first field-control electrodes 413 and 463 in the $(p+1)^{th}$ stage and the first auxiliary electrodes 425 and 445 in the $(p+1)^{th}$ stage. Also, the voltage $\Phi 1$ of the first potential level (low level: L) is applied even to the first field-control electrodes 416 and 466 in the $p^{th}$ stage and the first auxiliary electrodes 430 and 450 in the $p^{th}$ stage. Consequently, the potential barriers are created at a location between the first field-control electrode 413 and the first auxiliary electrode 425 and a location between the first field-control electrode 416 and the first auxiliary electrode 430, in the main charge-transfer path on the upper lane, and a location between the first field-control electrode 463 and the first auxiliary electrode 445 and a location between the first field-control electrode 466 and the first auxiliary electrode 450, in the main charge-transfer path on the lower lane.

Also, the voltage $\Phi 2A$ of the first potential level (low level: L) is applied to the second field-control electrode 412 and second auxiliary electrode 422 in the $(p+1)^{th}$ stage, and the voltage $\Phi 2A$ of the first potential level (low level: L) is applied even to the second field-control electrode 415 and second auxiliary electrode 427 in the $p^{th}$ stage. Thus, the potential barriers are created in the potential wells between the second field-control electrode 412 and the second auxiliary electrode 422 and between the second field-control electrode 415 and the second auxiliary electrode 427, in the main charge-transfer path on the upper lane.

On the other hand, the voltage $\Phi 2B$ of the third potential level (high level: H) is applied to the second auxiliary electrode 442 and second field-control electrode 462 in the $(p+1)^{th}$ stage, and the voltage $\Phi 2B$ of the third potential level (high level: H) is applied even to the second auxiliary electrode 447 and the second field-control electrode 465 in the $p^{th}$ stage. Thus, the potential level of electrons is decreased in the potential wells between the second auxiliary electrode 442 and the second field-control electrode 462 and between the second auxiliary electrode 447 and the second field-control electrode 465, in the main charge-transfer path on the lower lane.

And, the voltage $\Phi 3$ of the third potential level (high level: H) is applied to the third field-control electrodes 411 and 461 in the $(p+1)^{th}$ stage and the third auxiliary electrodes 421 and 441 in the $(p+1)^{th}$ stage, and the voltage $\Phi 3$ of the third potential level (high level: H) is applied even to the third field-control electrodes 414 and 464 in the $p^{th}$ stage and the third auxiliary electrodes 426 and 446 in the $p^{th}$ stage, and the third field-control electrodes 417 and 467 in the $(p-1)^{th}$ stage and the third auxiliary electrodes 431 and 451 in the $(p-1)^{th}$ stage. Thus, the potential level of electrons is decreased in the potential wells between the third field-control electrode 411 and the third auxiliary electrode 421, between the third field-control electrode 414 and the third auxiliary electrode 426 and between the third field-control electrode 417 and the third auxiliary electrode 431, in the main charge-transfer path on the upper lane, and between the third field-control electrode 461 and the third auxiliary electrode 441, between the third field-control electrode 464 and the third auxiliary electrode 446 and between the third field-control electrode 467 and the third auxiliary electrode 451, in the main charge-transfer path on the lower lane.

In this situation, when the voltage $\Phi_{MA}$ of the second potential level (middle level: M) is applied to the first modulation electrode 423 and the second modulation electrode 424 in the $(p+1)^{th}$ stage and the first modulation electrode 428 and the second modulation electrode 429 in the $p^{th}$ stage, and the voltage $\Phi_{MB}$ of the third potential level (high level: H) is applied to the first modulation electrode 443 and the second modulation electrode 444 in the $(p+1)^{th}$ stage and the first modulation electrode 448 and the second modulation electrode 449 in the $p^{th}$ stage, the potential level of electrons is decreased in the potential well between the first modulation electrode 443 and the second modulation electrode 444 and the potential well between the first modulation electrode 448 and the second modulation electrode 449. For this reason, reversely to the case of the timing $P_{MA}$ in the timing chart, the potential inclination, in which the potential is decreased from the main charge-transfer path on the upper lane to the main charge-transfer path on the lower lane, is created in the transfer paths for charge modulation, which are defined from a location between the first modulation electrode 423 and the second modulation electrode 424 and to a location between the first modulation electrode 443 and the second modulation electrode 444, which is continuous to the location between the first modulation electrode 423 and the second modulation electrode 424, and from a location between the first modulation electrode 428 and the second modulation electrode 429 and to a location between the first modulation electrode 448 and the second modulation electrode 449, which is continuous to the location between the first modulation electrode 428 and the second modulation electrode 429.

For this reason, reversely to the case of the timing $P_{MA}$ in the timing chart which includes the carriers generated in the buried-photodiode regions located just below the aperture $APT_{(p+1)}$ and aperture $APT_p$ illustrated in the plan view of FIG. 15, the signal charges are transferred from the main charge-transfer path on the upper lane to the main charge-transfer path on the lower lane, through the transfer path for charge modulation. And, as illustrated in FIG. 18, the signal charges, which are transferred through the transfer path for charge modulation, are further transferred to the left direction along the main charge-transfer path on the lower lane, and then stored in the potential well extending from a location between the third field-control electrode 461 and the third auxiliary electrode 441 in the main charge-transfer path on the lower lane to a location between the second auxiliary electrode 442 and the second field-control electrode 462, the potential well extending from a location between the second auxiliary electrode 447 and the second field-control electrode 465 to a location between the third field-control electrode 464 and the third auxiliary electrode 446, and the potential well between the third field-control electrode 467 and the third auxiliary electrode 451, respectively.

—Charge-Transfer Mode—

In the charge-transfer mode, as illustrated in FIG. 16, the first charge-modulation voltage pulse $\Phi_{MA}$ and the second charge-modulation voltage pulse $\Phi_{MB}$ are applied alternately and repeatedly, and the operation of the charge-modulation mode similar to a time of flight (TOF) measurement method is continued for a while to obtain and to store two signal charges. By switching to the charge-transfer mode, the two signal charges are transferred to adjacent potential wells, through the main charge-transfer paths on the upper and lower lanes. In the case of the clock pattern illustrated in FIG. 16, the signal charges are transferred to the left direction, in the charge-transfer mode.

In time series of timings $PT_1, PT_2, PT_3, PT_4, PT_5, PT_6, PT_1$ that implement the period of the charge-transfer mode in the timing chart illustrated in FIG. 16, the first charge-modulation voltage pulse $\Phi_{MA}$ and the second charge-modulation voltage pulse $\Phi_{MB}$ are all fixed to the first potential level (low level: L). While, the second voltage pulse $\Phi 2A$ for the upper lane and the second voltage pulse $\Phi 2B$ for the lower lane are both held at the same potential and alter, sharing the values of the first potential level (low level: L) and the third potential level (high level: H), so that a symmetry property is kept between the main charge-transfer path on the upper lane and the main charge-transfer path on the lower lane.

That is, as illustrated in FIG. 19 to FIG. 23, in the charge-transfer mode, because the voltage $\Phi_{MB}$ of the first potential level (low level: L) is applied to all of the first modulation electrode 423, second modulation electrode 424, first modulation electrode 443 and the second modulation electrode 444 in the $(p+1)^{th}$ stage and the first modulation electrode 428, second modulation electrode 429, first modulation electrode 448 and the second modulation electrode 449 in the $p^{th}$ stage, and the voltage $\Phi_{MB}$ is held at a fixed value so that the potential barriers are created at all of the locations between the first modulation electrode 423 and the second modulation electrode 424, between the first modulation electrode 443 and the second modulation electrode 444, between the first modulation electrode 428 and the second modulation electrode 429 and between the first modulation electrode 448 and the second modulation electrode 449, all of the transfer paths for charge modulation are kept at a cutoff state. For the cutoff state of all of the transfer paths, the signal charges are transferred in parallel to each other in the main charge-transfer path on the upper lane and the main charge-transfer path on the lower lane, and parallel running signal charges will never cross each other through the central divider.

<Timing $P_{T1}$ in Charge-Transfer Mode>

As mentioned already, in the charge-transfer mode, the first charge-modulation voltage pulse $\Phi_{MA}$ and the second charge-modulation voltage pulse $\Phi_{MB}$ are both held at the first potential level (low level: L). And, at the timing $T_1$ in the timing chart illustrated in FIG. 16, the first voltage pulse $\Phi 1$ is set to be at the first potential level (low level: L), and the second voltage pulse $\Phi 2A$ for the upper lane and the second voltage pulse $\Phi 2B$ for the lower lane are both set to be at the first potential level (low level: L), and the third voltage pulse $\Phi 3$ is set to be at the third potential level (high level: H).

Figure 19:
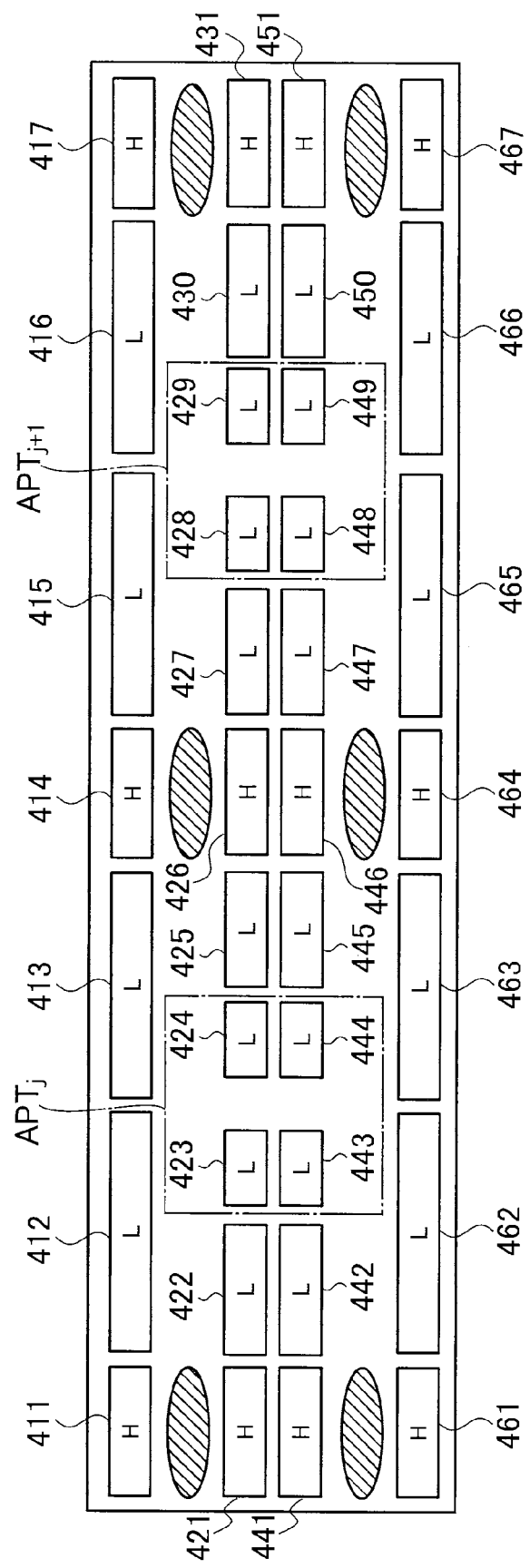
FIG. 19 is a schematic plan view explaining a voltage distribution at a phase of a timing $P_{T1}$ and states of storage positions of signal charges, in order to explain an operation of a charge-transfer mode of the semiconductor element pertaining to the fifth embodiment.

As illustrated in FIG. 19, in the semiconductor element pertaining to the fifth embodiment, the voltage $\Phi 1$ of the first potential level (low level: L) is applied to the first field-control electrodes 413 and 463 in the $(p+1)^{th}$ stage and the first auxiliary electrodes 425 and 445 in the $(p+1)^{th}$ stage. Also, the voltage $\Phi 1$ of the first potential level (low level: L) is applied to the first field-control electrodes 416 and 466 in the $p^{th}$ stage and the first auxiliary electrodes 430 and 450 in the $p^{th}$ stage. Consequently, the potential barrier is created at the location between the first field-control electrode 413 and the first auxiliary electrode 425 and the location between the first field-control electrode 416 and the first auxiliary electrode 430, in the main charge-transfer path on the upper lane, and the location between the first field-control electrode 463 and the first auxiliary electrode 445 and the location between the first field-control electrode 466 and the first auxiliary electrode 450, in the main charge-transfer path on the lower lane.

Also, the voltage $\Phi 2A$ of the first potential level (low level: L) is applied to the second field-control electrode 412 in the $(p+1)^{th}$ stage and the second auxiliary electrode 422 in the $(p+1)^{th}$ stage and the second field-control electrode 415 in the $p^{th}$ stage and the second auxiliary electrode 427 in the $p^{th}$ stage so that the potential barriers are created in the potential well between the second field-control electrode 412 and the second auxiliary electrode 422 in the main charge-transfer path on the upper lane, and between the second field-control electrode 415 and the second auxiliary electrode 427. Similarly, the voltage $\Phi 2B$ of the first potential level (low level: L) is applied to the second auxiliary electrode 442 in the $(p+1)^{th}$ stage and the second field-control electrode 462 in the $(p+1)^{th}$ stage and the second auxiliary electrode 447 in the $p^{th}$ stage and the second field-control electrode 465 in the $p^{th}$ stage so that the potential barriers are created between the second auxiliary electrode 442 and the second field-control electrode 462 and between the second auxiliary electrode 447 and the second field-control electrode 465, in the main charge-transfer path on the lower lane.

And, a voltage Φ3 of the third potential level (high level: H) is applied to the third field-control electrodes 411 and 461 in the $(p+1)^{th}$ stage and the third auxiliary electrodes 421 and 441 in the $(p+1)^{th}$ stage, and the voltage Φ3 of the third potential level (high level: H) is applied even to the third field-control electrodes 414 and 464 in the $p^{th}$ stage, the third auxiliary electrodes 426 and 446 in the $p^{th}$ stage, the third field-control electrodes 417 and 467 in the $(p-1)^{th}$ stage and the third auxiliary electrodes 431 and 451 in the $(p-1)^{th}$ stage. Thus, the potential level of electrons in the potential wells is decreased between the third field-control electrode 411 and the third auxiliary electrode 426, between the third field-control electrode 414 and the third auxiliary electrode 426 and between the third field-control electrode 417 and the third auxiliary electrode 431, in the main charge-transfer path on the upper lane, and between the third field-control electrode 461 and the third auxiliary electrode 441, between the third field-control electrode 464 and the third auxiliary electrode 446 and between the third field-control electrode 467 and the third auxiliary electrode 451, in the main charge-transfer path on the lower lane. Thus, the signal charges as illustrated in FIG. 19 are stored in the portions where the potential level is decreased.

<Timing $P_{T3}$ in Charge-Transfer Mode>

Although the explanation is skipped for the phase of $P_{T2}$ in FIG. 16, and the timing $P_{T3}$ is explained, from the phase of $P_{T2}$ to the phase of $P_{T3}$, the behavior that the storage state of the signal charges illustrated in FIG. 19 is further transferred to the left may be easily understood. At the timing $P_{T3}$ in the timing chart illustrated in FIG. 16, the first voltage pulse Φ1 is set to be at the third potential level (high level: H), and the second voltage pulse Φ2A for the upper lane and the second voltage pulse Φ2B for the lower lane are both set to be at the first potential level (low level: L), and the third voltage pulse Φ3 is set to be at the first potential level (low level: L).

Figure 20:
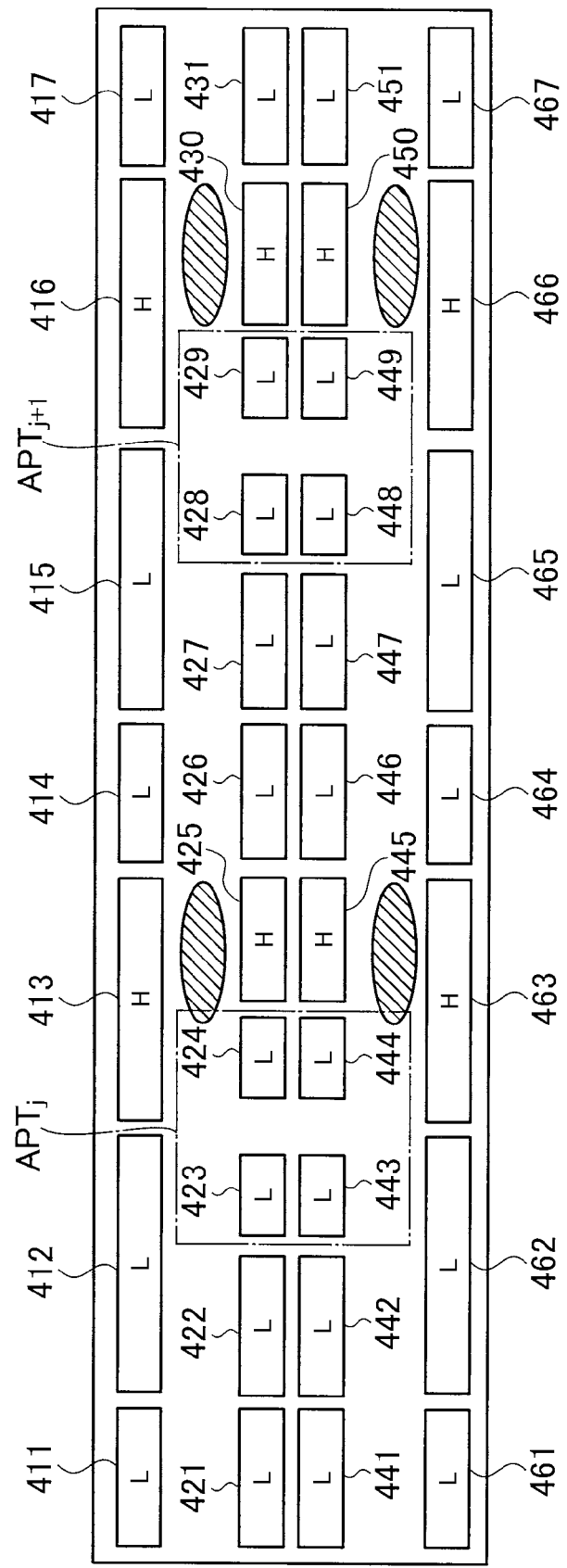
FIG. 20 is a schematic plan view explaining a voltage distribution at a phase of a timing $P_{T3}$ and states of storage positions of signal charges, in order to explain the operation of the charge-transfer mode of the semiconductor element pertaining to the fifth embodiment.

That is, as illustrated in FIG. 20, in the semiconductor element pertaining to the fifth embodiment, the voltage Φ1 of the third potential level (high level: H) is applied to the first field-control electrodes 413 and 463 in the $(p+1)^{th}$ stage and the first auxiliary electrodes 425 and 445 in the $(p+1)^{th}$ stage. Also, the voltage Φ1 of the third potential level (high level: H) is applied to the first field-control electrodes 416 and 466 in the $p^{th}$ stage and the first auxiliary electrodes 430 and 450 in the $p^{th}$ stage. Consequently, the potential levels of the potential wells are decreased between the first field-control electrode 413 and the auxiliary electrode 425 and between the first field-control electrode 416 and the first auxiliary electrode 430 in the main charge-transfer path on the upper lane, and between the first field-control electrode 463 and the first auxiliary electrode 445 and between the first field-control electrode 466 and the first auxiliary electrode 450, in the main charge-transfer path on the lower lane.

Also, because the voltage Φ2A of the first potential level (low level: L) is applied to the second field-control electrode 412 in the $(p+1)^{th}$ stage, the second auxiliary electrode 422 in the $(p+1)^{th}$ stage, the second field-control electrode 415 in the $p^{th}$ stage and the second auxiliary electrode 427 in the $p^{th}$ stage, the potential barriers are created in the potential wells between the second field-control electrode 412 and the second auxiliary electrode 422 and between the second field-control electrode 415 and the second auxiliary electrode 427, in the main charge-transfer path on the upper lane. Similarly, because the voltage Φ2B of the first potential level (low level: L) is applied even to the second auxiliary electrode 442 and the second field-control electrode 462 in the $(p+1)^{th}$ stage and the second auxiliary electrode 447 and the second field-control electrode 465 in the $p^{th}$ stage, the potential barriers are created between the second auxiliary electrode 442 and the second field-control electrode 462 and between the second auxiliary electrode 447 and the second field-control electrode 465, in the main charge-transfer path on the lower lane.

And, the voltage Φ3 of the first potential level (low level: L) is applied to the third field-control electrodes 411 and 461 in the $(p+1)^{th}$ stage, and the third auxiliary electrodes 421 and 441 in the $(p+1)^{th}$ stage, and the voltage Φ3 of the first potential level (low level: L) is applied even to the third field-control electrodes 414 and 464 in the $p^{th}$ stage, the third auxiliary electrodes 426 and 446 in the $p^{th}$ stage, the third field-control electrodes 417 and 467 in the $(p-1)^{th}$ stage and the third auxiliary electrodes 431 and 451 in the $(p-1)^{th}$ stage. Consequently, the potential barriers are created between the third field-control electrode 411 and the third auxiliary electrode 421, between the third field-control electrode 414 and the third auxiliary electrode 426 and between the third field-control electrode 417 and the third auxiliary electrode 437, in the main charge-transfer path on the upper lane. And the potential barriers are further created between the third field-control electrode 461 and the third auxiliary electrode 441, between the third 464 and the third auxiliary electrode 446 and between the third field-control electrode 467 and the third auxiliary electrode 451, in the main charge-transfer path on the lower lane.

After all, the signal charges illustrated in FIG. 20 are stored at portions where the potential level of electrons in the potential wells is decreased between the first field-control electrode 413 and the first auxiliary electrode 425 and between the first field-control electrode 416 and the first auxiliary electrode 430, in the main charge-transfer path on the upper lane, and between the first field-control electrode 463 and the first auxiliary electrode 445 and between the first field-control electrode 466 and the first auxiliary electrode 450, in the main charge-transfer path on the lower lane. The storage topology of the signal charges illustrated in FIG. 20 corresponds to a situation in which the signal charges are transferred to the left from the storage topology of the signal charges illustrated in FIG. 20.

Figure 21:
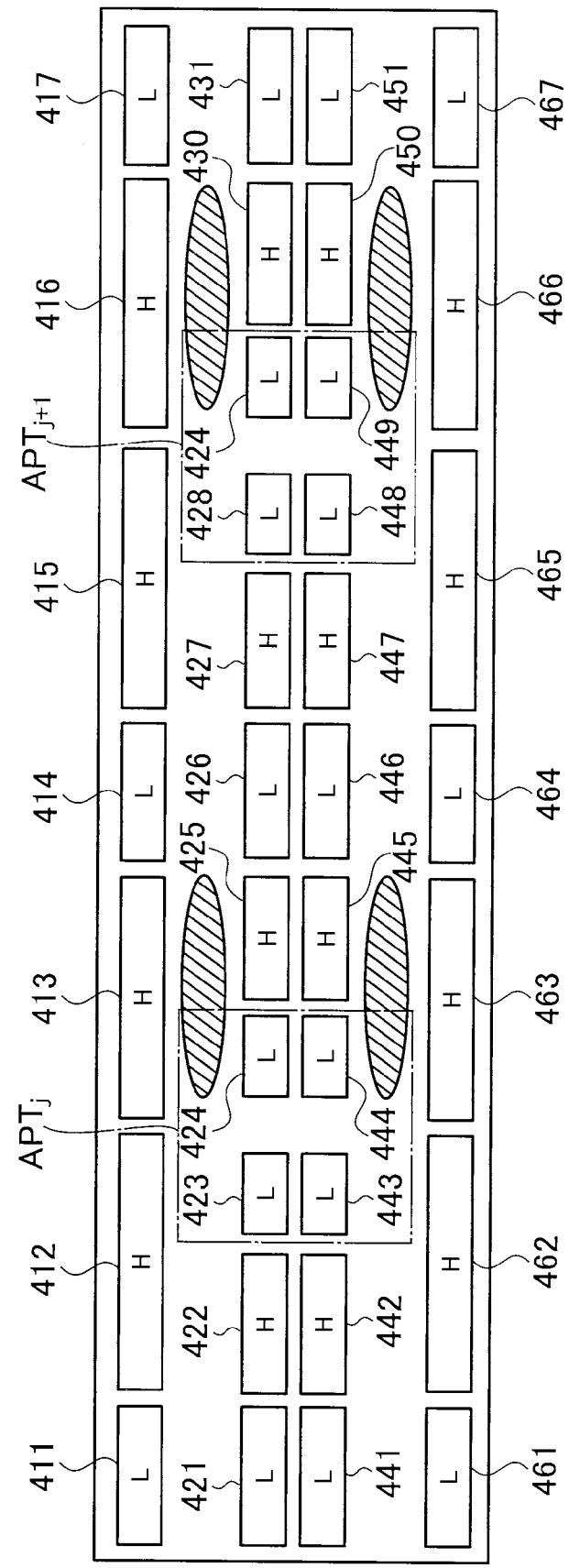
FIG. 21 is a schematic plan view explaining a voltage distribution at a phase of a timing $P_{T4}$ and states of storage positions of signal charges, in order to explain the operation of the charge-transfer mode of the semiconductor element pertaining to the fifth embodiment.
Figure 22:
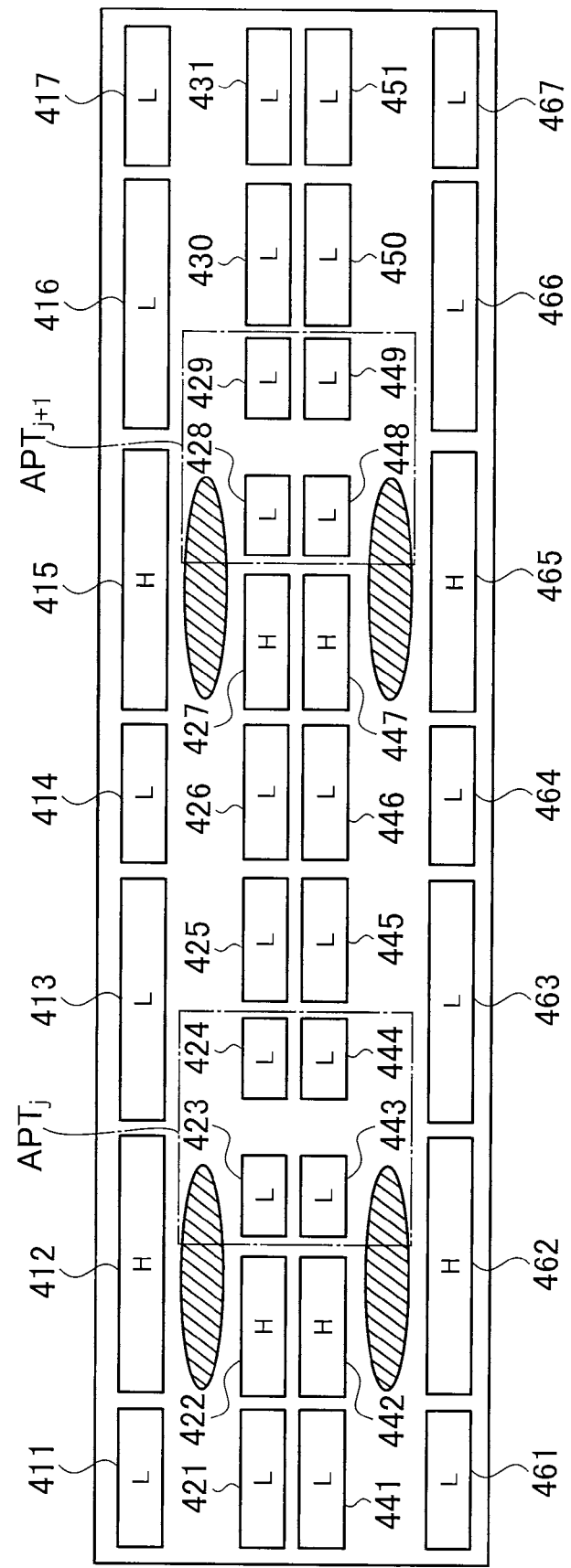
FIG. 22 is a schematic plan view explaining a voltage distribution at a phase of a timing $P_{T5}$ and states of storage positions of signal charges, in order to explain the operation of the charge-transfer mode of the semiconductor element pertaining to the fifth embodiment.
Figure 23:
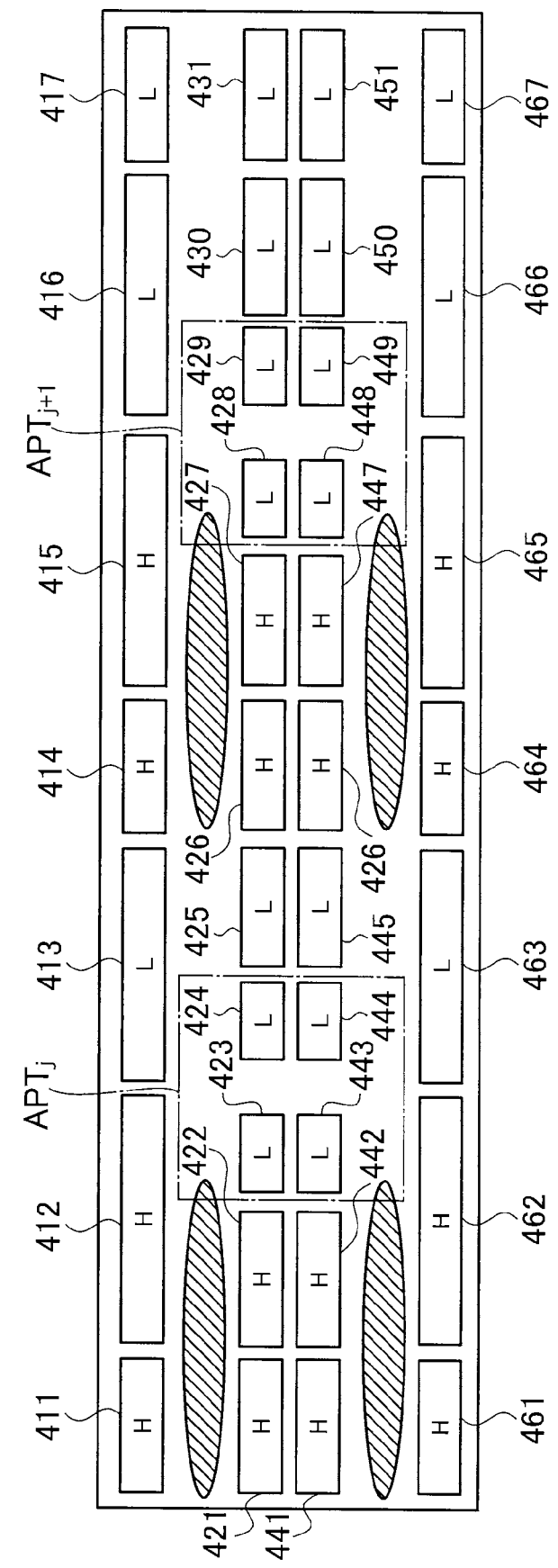
FIG. 23 is a schematic plan view explaining a voltage distribution at a phase of a timing $P_{T6}$ and states of storage positions of signal charges, in order to explain the operation of the charge-transfer mode of the semiconductor element pertaining to the fifth embodiment.

Although detailed explanations are omitted for three phases of $P_{T4}$, $P_{T5}$ and $P_{T6}$ after the phase of $P_{T3}$, at the timing $P_{T4}$, as illustrated in FIG. 21, with regard to the signal charges, the behaviors such that the storage state of the signal charges illustrated in FIG. 20 is further transferred to the left, and at the timing $P_{T5}$, as illustrated in FIG. 22, with regard to the signal charges, that the storage state of the signal charges illustrated in FIG. 21 is further transferred to the left, and at the timing $P_{T6}$, as illustrated in FIG. 23, with regard to the signal charges, that the storage state of the signal charges illustrated in FIG. 22 is further transferred to the left may be easily understood with reference to the clock pattern illustrated in FIG. 16.

As mentioned above, when the charge-modulation mode and the charge-transfer mode are continued at the clock pattern as illustrated in FIG. 16, for example, the signal charges, which in the charge-modulation mode, are generated in the aperture $APT_p$ in the $p^{th}$ stage, are swung into the main charge-transfer paths on the upper and lower lanes in the $p^{th}$ stage and modulated, similarly to the time of flight (TOF) measurement method, and then stored in the potential wells of the main charge-transfer paths on the upper and lower lanes in the ($p^{th}$ stage). The signal charges, which are stored in the potential wells of the main charge-transfer paths on the upper and lower lanes in the $p^{th}$ stage in the charge-modulation mode, are sequentially transferred through the clock patterns of the six fractional-parts of $P_{T1}$ to $P_{T6}$ in FIG. 16 in the charge-transfer mode, arrive at the potential wells of the main charge-transfer paths on the upper and lower lanes in the $(p+1)^{th}$ stage.

After the arrival at the potential wells of the main charge-transfer paths on the upper and lower lanes in the $(p+1)^{th}$ stage, the charge-transfer mode is switched to the charge-modulation mode. Then, when the operation of the charge-modulation mode is carried out, the modulation is performed on the optical charges generated in the $APT_{(p+1)}$ in the $(p+1)^{th}$ stage, by changing direction to the main charge-transfer paths on the upper and lower lanes in the $(p+1)^{th}$ stage, similarly to the TOF measurement method. Thus, the optical charges generated in the $APT_{(p+1)}$ in the $(p+1)^{th}$ stage are stored in the potential wells on the upper and lower lanes in the $(p+1)^{th}$ stage. Moreover, at the $(p+1)^{th}$ stage, the optical charges, which are generated and modulated in the aperture $APT_p$ in the $p^{th}$ stage on the right and transferred to the left direction from the $p^{th}$ stage, are added to the optical charges generated in the $APT_{(p+1)}$ in the charge-modulation mode.

In this way, in the semiconductor element pertaining to the fifth embodiment, the operations of the charge-modulation mode and the charge-transfer mode in the main charge-transfer paths on the upper and lower lanes repeat m times until the final stage ($m^{th}$ stage). Then signal charges, which are generated and modulated in an aperture at a certain position, are sequentially added by signal charges generated and modulated in the apertures arrayed up to the final stage, in the potential wells of the main charge-transfer paths on the upper and lower lanes.

According to the semiconductor element pertaining to the fifth embodiment, when the transfer speed in the charge-transfer mode is made coincident with the movement speed of a physical body, a moving target can be imaged at high speed without any image blurring. Also, by calculating a distance ascribable to a light flight time from the two modulated charges, it is possible to measure a three-dimensional shape of the physical body that is moving at high speed.

Sixth Embodiment

As the semiconductor element pertaining to the fifth embodiment, although the three-phase charge-transfer element is exemplified, in a semiconductor element pertaining to a sixth embodiment of the present invention, a four-phase charge transfer element is described.

Figure 24:
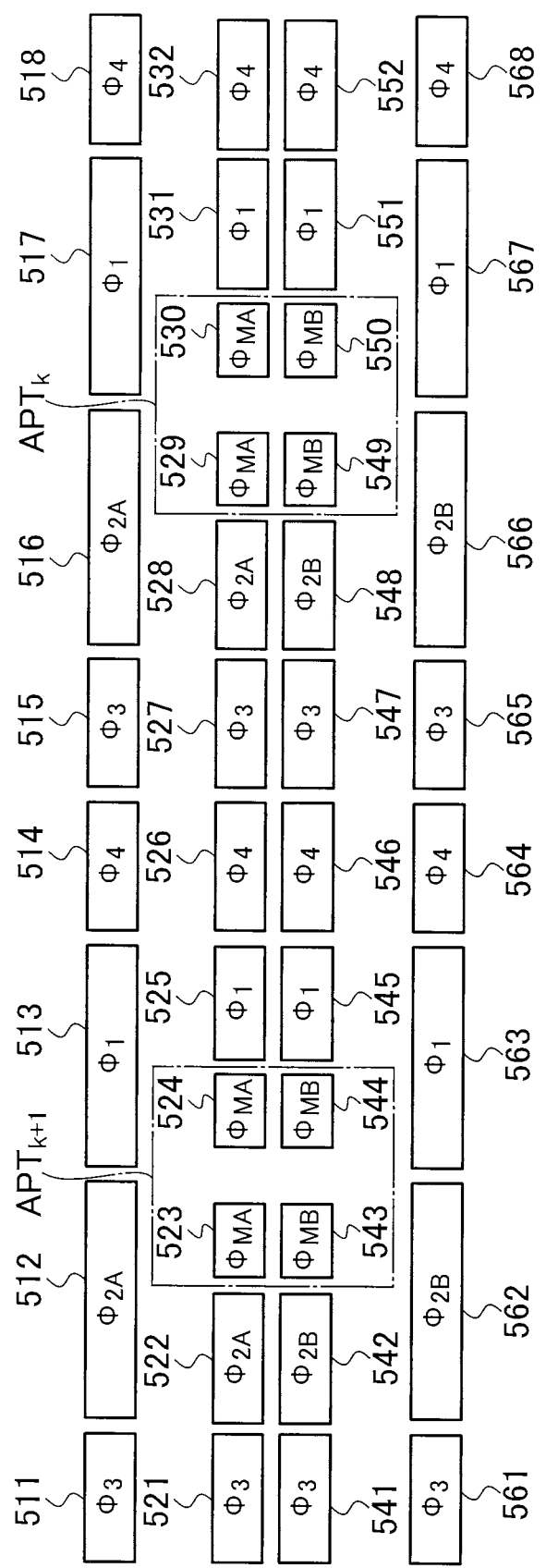
FIG. 24 is a schematic plan view explaining a gross outline of a layout on a semiconductor chip in a semiconductor element pertaining to a sixth embodiment in the present invention.

That is, as illustrated in a plan view of FIG. 24, the semiconductor element pertaining to the sixth embodiment of the present invention encompasses a main charge-transfer path, which is defined in a semiconductor region and through which the signal charges are transferred, a pair of third field-control electrodes 511 and 561 in a rear stage (($k+1)^{th}$ stage), which are laminated on a left end, via an insulating film (whose illustration is omitted and for its cross-sectional structure, refer to FIG. 2(a) and FIG. 3(a) in the first embodiment) on the semiconductor region so as to sandwich the main charge-transfer path in the planar pattern, along a direction orthogonal to a main transfer direction in which the signal charges are transferred along the main charge-transfer path, a pair of second field-control electrodes 512 and 562 in the $(k+1)^{th}$ stage, which are arranged on the right of the third field-control electrodes 511 and 561 in the $(k+1)^{th}$ stage and arranged separately from and adjacently to the third field-control electrodes 511 and 561 in the $(k+1)^{th}$ stage, respectively, and laminated via the insulating film on the semiconductor region, so as to sandwich the main charge-transfer path in the planar pattern, along the direction orthogonal to the main transfer direction, and a pair of first field-control electrodes 513 and 563 in the $(k+1)^{th}$ stage, which are arranged on the right of the second field-control electrodes 512 and 562 in the $(k+1)^{th}$ stage and laminated via the insulating film on the semiconductor region, so as to sandwich the main charge-transfer path in the planar pattern, along the main transfer direction, separately from the second field-control electrodes 512 and 562 in the $(k+1)^{th}$ stage, respectively.

The semiconductor element pertaining to the sixth embodiment further encompasses a pair of fourth field-control electrodes 514 and 564 in a front stage ($k^{th}$ stage), which are arrayed on the right of the first field-control electrodes 513 and 563 in the $(k+1)^{th}$ stage and laminated via the insulating film on the semiconductor region, so as to sandwich the main charge-transfer path in the planar pattern, along the direction orthogonal to the main transfer direction, separately from the first field-control electrodes 513 and 563 in the $(k+1)^{th}$ stage, respectively, a pair of third field-control electrodes 515 and 565 in the $k^{th}$ stage, which are arranged on the right of the electrodes 514 and 564 in the $k^{th}$ stage and laminated via the insulating film on the semiconductor region, so as to sandwich the main charge-transfer path in the planar pattern, along the direction orthogonal to the main transfer direction, separately from the fourth field-control electrodes 514 and 564 in the $k^{th}$ stage, respectively, a pair of second field-control electrodes 516 and 566 in the $k^{th}$ stage, which are arranged on the right of the electrodes 515 and 565 in the $k^{th}$ stage and laminated via the insulating film on the semiconductor region, so as to sandwich the main charge-transfer path in the planar pattern, separately from the third field-control electrodes 515 and 565 in the $k^{th}$ stage, respectively, and along the direction orthogonal to the main transfer direction, a pair of first field-control electrodes 517 and 567 in the $k^{th}$ stage, which are arranged on the right of the electrodes 516 and 566 in the $k^{th}$ stage and laminated via the insulating film on the semiconductor region, so as to sandwich the main charge-transfer path in the planar pattern, separately from the field-control electrodes 516 and 566 in the $k^{th}$ stage, respectively, and along the direction orthogonal to the main transfer direction, and a pair of fourth field-control electrodes 518 and 567 in the $(k-1)^{th}$ stage located still further to the front stage, which are arrayed on the right of the electrodes 517 and 567 in the $k^{th}$ stage and laminated via the insulating film on the semiconductor region, so as to sandwich the main charge-transfer path in the planar pattern, separately from the first field-control electrodes 517 and 567 in the $k^{th}$ stage, respectively, and along the direction orthogonal to the main transfer direction.

Moreover, in the center of the main charge-transfer path defined between the arrays in the pair of third field-control electrodes 511 and 561 in the $(k+1)^{th}$ stage, the second field-control electrodes 512 and 562 in the $(k+1)^{th}$ stage, the first field-control electrodes 513 and 563 in the $(k+1)^{th}$ stage, the fourth field-control electrodes 514 and 564 in the $k^{th}$ stage, the third field-control electrodes 515 and 565 in the $k^{th}$ stage, the second field-control electrodes 516 and 566 in the $k^{th}$ stage, the first field-control electrodes 517 and 567 in the $k^{th}$ stage and the fourth field-control electrodes 518 and 567 in the $(k-1)^{th}$ stage, so as to implement a central divider, a pair of third auxiliary electrodes 521 and 541 in the $(k+1)^{th}$ stage, the second auxiliary electrodes 522 and 542 in the $(k+1)^{th}$ stage, the first auxiliary electrodes 525 and 545 in the $(k+1)^{th}$ stage, the fourth auxiliary electrodes 526 and 546 in the $k^{th}$ stage, the third auxiliary electrodes 527 and 547 in the $k^{th}$ stage, the second auxiliary electrodes 528 and 549 in the k$^{th}$ stage, the first auxiliary electrodes 531 and 551 in the k$^{th}$ stage, and the fourth auxiliary electrodes 532 and 552 in the (k−1)$^{th}$ stage are arrayed, and the main charge-transfer path is separated into "a main charge-transfer path at upper lane" and "a main charge-transfer path at lower lane".

Moreover, between the arrays of the pair of second field-control electrodes 512 and 562 in the (k+1)$^{th}$ stage, the first field-control electrodes 513 and 563 in the (k+1)$^{th}$ stage, the second field-control electrodes 516 and 566 in the k$^{th}$ stage and the first field-control electrodes 517 and 567 in the k$^{th}$ stage, a pair of first modulation electrodes 523 and 543 in the (k+1)$^{th}$ stage, the second modulation electrodes 524 and 544 in the (k+1)$^{th}$ stage, the first modulation electrodes 529 and 549 in the k$^{th}$ stage and the second modulation electrodes 530 and 550 in the k$^{th}$ stage are provided.

The third auxiliary electrodes 521 and 541 in the (k+1)$^{th}$ stage are disposed in areas being sandwiched between the pair of third field-control electrodes 511 and 561 in the (k+1)$^{th}$ stage. The second auxiliary electrodes 522 and 542 in the (k+1)$^{th}$ stage are shorter in the length measured along the main charge-transfer path direction than the second field-control electrodes 512 and 562 in the (k+1)$^{th}$ stage and disposed in areas being sandwiched between the pair of second field-control electrodes 512 and 562 in the (k+1)$^{th}$ stage. Also, the first modulation electrodes 532 and 543 in the (k+1)$^{th}$ stage are shorter in the length measured along the main charge-transfer path direction than the second field-control electrodes 512 and 562 in the (k+1)$^{th}$ stage and disposed in areas being sandwiched between the pair of second field-control electrodes 512 and 562 in the (k+1)$^{th}$ stage, adjacently to the right of the second auxiliary electrodes 522 and 542 in the (k+1)$^{th}$ stage. The second modulation electrodes 524 and 544 in the (k+1)$^{th}$ stage are shorter in the length measured along the main charge-transfer path direction than the first field-control electrodes 513 and 563 in the (k+1)$^{th}$ stage and disposed in areas being sandwiched between the pair of first field-control electrodes 513 and 563 in the (k+1)$^{th}$ stage. Also, the first auxiliary electrodes 525 and 545 in the (k+1)$^{th}$ stage are shorter in the length measured along the main charge-transfer path direction than the first field-control electrodes 513 and 563 in the (k+1)$^{th}$ stage and disposed in areas being sandwiched between the pair of first field-control electrodes 513 and 563 in the (k+1)$^{th}$ stage, adjacently to the right of the second modulation electrodes 524 and 544 in the (k+1)$^{th}$ stage.

On the other hand, the fourth auxiliary electrodes 526 and 546 in the k$^{th}$ stage are disposed in areas being sandwiched between the pair of fourth field-control electrodes 514 and 564 in the k$^{th}$ stage, and the third auxiliary electrodes 527 and 547 in the k$^{th}$ stage are disposed in areas being sandwiched between the pair of third field-control electrodes 515 and 565 in the k$^{th}$ stage. The second auxiliary electrodes 528 and 549 in the k$^{th}$ stage are shorter in the length measured along the main charge-transfer path direction than the second field-control electrodes 516 and 566 in the k$^{th}$ stage and disposed in areas being sandwiched between the pair of second field-control electrodes 516 and 566 in the k$^{th}$ stage. Also, the first modulation electrodes 529 and 549 in the k$^{th}$ stage are shorter in the length measured along the main charge-transfer path direction than the second field-control electrodes 516 and 566 in the k$^{th}$ stage and disposed in areas being sandwiched between the pair of second field-control electrodes 516 and 566 in the k$^{th}$ stage, adjacently to the right of the second auxiliary electrodes 528 and 549 in the k$^{th}$ stage.

The second modulation electrodes 530 and 550 in the k$^{th}$ stage are shorter in the length measured along the main charge-transfer path direction than the first field-control electrodes 517 and 567 in the k$^{th}$ stage and disposed in areas being sandwiched between the pair of first field-control electrodes 517 and 567 in the k$^{th}$ stage. Also, the first auxiliary electrodes 531 and 551 in the k$^{th}$ stage are shorter in the length measured along the main charge-transfer path direction than the first field-control electrodes 517 and 567 in the k$^{th}$ stage and disposed in areas being sandwiched between the pair of first field-control electrodes 517 and 567 in the k$^{th}$ stage, adjacently to the right of the second modulation electrodes 530 and 550 in the k$^{th}$ stage. Moreover, as shown at the right end in FIG. 24, the fourth auxiliary electrodes 532 and 552 in the (k−1)$^{th}$ stage are disposed in areas being sandwiched between the pair of fourth field-control electrodes 518 and 567 in the (k−1)$^{th}$ stage.

As illustrated in FIG. 24, in the semiconductor element pertaining to the sixth embodiment, a channel of a constant width exists between the first modulation electrode 523 in the (k+1)$^{th}$ stage and the second modulation electrode 524 in the (k+1)$^{th}$ stage and between the first modulation electrode 543 in the (k+1)$^{th}$ stage and the second modulation electrode 544 in the (k+1)$^{th}$ stage which are continuous to a location between the first modulation electrode 523 in the (k+1)$^{th}$ stage and the second modulation electrode 524 in the (k+1)$^{th}$ stage, and "the transfer path for charge modulation in the (k+1)$^{th}$ stage" is defined in the direction orthogonal to the main charge-transfer path direction. Also, a channel of a constant width exists between the first modulation electrode 529 in the k$^{th}$ stage and the second modulation electrode 530 in the k$^{th}$ stage and between the first modulation electrode 549 in the k$^{th}$ stage and the second modulation electrode 550 in the k$^{th}$ stage which are continuous to a location between the first modulation electrode 529 in the k$^{th}$ stage and the second modulation electrode 530 in the k$^{th}$ stage, and "the transfer path for charge modulation in the k$^{th}$ stage" is defined in the direction orthogonal to the main charge-transfer path direction.

Figure 25:
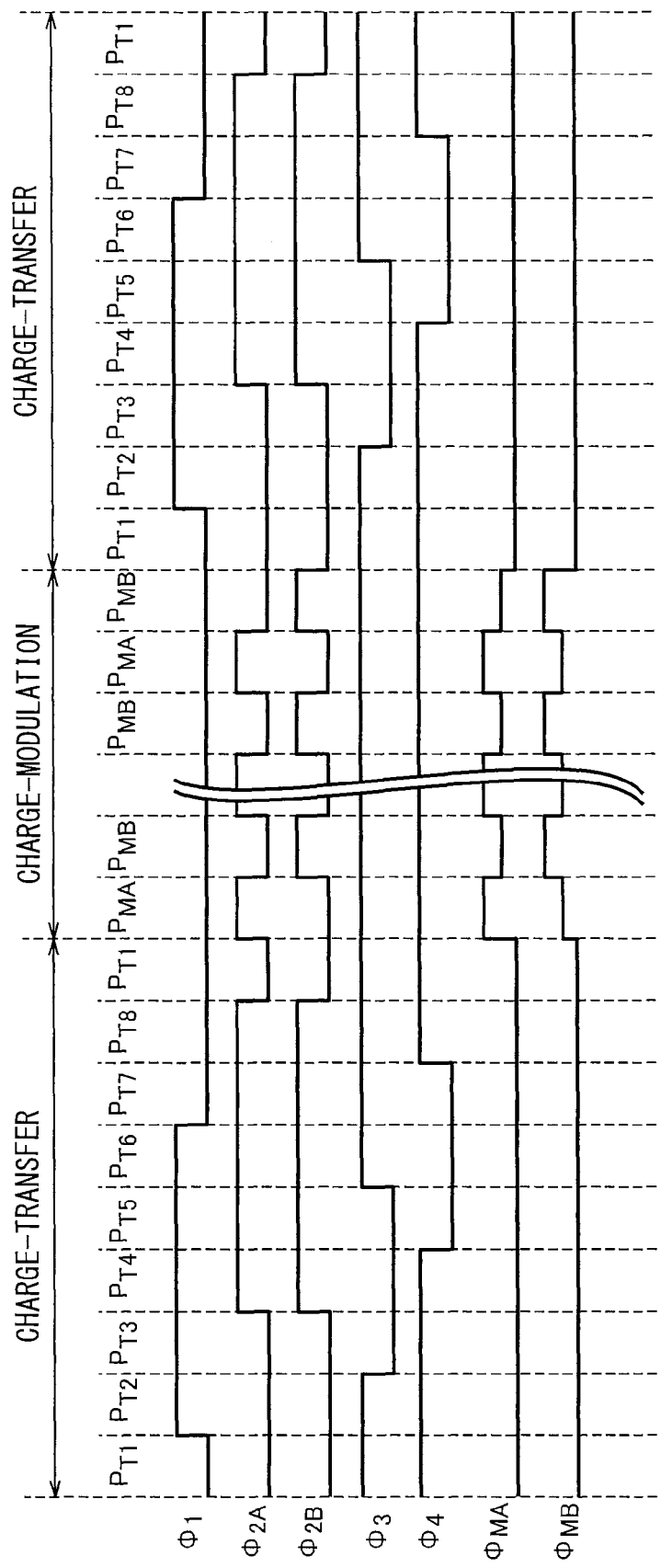
FIG. 25 is a timing chart that explains a clock pattern of each voltage pulse in a four-phase clock, which is necessary for an operation of the semiconductor element pertaining to the sixth embodiment.

In the semiconductor element pertaining to the sixth embodiment of the present invention, in addition to the four-phase clock implemented by the first voltage pulse $\Phi 1$, the second voltage pulse $\Phi 2$, the third voltage pulse $\Phi 3$ and the fourth voltage pulse $\Phi 4$ illustrated in FIG. 25, the first charge-modulation voltage pulse $\Phi_{MA}$ and the second charge-modulation voltage pulse $\Phi_{MB}$ are used for the charge modulation. Also, the second voltage pulse $\Phi 2$ is divided into the second voltage pulse $\Phi 2A$ for the upper lane and the second voltage pulse $\Phi 2B$ for the lower lane.

That is, the first voltage pulse $\Phi 1$ of a clock pattern illustrated in FIG. 25 is applied to the first field-control electrodes 513 and 563 in the (k+1)$^{th}$ stage and the first auxiliary electrodes 525 and 545 in the (k+1)$^{th}$ stage. Also, the first voltage pulse $\Phi 1$ of the clock pattern illustrated in FIG. 25 is applied to the first field-control electrodes 517 and 567 in the k$^{th}$ stage and the first auxiliary electrodes 531 and 551 in the k$^{th}$ stage. Then, the transfers of the signal charges in the main charge-transfer paths on the upper lane and on the lower lane are controlled in synchronization with each other.

The second voltage pulse $\Phi 2A$ for the upper lane of the clock pattern illustrated in FIG. 25 is applied to the second field-control electrode 512 in the (k+1)$^{th}$ stage and the second auxiliary electrode 522 in the (k+1)$^{th}$ stage. Also, the second voltage pulse $\Phi 2A$ for the upper lane of the clock pattern illustrated in FIG. 25 is applied to the second field-control electrode 516 in the k$^{th}$ stage and the second auxiliary electrode 528 in the k$^{th}$ stage. Then, the transfer of the signal charges in the main charge-transfer path on the upper lane is controlled.

On the other hand, the second voltage pulse Φ2B for the lower lane of the clock pattern illustrated in FIG. 25 is applied to the second auxiliary electrode 542 in the $(k+1)^{th}$ stage and the second field-control electrode 562 in the $(k+1)^{th}$ stage. Also, the second voltage pulse Φ2B for the lower lane of the clock pattern illustrated in FIG. 25 is applied to the second auxiliary electrode 447 in the $k^{th}$ stage and the second field-control electrode 565 in the $k^{th}$ stage. Then, the transfer of the signal charges in the main charge-transfer path on the lower lane is controlled.

Then, the third voltage pulse Φ3 of the clock pattern illustrated in FIG. 25 is applied to the third field-control electrodes 511 and 561 in the $(k+1)^{th}$ stage and the third auxiliary electrodes 521 and 541 in the $(k+1)^{th}$ stage. Also, the third voltage pulse Φ3 of the clock pattern illustrated in FIG. 25 is applied to the third field-control electrodes 515 and 565 in the $k^{th}$ stage and the third auxiliary electrodes 527 and 547 in the $k^{th}$ stage. Then, the transfers of the signal charges in the main charge-transfer path on the upper lane and the main charge-transfer path on the lower lane are controlled in synchronization with each other.

Moreover, a fourth voltage pulse Φ4 of the clock pattern illustrated in FIG. 25 is applied to the fourth field-control electrodes 514 and 564 in the $k^{th}$ stage and the fourth auxiliary electrodes 526 and 546 in the $k^{th}$ stage. Also, the fourth voltage pulse Φ4 of the clock pattern illustrated in FIG. 25 is applied to the fourth field-control electrodes 518 and 567 in the $(k-1)^{th}$ stage and the fourth auxiliary electrodes 532 and 552 in the $(k-1)^{th}$ stage. Then, the transfers of the signal charges in the main charge-transfer path on the upper lane and the main charge-transfer path on the lower lane are controlled in synchronization with each other.

Moreover, the first charge-modulation voltage pulse $Φ_{MA}$ of the clock pattern illustrated in FIG. 25 is applied to the first modulation electrode 523 in the $(k+1)^{th}$ stage and the second modulation electrode 524 in the $(k+1)^{th}$ stage and the first modulation electrode 529 in the $k^{th}$ stage and the second modulation electrode 530 in the $k^{th}$ stage. On the other hand, the second charge-modulation voltage pulse Φ ms of the clock pattern illustrated in FIG. 25 is applied to the first modulation electrode 543 in the $(k+1)^{th}$ stage and the second modulation electrode 544 in the $(k+1)^{th}$ stage and the first modulation electrode 549 in the $k^{th}$ stage and the second modulation electrode 550 in the $k^{th}$ stage.

That is, in a period of charge-modulation mode illustrated in FIG. 25, by assigning signals in the clock pattern illustrated in FIG. 25 to the first charge-modulation voltage pulse $Φ_{MA}$ and the second charge-modulation voltage pulse $Φ_{MB}$, as illustrated in FIG. 24, the charges generated by light irradiated through the apertures $APT_p$, $APT_{(p+1)}$, - - - are alternately transferred to each of potential wells in the main charge-transfer paths on the upper and lower lanes. The difference between two charge quantities, ascribable to the way of overlapping between the optical pulses and the clocks, is used to obtain the charge quantity, which depends on the light flight time, so that the range measurement can be carried out.

In this way, in the semiconductor element pertaining to the sixth embodiment, since the four-phase charge element is exemplified, in the transfer of the signal charges in the four-phase charge transfer element, eight fractional-parts of period from $P_{T1}$ to $P_{T8}$ illustrated in FIG. 25 are used as the phases of the clock. By the way, in FIG. 25, although the $P_{T1}$ is illustrated to appear at both of the first and final fractional-parts of the charge-transfer period, one of them can be omitted.

In the semiconductor element pertaining to the sixth embodiment of the present invention, by providing signals represented by the clock pattern illustrated in FIG. 25, the charge-modulation mode and the charge-transfer mode are controlled. In the period of the charge-modulation mode, as mentioned above, the first charge-modulation voltage pulse $Φ_{MA}$ and the second charge-modulation voltage pulse $Φ_{MB}$ are used, and the charges generated by light irradiated through the apertures $APT_k$, $APT_{(k+1)}$, - - - illustrated in FIG. 24 are alternately transferred to each of potential wells of the main charge-transfer paths on the upper and lower lanes. Thus, the difference between the two charge quantities, ascribable to the overlapping of the optical pulses and the clock pulses, is used to obtain the charge quantity, which depends on the light flight time, so that the range measurement can be carried out.

In the charge-modulation mode, as illustrated in FIG. 25, the first charge-modulation voltage pulse $Φ_{MA}$ and the second charge-modulation voltage pulse $Φ_{MB}$ are applied alternately and repeatedly. After operation of the charge-modulation mode is continued for a while to obtain and store two signal charges, similar to the TOF measurement method, the stored two signal charges are transferred to adjacent potential wells, through the main charge-transfer paths on the upper and lower lanes, by switching to the charge-transfer mode. In the case of the clock pattern illustrated in FIG. 25, the signal charges are transferred to the left direction, in the charge-transfer mode.

As mentioned above, according to the semiconductor element pertaining to the sixth embodiment, when the charge-modulation mode and the charge-transfer mode are continued at the clock pattern as illustrated in FIG. 25, for example in the charge-modulation mode, the signal charges, which are generated in the aperture $APT_k$ in the $k^{th}$ stage, are swung into the main charge-transfer paths on the upper and lower lanes in the $k^{th}$ stage and modulated, similarly to the TOF measurement method, and then stored in the potential wells of the main charge-transfer paths on the upper and lower lanes in the $k^{th}$ stage. In the charge-modulation mode, the signal charges, which are stored in the potential wells of the main charge-transfer paths on the upper and lower lanes in the $k^{th}$ stage, are sequentially transferred through the clock patterns of the six fractional-parts of $P_{T1}$ to $P_{T6}$ in FIG. 25 in the charge-transfer mode, arrive at the potential wells of the main charge-transfer paths on the upper and lower lanes in the $(k+1)^{th}$ stage. After the arrival at the potential wells of the main charge-transfer paths on the upper and lower lanes in the $(k+1)^{th}$ stage, the charge-transfer mode is switched to the charge-modulation mode. Then, when the operation of the charge-modulation mode is carried out, the modulation is performed on the optical charges generated in the $APT_{(k+1)}$ in the $(k+1)^{th}$ stage, by changing direction to the main charge-transfer paths on the upper and lower lanes in the $(k+1)^{th}$ stage, similarly to the TOF measurement method. Thus, the optical charges generated in the $APT_{(k+1)}$ in the $(k+1)^{th}$ stage are stored in the potential wells on the upper and lower lanes in the $(k+1)^{th}$ stage. Moreover, at the $(k+1)^{th}$ stage, the optical charges, which are generated and modulated in the aperture $APT_k$ in the $k^{th}$ stage on the right and transferred to the left direction from the $k^{th}$ stage, are added in the charge-modulation mode.

In this way, according to the semiconductor element pertaining to the sixth embodiment, similarly to the semiconductor element pertaining to the fifth embodiment, with m times of repetitions of the operation of the charge-modulation mode and the operation of the charge-transfer mode in the main charge-transfer paths on the upper and lower lanes, the signal charges, which are generated and modulated in an aperture at a certain position, are added by signal charges generated and modulated in apertures up to final stage ($m^{th}$ stage) in the potential wells of the main charge-transfer paths on the upper and lower lanes.

According to the semiconductor element pertaining to the sixth embodiment, when the transfer speed in the charge-transfer mode is made coincident with the movement speed of a physical body, a moving target can be imaged at high speed without any image blurring. Also, by calculating a distance ascribable to a light flight time from two modulated charges, it is possible to measure a three-dimensional shape of the physical body that is moving at high speed.

Other Embodiments

As mentioned above, the present invention has been described in accordance with the first to sixth embodiments of the present invention. However, the discussions and drawings that implement a part of this disclosure should not be understood to limit the scope of the present invention. From this disclosure, various variations, examples and operational techniques would be evident for one skilled in the art.

In the above explanation of the first to sixth embodiments of the present invention, although first conductivity type (p-type) is explained as p-type, and second conductivity type (n-type) is explained as n-type, if the first conductivity type (p-type) is assigned as n-type and the second conductivity type (n-type) is assigned as p-type, the explanation that the similar effectiveness may be obtained, when the electrical polarity is set opposite to each other, will easily be understood.

In the explanation of the first to sixth embodiments, signal charges on which the processes such as transfer, storage and the like are performed are assumed to be electrons, and, in the potential profile, the downward direction (depth direction) on the drawing is assumed to be the positive direction of the potential. However, in a case that the electrical polarity is set opposite to each other, because electrons to be processed becomes holes, the potential profile, which indicates potential barriers, potential valleys, potential wells and the like within the semiconductor element, shall be represented such that the downward direction (depth direction) on the drawing is the negative direction of the potential.

Also, the semiconductor materials that implement the semiconductor regions in which the charge-transfer paths in the present invention are defined should not be limited to silicon (Si). In particular, in a case of compound semiconductors, because interface defects and interface states at interface between the surface of the compound semiconductor and the insulating film is problematic, the scheme of the present invention, which uses the static induction effect in the transverse direction and controls potentials in the semiconductors, can avoid the influences ascribable to interface defects and interface states. Thus, even in the semiconductor elements and solid-state imaging devices that use the various compound semiconductors such as III-V compound semiconductor, II-VI compound semiconductor and the like, the structures and technical ideas of the semiconductor elements and the solid-state imaging devices that are explained as examples in the first to sixth embodiments will serve as important technologies.

In this way, naturally, the present invention includes various embodiments and the like that are not described here. Thus, the technical scope of the present invention is determined only by "the matters specifying the invention" prescribed by reasonable claims, the contents of which are supported by above-mentioned description.

INDUSTRIAL APPLICABILITY

The present invention can be used in technical fields of semiconductor industries, such as producing of semiconductor elements, which operate at high speed, avoiding the problem of generations of noises and dark currents and the problem of slowing down of transfer speed, and fabrication of solid-state imaging devices, which have low noise, high resolution and fast response speed, in which a plurality of semiconductor elements are arrayed. And, the present invention can be used in the industrial fields of optical apparatuses and precise machines, such as cameras and the like, in which the solid-state imaging devices are used, and further, the technical fields of producing various systems and the like, in which the optical apparatuses are used.

REFERENCE SIGNS LIST

11, 21 . . . horizontal shift register
12, 22 . . . timing generator
13 . . . vertical shift register
31 . . . semiconductor substrate
32 . . . active-area formation layer
33 . . . surface buried region
34 . . . surface buried region
36, 36a, 3b . . . charge-storage region
37 . . . charge-extraction region
37a . . . first charge-extraction region
37c . . . second charge-extraction region
38 . . . charge-storage region
38a . . . first charge-storage region
38b . . . second charge-storage region
41 . . . insulating film
42a, 73a, 413, 416, 463, 466, 513, 515, 517 . . . first field-control electrode
43a, 71a, 74a, 412, 415, 462, 465, 512, 516, 562, 565 . . . second field-control electrode
44a, 72a, 75a, 411, 414, 417, 461, 464, 467, 511 . . . third field-control electrode
48a . . . first transfer electrode
48b . . . second transfer electrode
49 . . . field-control electrode
51 . . . shield plate
68 . . . transfer electrode (barrier gate electrode)
421, 426, 431, 441, 446, 451, 521, 527 . . . third auxiliary electrode
422, 427, 442, 447, 522, 528, 542 . . . second auxiliary electrode
423, 428, 443, 448, 523, 529, 543, 549 . . . first modulation electrode
424, 429, 444, 449, 524, 530, 544, 550 . . . second modulation electrode
425, 430, 445, 450, 525, 531 . . . first auxiliary electrode
514, 518 . . . fourth field-control electrode
526, 532 . . . fourth auxiliary electrode

What is claimed is:
1. A semiconductor element, comprising:
a charge-transfer path defined in a semiconductor region, configured to transfer signal charges;

a pair of first field-control electrodes laminated via an insulating film on the semiconductor region so as to sandwich the charge-transfer path in between, in a planar pattern, along a direction orthogonal to a transfer direction of the signal charges, and a pair of second field-control electrodes arranged separately from and adjacently to the first field-control electrodes, respectively, along the transfer direction, and laminated via the insulating film on the semiconductor region, so as to sandwich the charge-transfer path in between, in the planar pattern, along the direction orthogonal to the transfer direction, wherein field-control voltages, which differ from each other, are applied to the first and second field-control electrodes, and a depleted potential in the charge-transfer path is changed, thereby controlling a movement of the signal charges transferring in the semiconductor region.

2. The semiconductor element of claim 1, wherein the semiconductor region comprises:

an active-area formation layer implemented by semiconductor of a first conductivity type;

a surface buried region of a second conductivity type formed on a part of an upper portion of the active-area formation layer; and a pinning layer of the first conductivity type formed in contact with a surface of the surface buried region, and wherein majority carriers in the surface buried region are transferred as the signal charges through the surface buried region.

3. The semiconductor element of claim 2, wherein the active-area formation layer is formed on a semiconductor substrate of the first or the second conductivity type.

4. The semiconductor element of claim 2, wherein in the pinning layer, a density of opposite-conductivity type carriers to the signal charges is changed by voltages applied to the first and second field-control electrodes, together with a change in the depleted potential in the charge-transfer path.

5. The semiconductor element of claim 1, further comprising:

a pair of first charge-extraction regions formed partially on the semiconductor region, sandwiching the charge-transfer path in between, at positions outside the pair of first field-control electrodes, along the direction orthogonal to the transfer direction of the signal charges, and a pair of second charge-extraction regions formed partially on the semiconductor region, sandwiching the charge-transfer path in between, at positions outside the pair of second field-control electrodes, along the direction orthogonal to the transfer direction of the signal charges, wherein, by applying a voltage higher than a value for controlling the movement of the signal charges to the first and second field-control electrodes, the signal charges are extracted to the first and second charge-extraction regions.

6. The semiconductor element of claim 1, further comprising a shield plate having an aperture through which light is selectively irradiated to a part of the charge-transfer path.

7. The semiconductor element of claim 1, further comprising a pair of third field-control electrodes separated from the second field-control electrodes, respectively, along the transfer direction, arranged adjacently to edge sides of the second field-control electrodes on the sides opposite to the first field-control electrodes, respectively, and laminated via the insulating film on the semiconductor region, so as to sandwich the charge-transfer path in between, in the planar pattern, along the direction orthogonal to the transfer direction, wherein the field-control voltages, which differ from each other, are applied to the second and third field-control electrodes, and the movement of the signal charges transferring in the semiconductor region is consequently controlled.

8. The semiconductor element of claim 7, further comprising a pair of fourth field-control electrodes separated from the third field-control electrodes, respectively, along the transfer direction, and arranged adjacently to edge sides of the third field-control electrodes on the sides opposite to the second field-control electrodes, respectively, and laminated via the insulating film on the semiconductor region, so as to sandwich the charge-transfer path in between, in the planar pattern, along the direction orthogonal to the transfer direction, wherein the field-control voltages, which differ from each other, are applied to the third and fourth field-control electrodes, and the movement of the signal charges transferring in the semiconductor region is consequently controlled.

9. A solid-state imaging device in which a plurality of unit elements are deployed, the unit element comprising:

a charge-transfer path defined in a semiconductor region, configured to transfer signal charges;

a pair of first field-control electrodes laminated via an insulating film on the semiconductor region so as to sandwich the charge-transfer path in between, in a planar pattern, along a direction orthogonal to a transfer direction of the signal charges, and a pair of second field-control electrodes arranged separately from and adjacently to the first field-control electrodes, respectively, along the transfer direction, and laminated via the insulating film on the semiconductor region, so as to sandwich the charge-transfer path in between, in the planar pattern, along the direction orthogonal to the transfer direction, wherein in each of the unit elements, field-control voltages, which differ from each other, are applied to the first and second field-control electrodes, and a depleted potential in the charge-transfer path is changed, thereby controlling a movement of the signal charges transferring in the semiconductor region.

10. A solid-state imaging device including a plurality of unit columns being deployed, each of the unit columns comprising a plurality of unit structures periodically arrayed along a charge-transfer path, the unit structure comprising:

the charge-transfer path defined in a semiconductor region, configured to transfer signal charges;

a pair of first field-control electrodes laminated via an insulating film on the semiconductor region so as to sandwich the charge-transfer path in between, in a planar pattern, along a direction orthogonal to a transfer direction of the signal charges, and a pair of second field-control electrodes arranged separately from and adjacently to the first field-control electrodes, respectively, along the transfer direction, and laminated via the insulating film on the semiconductor region, so as to sandwich the charge-transfer path in between, in the planar pattern, along the direction orthogonal to the transfer direction, and wherein in each of the unit columns and in a periodical arrangement of the field-control electrodes, including the first and second field-control electrodes, field-control voltages differing from each other are applied to the field-control electrodes, respectively, and a depleted potential in the charge-transfer path is changed, thereby controlling a movement of the signal charges transferring in the semiconductor region.

11. A solid-state imaging device including a plurality of the unit columns being deployed, each of the unit columns comprising a plurality of unit structures periodically arrayed along a main charge-transfer path, the unit structure comprising:

the main charge-transfer path defined in a semiconductor region, configured to transfer signal charges;

a pair of first field-control electrodes laminated via an insulating film on the semiconductor region so as to sandwich the charge-transfer path in between, in a planar pattern, along a direction orthogonal to a main transfer direction of the signal charges along the main charge-transfer path;

a pair of second field-control electrodes arranged separately from and adjacently to the first field-control electrodes, respectively, along the main transfer direction, and laminated via the insulating film on the semiconductor region, so as to sandwich the main charge-transfer path in between, in the planar pattern, along the direction orthogonal to the main transfer direction;

a transfer path for charge modulation through which the signal charges are transferred alternately, defined along the direction orthogonal to the main transfer direction, across the main charge-transfer path, in order to carry out a time of flight range measurement;

a pair of first modulation electrodes laminated via the insulating film on the semiconductor region so as to sandwich the transfer path for charge modulation in between, in the planar pattern, along the main transfer direction; and a pair of second modulation electrodes arranged separately from the first modulation electrodes, respectively, and laminated via the insulating film on the semiconductor region, so as to sandwich the transfer path for charge modulation, in the planar pattern, along the main transfer direction, wherein, in each of the unit columns, and in a periodical arrangement of the field-control electrodes including the first and second field-control electrodes, field-control voltages differing from each other are applied to the field-control electrodes, respectively, and a depleted potential of the main charge-transfer path is changed, thereby controlling movement of the signal charges transferred through the main charge-transfer path of each of the unit columns, in a course of the movement of the signal charges, charge-modulation voltages differing from each other are applied to the first and second modulation electrodes, and a depleted potential of the transfer path for charge modulation is changed, thereby controlling movement of the signal charges so that the signal charges are alternately transferred through the transfer path for charge modulation, and after completion of the alternate transfers through the transfer path for charge modulation, the signal charges are again transferred through the main charge-transfer path of each of the unit columns.

* * * * *